United States Patent [19]

Larkins

[11] Patent Number: 5,204,871
[45] Date of Patent: Apr. 20, 1993

[54] BISTABLE OPTICAL LASER BASED ON A HETEROSTRUCTURE PNPN THYRISTOR

[76] Inventor: Eric C. Larkins, 5101 SW. 77 St., Miami, Fla. 33141

[21] Appl. No.: 501,253

[22] Filed: Mar. 29, 1990

[51] Int. Cl.$^5$ ............... H01L 29/161; H01L 33/00; H01L 27/14

[52] U.S. Cl. ............... 372/45.1; 372/46; 372/48; 257/12; 257/13; 257/431

[58] Field of Search ............... 357/30 B, 30 E, 300, 357/30 R, 16, 39, 17; 372/44, 45, 46, 48

[56] References Cited

U.S. PATENT DOCUMENTS

| | | | |
|---|---|---|---|
| 4,829,357 | 5/1989 | Kasahara | 357/16 |
| 4,855,250 | 8/1989 | Yamamoto et al. | 372/46 |
| 4,862,238 | 8/1989 | Shannon | 357/16 |
| 4,864,168 | 9/1989 | Kasahara et al. | 357/300 |
| 4,910,571 | 3/1990 | Kasahara et al. | 357/16 |
| 4,994,882 | 2/1991 | Hess et al. | 357/38 |

OTHER PUBLICATIONS

Zh. I. Alferov, V. M. Andreev, V. I. Korol'kov, V. G. Nikitin and A. A. Yakovenko, "p-n-p-n Structures Based on GaAs and $Al_xGa_{1-x}As$ Solid Solutions," Soviet Physics-Semiconductors, vol. 4, No. 3, Sep. 1970, pp. 481–483.

Zh. I. Alferov, V. M. Andreev, V. I. Korol'kov, V. G. Nikitin, E. L. Portnoi, and A. A. Yakovenko, "Recombination Radiation Emitted by Four-Layer Structures Based on GaAs-AlAs Heterojunctions," Soviet Physics-Semiconductors, vol. 6, No. 4, Oct. 1972, pp. 637–638.

Zh. I. Alferov, V. I. Korol'kov, V. G. Nikitin and A. A. Yakovenko, "Investigation of Electroluninescent p-n--p-n Structures Based on GaAs-$Al_xGa_{1-x}As$ Heterojunctions," Soviet Physics-Semiconductors, vol. 6, No. 7, Jan. 1973, pp. 1138-1142.

Zh. I. Alferov, V. M. Andreev, V. I. Korol'kov, V. G. Nikitin, V. B. Smirnov and A. A. Yakovenko, "Investigation of Transient Processes in Electroluminescent p-n-p-n Structures, " Soviet Physics-Semiconductors, vol. 7, No. 5, Nov. 1973, pp. 621-623.

H. F. Lockwood, K. F. Etzold, T. E. Stockton and D. P. Marinelli, "The GaAs P-N-P-N Laser Diode," IEEE Journal of Quantum Electronics, vol. QE-10, No. 7, Jul. 1974, pp. 567-569.

Zh. I. Alferov, F. A. Akhmedov, V. I. Korol'kov, V. G. Nikitin and A. A. Yakovendo, "Electroluminescent Photothyristors Based on GaAs and $Al_xGa_{1-x}As$ Heterojunctions," Soviet Physics-Semiconductors, vol. 8, No. 9, Mar. 1975, pp. 1127-1130.

J. A. Copeland, A. G. Dentai and T. P. Lee, "p-n-p-n Optical Detectors and Light-Emitting Diodes," IEEE Journal of Quantum Electronics, vol. QE-14, No. 11, Nov. 1978, pp. 810-813.

C. P. Lee, A. Gover, S. Margalit, I. Samid and A. Yariv, "Barrier-Controlled Low-Threshold pnpn GaAs Heterostructure Laser," Applied Physics Letters, vol. 30, No. 10, May 15, 1977, pp. 535-538.

Zh. I. Alferov, V. I. Korol'kov, N. Rakhimov and M. N. Stepanova, "Investigation of GaAs-$Al_xGa_{1-x}As$ Heterostructure Thyristors," Soviet Physics-Semiconductors, vol. 12, No. 1, Jan. 1978, pp. 42-46.

(List continued on next page.)

Primary Examiner—Andrew J. James
Assistant Examiner—Ngan Van Ngo
Attorney, Agent, or Firm—Philip M. Shaw, Jr.

[57] ABSTRACT

A semiconductor apparatus for propagating light in a preferred direction which comprises, in succession, a substrate, a first emitter region, a first carrier confinement region, a first internal heterojunction barrier, a first base region, a second base region, a second internal heterojunction barrier, a second carrier confinement region, and a second emitter region, wherein portions of the first emitter region and the second base region are of one conductivity type and portions of the second emitter region and the first base region are of the opposite conductivity type, wherein the first and second emitter regions, the first and second internal heterojunction barriers and the first and second base regions together define a single optical cavity in the directions perpendicular to the preferred direction of light propagation, and electrodes are provided for applying an electrical current which flows through the semiconductor apparatus.

52 Claims, 31 Drawing Sheets

OTHER PUBLICATIONS

M. C. Hanna, A. Majerfeld, E. G. Oh, J. I. Pankove and D. M. Szmyd, "Optical Switch with Optical and Electronic Bistability," Institute of Physics Conference Series No. 96: Chapter 8, pp. 543-546 (IOP Publishing Ltd., 1989).

M. Ogura, W. Hsin, M-C. Wu, S. Wang, J. R. Whinnery, S. C. Wang and J. J. Yang, "Surface-Emitting Laser Diode with Vertical GaAs-GaAlAs Quarter-Wavelength Multilayers and Lateral Buried Heterostructure," Applied Physics Letters, vol. 51, No. 21, Nov. 1987, pp. 1655-1657.

P. D. Ankrum, *Semiconductor Electronics*, (Prentice-Hall, Inc.: Englewood Cliffs, NJ., 1971), pp. 502-514.

D. L. Keune, M. G. Craford, A. H. Herzog and B. J. Fitzpatrick, "Gallium Phosphide High-Temperature Electroluminescent p-n-p-n Switches and Controlled Rectifiers," Journal of Applied Physics, vol. 43, No. 8, Aug. 1972, pp. 3417-3421.

D. Meyerhofer, A. S. Keizer and H. Nelson, "A Light-Activated Semiconductor Switch," Journal of Applied Physics, vol. 38, No. 1, Jan. 1967, pp. 111-123.

W. F. Kosonocky, R. H. Cornely and I. J. Hegyi, "Multilayer GaAs Injection laser," IEEE Journal of Quantum Electronics, vol. QE-4, No. 4, Apr. 1968, pp. 176-179.

"Odd Batch of Light-Emitting Diodes Yields a Bonus: Negative Resistance," Electronics, Aug. 4, 1969, pp. 229-230.

"Red-Light Diode from Japan Shows negative Resistance," Electronics, Mar. 16, 1970, p. 62.

Y. Arai, M. Sakuta, K. Sakai and T. Ishida, "Sn-Te Compensated (Ga,Al)As Diodes with Negative Resistance, " Japanese Journal of Applied Physics, vol. 9, 1970, pp. 1015-1016.

R. S. Ignatkina, N. E. Kurgaeva, B. A. Krasyuk, S. S. Meskin, N. F. Nedel'skii, V. N. Ravich, and B. V. Tsarenkov, "GaP Electroluminescent Dynistor," Soviet Physics Semiconductors, vol. 5, No. 9, Mar. 1972, pp. 1483-1486.

C. J. Nuese, J. J. Gannon, H. F. Gossenberger and C. R. Wronski, "Electroluminescent Schockley Diodes of GaAs and Ga $As_{1-x}P_x$," Journal of Electronic Materials, vol. 2, No. 4, Jun. 1973, pp. 572-599.

H. C. Casey, Jr. and M. G. Panish, *Heterostructure Lasers: Part A*, (Academic Press: New York, 1978).

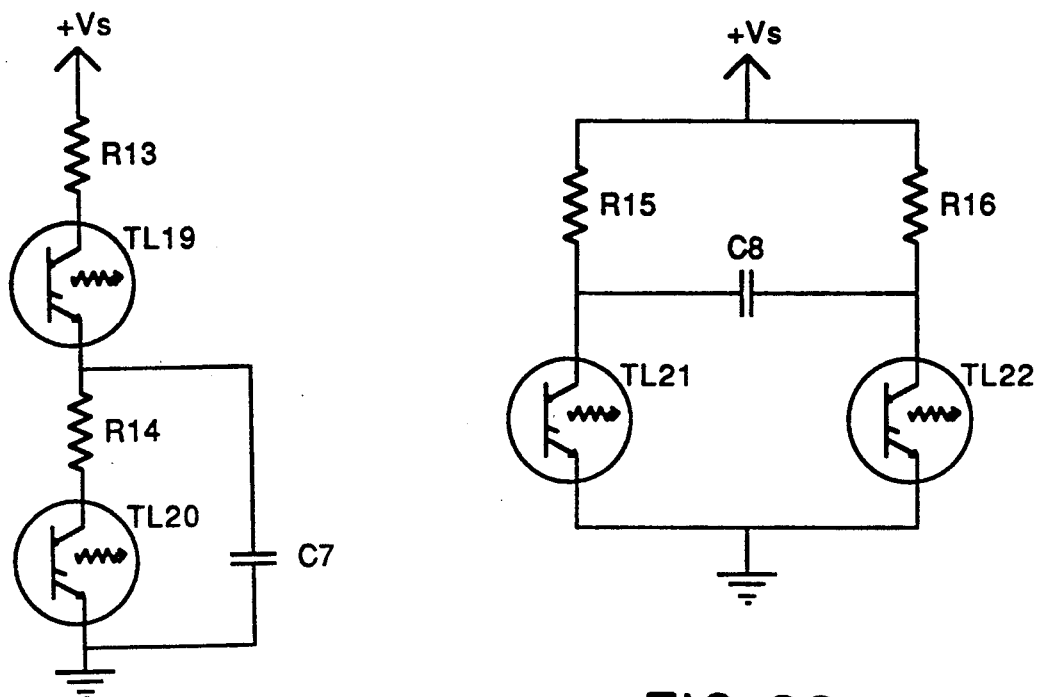
FIG. 20
FIG. 22
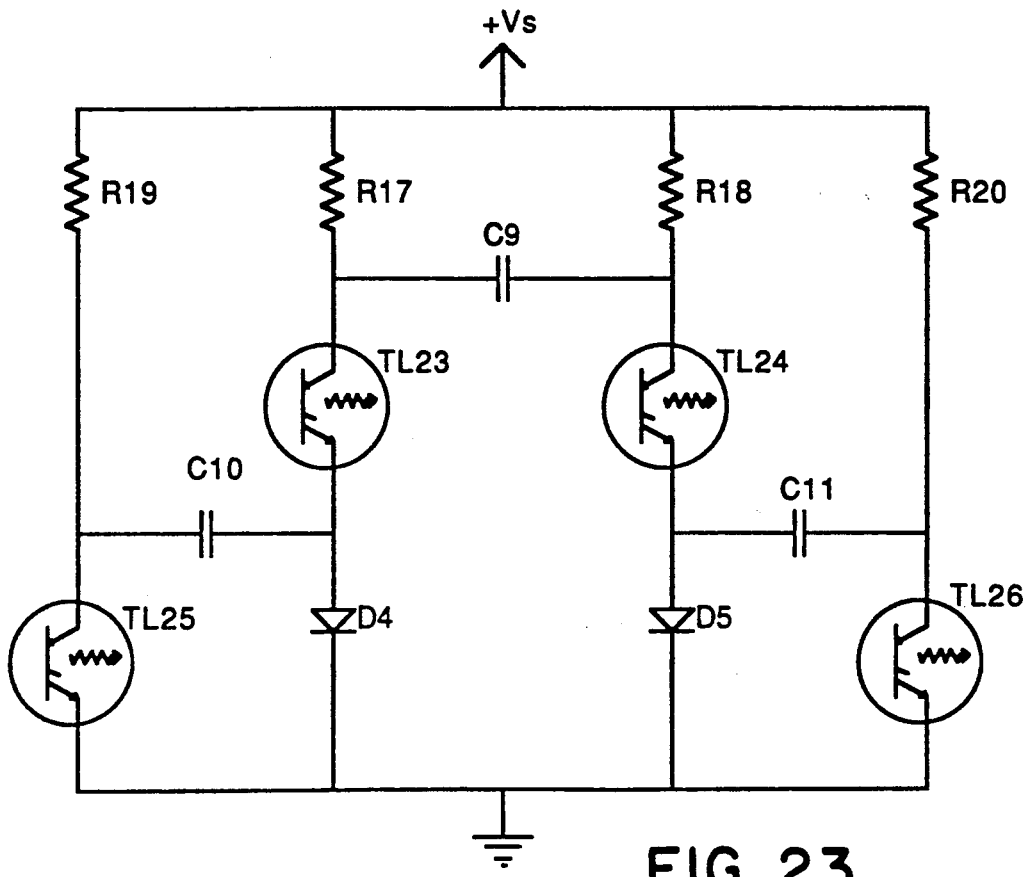
FIG. 23

BISTABLE OPTICAL LASER BASED ON A HETEROSTRUCTURE PNPN THYRISTOR

TECHNICAL FIELD

This invention relates to semiconductor light emitting devices and more particularly to light emitting diodes.

BACKGROUND ART

It has long been a goal of device physicists to create an optical computing and switching technology to overcome the limitations of conventional electronic circuits such as capacitive charging, electrical cross-talk, lossy transmission lines, and dispersion. The low cross-talk, large signal propagation velocity and the wide tolerances of optical drivers make an optical switching technology particularly attractive for communication over distances larger than $\approx 0.5$ cm. Thus, high speed optical switches are proving ever more important for technologies dominated by electronics.

The requirements which must be fulfilled by an optical or optoelectronic switching technology include: it must be capable of planar integration; ii) it must operate at $\geq 0.5$ Ghz; iii) the device sizes must be relatively small ($<20$ $\mu m \times 100$ $\mu m$); iv) fabrication should be simple, avoiding sophisticated hybridization of optics and microelectronics; v) isolation of signal sources from the outputs signals of their loads; vi) devices must amplify the signal; vii) signal fan out must be greater than unity; viii) the technology must include the capability of latching and/or delaying signals. Features which are very advantageous in an optical, or optoelectronic switching technology include: simple signal interfacing with conventional microelectronic circuits; ii) the flexibility of being able to generate and detect multiple wavelengths of light; iii) the flexibility of being able to detect light at one wavelength and produce one or two separate and independent output wavelengths.

One approach to an optoelectronic switching technology lies in light-emitting diodes with multiple pn junctions. A variety of bistable pnpn light-emitting diode structures have been reported in the literature. These structures include homojunction thyristors constructed from GaAs, AlGaAs, GaP, AlGaAs and GaAs$_{1-x}$P$_x$, as well as heterojunction thyristors constructed from GaAs/AlGaAs and InGaAsP/InP. In addition to pnpn thyristors, bistable light-emitting pnin, pnpnp and pnpnpn diodes have been demonstrated.

Light-emitting pnpn diodes have been fabricated which produce light primarily at the center pn junction or at only one of the two outer pn junctions. In an article by C. P. Lee, A. Gover, S. Margalit, I. Samid and A. Yariv, entitled "Barrier-Controlled Low-threshold PNPN GaAs Heterostructure Laser," *Appl. Phys. Lett.*, vol. 30 (1977), p. 535, there is disclosed a structure which is similar to the present structure. It is a heterostructure laser with two active regions at the outer pn junctions. However, the structure separates the two outer pn junctions with thick ($\geq 2.1$ $\mu m$) AlGaAs layers with uniform composition such that the base widths are large relative to the diffusion length. This results in relatively weak coupling between the light producing outer pn junctions. Also, the structure does not use a single optical cavity/waveguide for both light producing junctions, but rather uses two relatively weakly coupled waveguides. If the two laser regions do not share a single optical cavity, it becomes much more difficult to interface and mode match the cavity with optical waveguides or fibers.

Optical signals can be guided in a dielectric waveguide in which one or more planar dielectric layers, with refractive indices given by $n_2, \ldots n_{L-1}$, is sandwiched between two outer dielectric layers with refractive indices given by $n_1$ and $n_L$. In order for a guided optical mode to exist, the refractive indices ($n_1$, $n_L$) of the two outer layers must be smaller than the refractive index ($n_2 - n_{L-1}$) of at least one of the sandwiched layers.

A heterostructure thyrister which employs a single optical cavity in the directions perpendicular to the direction of the propagation of stimulated emission is desirable in order to allow simple optical coupling with external optics (including lenses, optical fibers and integrated waveguides). When light travels along two parallel waveguides, it becomes difficult to match the optical modes at the ends of the coupled waveguides with simple optics or a single external waveguide. However, when different dielectric cavities are oriented along the direction of propagation of the optical mode, efficient coupling of external optics to and from the dielectric cavities is relatively simple.

This, it is necessary to distinguish between a single dielectric waveguide and coupled dielectric waveguides, when the desired optical modes propagate parallel to the planes which couple different dielectric layers. Since the mirror losses of semiconductor lasers generally favor transverse electric optical modes over transverse magnetic optical modes, this distinction can be made in terms of the lowest order transverse electric mode, which will be referred to as the fundamental mode.

Each guided transverse electric mode is characterized by a specific propagation constant B, whose value satisfies the condition:

$$MAX\{n_1^2, n_L^2\}k_o^2 < B^2 < MAX\{N_2^2, \ldots n_{L-1}^2\}k_o^2, \quad (1)$$

ps where MAX$\{n_1^2, n_L^2\}$ denotes the square of the refractive index of the outer dielectric layer with the larger refractive index. Similarly, MAX$\{N_2^2, \ldots n_{L-1}^2\}$ denotes the square of the refractive index of the inner, sandwiched dielectric layer with the largest refractive index. B is the propagation constant of the mode and $k_o$ is the free-space propagation constant of light with the desired energy. The lowest order transverse electric mode has the largest propagation constant and propagation velocity. This lowest order transverse electric mode always exists for a planar dielectric waveguide capable of guiding an optical mode.

The calculations to distinguish between a single dielectric waveguide and multiple coupled dielectric waveguides are made in terms of a stack of dielectric layers oriented parallel to the y-z plane (using Cartesian coordinates) and optical modes propagating in the positive z direction. The dielectric layers are considered homogeneous and infinite in extent along the positive and negative y directions. The upper and lower of the two outer dielectric layers are considered infinite in extent along the positive and negative x directions, respectively (perpendicular to the plane of the dielectric layers).

Following the method presented in a standard text [H. C. Casey, Jr. and M. B. Panish, *Heterostructure Lasers: Part A*, (Academic Press: New York, 1978)], the optical electric field of a transverse electric mode has the form:

$$E(x,z,t) = E_y(x,z,t) = E_y(x) Re\{\exp[j(2\pi ft - Bz)]\}, \quad (2)$$

where B is the propagation constant of the transverse electric mode, f is the frequency of the light, t is time and j is the square root of negative one. The expression $Re\{\ldots\}$ indicates that the real part of the enclosed expression is to be used. Similarly, the component of the magnetic field along the direction of propagation of the mode (+z direction) has the form:

$$Hz(x,z,t) = Re\{(j/2\pi f\mu)\delta E_y(x,z,t)/\delta x\}, \quad (3)$$

where $\delta E_y(x,z,t)/\delta x$ is the partial derivative of the component of the electric field in the y direction with respect to position along the x direction.

Precise values for the transverse electric modes are obtained by requiring the magnitude of the optical electric field $E(x,z,t)$ to approach zero as the position in the positive and negative x directions becomes infinitely large, and by also requiring $E_y(x,z,t)$ and $Hz(x,z,t)$ to be continuous in the x direction.

If the square of the propagation constant B is smaller than the product of the square of the free-space propagation constant $k_o$ and the square of the refractive index $n(x)$ (in other words, if $0 < n(x)^2 k_o^2 - B^2 = K_p(x)^2$), solutions for $E_y(x)$ have the form:

$$E_y(x) = F \sin[K_p x] + G \cos[K_p(x)x], \quad (4)$$

where $K_p(x)$ is a positive real constant which will be referred to as the lateral mode constant. F and G are real constants. Regions in which $E_y(x)$ has the form given by equation (4) will be referred to as non-evanescent regions of the dielectric waveguide.

If the square of the propagation constant B is larger than the product of the square of the free-space propagation constant $k_o$ and the square of the refractive index $n(x)$ (in other words, if $0 < B^2 - n(x)^2 k_o^2 = K_d(x)^2$), solutions for $E_y(x)$ have the form:

$$E_y(x) = C \exp[K_d x] + D \exp[-K_d(x)x], \quad (5)$$

where $K_d(x)$ is a positive real constant which will be referred to as the mode lateral decay constant. C and D are real constants. Regions in which $E_y(x)$ has the form given by equation (5) will be referred to as evanescent regions of the dielectric waveguide. $K_{do}(x)$ is the positive square root of the difference between the square of the propagation constant of the lowest order transverse electric mode $B_o$ and the product of the square of the refractive index of a dielectric layer and the square of the free-space dielectric constant. $K_{do}(x)$ will be referred to as the fundamental mode lateral decay constant.

The transition point between a single dielectric waveguide and coupled dielectric waveguides can be defined in terms of the absolute value of the integral of the fundamental mode lateral decay constant in the direction perpendicular to the plane of the dielectric layers (x direction) across an evanescent region sandwiched between two non-evanescent regions. Thus, if the absolute value of the integral of the fundamental mode lateral decay constant in the direction perpendicular to the plane of the dielectric layers is larger than $2[\ln(200)]$ across any evanescent region which is sandwiched between two non-evanescent regions, the dielectric structure constitutes two or more coupled dielectric waveguides. ($2"[\ln 200]"$ is two times the natural logarithm of two hundred.) If the absolute value of the integral of the fundamental mode lateral decay constant in the direction perpendicular to the plane of the dielectric layers is smaller than $2[\ln(200)]$ across all evanescent regions which are sandwiched between two non-evanescent regions, the dielectric structure constitutes a single dielectric waveguide. This condition can be expressed as the following equation:

$$|\int K_{do}(x)dx| = 2[\ln(200)] \sim 10.5966, \quad (6)$$

where the path of the integral is perpendicular to the propagation direction of the desired optical modes and is the shortest path joining the two abutting non-evanescent regions.

This value is chosen so that $\{\exp[-(|\int K_{do}(x)dx|)/2]\}/2 = 0.01$, corresponding to a factor of 100 attenuation of the optical electric fields in the evanescent region. This degree of attenuation permits the two abutting non-evanescent regions to form distinct optical waveguides, which are coupled by the evanescent optical electric fields in the evanescent region.

Circuits which have been discussed or proposed in the literature which employ light emitting pnpn diodes include simple capacitive relaxation oscillators, a simple trigger flip-flop, optical memories, optical write - electrical read memories, light emitting displays, devices for transforming a spontaneous optical emission into a coherent light pulse, converters for converting dc current into high frequency optical light pulses, repeaters and amplifiers in digital or pulse coded optical communications, high-efficiency, fast-response photodetectors with a controlled spectral sensitivity range, interfaces between optical fibers and digital logic circuits, and for fabricating simple logical AND and OR gates by carefully matching the inputs and the optical switching threshold.

DISCLOSURE OF THE INVENTION

The main purpose of this invention is to make a high speed, optically triggered switch with electrical and surface or end emitting optical output signals.

An equally important purpose of this invention is to make a high speed pnpn optical and electronic switch with a large displacement current switching threshold, while maintaining a high optical output efficiency and providing for simple optical coupling of this switch with optical fibers and waveguides.

Another purpose of this invention is to reduce the reverse recovery time of bistable, multiple pn junction, light emitting diodes.

Another purpose is to make a light emitting pnpn diode which separates the light producing, carrier confinement regions of the structure from the center pn junction, providing a means of making the wavelength of the input light signal independent of the wavelengths of the optical outputs.

Another purpose of this invention is to provide a means of reducing the reverse recovery time of pnpn diodes by introducing efficient recombination centers in the center pn junction, without significantly reducing the optical output efficiency in the high conductivity state or strongly increasing the conductance in the low conductivity state.

Another purpose of this invention is to reduce the sensitivity of bistable, multiple pn junction devices to displacement current switching, by capacitively coupling the displacement currents through one or more capacitors connected in parallel with a forward biased pn junction.

Another purpose of this invention is to provide a means of producing two different wavelengths of stimulated emission from the same pnpn diode structure.

Another purpose of this invention is to provide simple and efficient coupling between multiple pn junction, light emitting diode structures and waveguides, by using a single optical waveguide cavity to contain the light producing junctions of the diode structure.

Another purpose of this invention is to provide optoelectronic circuits which function as digital optical flip flops.

Another purpose of this invention is to decrease the switching times of pnpn diodes.

The foregoing objectives are achieved by the present invention of a semiconductor apparatus for propagating light in a preferred direction, the apparatus comprising, in succession, a substrate, a first emitter region, a first carrier confinement region, a first internal heterojunction barrier, a first base region, a second base region, a second internal heterojunction barrier, a second carrier confinement region, and a second emitter region, wherein portions of the first emitter region and the second base region are of one conductivity type and portions of the second emitter region and the first base region are of the opposite conductivity type, wherein the first and second emitter regions, the first and second internal heterojunction barriers and the first and second base regions together define a single optical cavity in the directions perpendicular to the preferred direction of light propagation, and means for causing electrical current to flow through the semiconductor apparatus.

In the preferred embodiments of the invention the semiconducting substrate, the first and second carrier confinement layers, and the cap layer are made of GaAs or InGaAs. The remaining layers are made of AlGaAs.

The foregoing and other objectives, features and advantages of the invention will be more readily understood upon consideration of the following detailed description of certain preferred embodiments of the invention, taken in conjunction with the accompanying drawings.

BRIEF DESCRIPTION OF DRAWINGS

FIG. 20 shows a circuit diagram of an optical delay.

FIG. 22 shows a circuit diagram for an optical SR (set/reset) flip flop.

FIG. 23 shows another circuit diagram for an optical SR (set/reset) flip flop.

DETAILED DESCRIPTION OF THE PREFERRED EMBODIMENTS

Figure 1A:
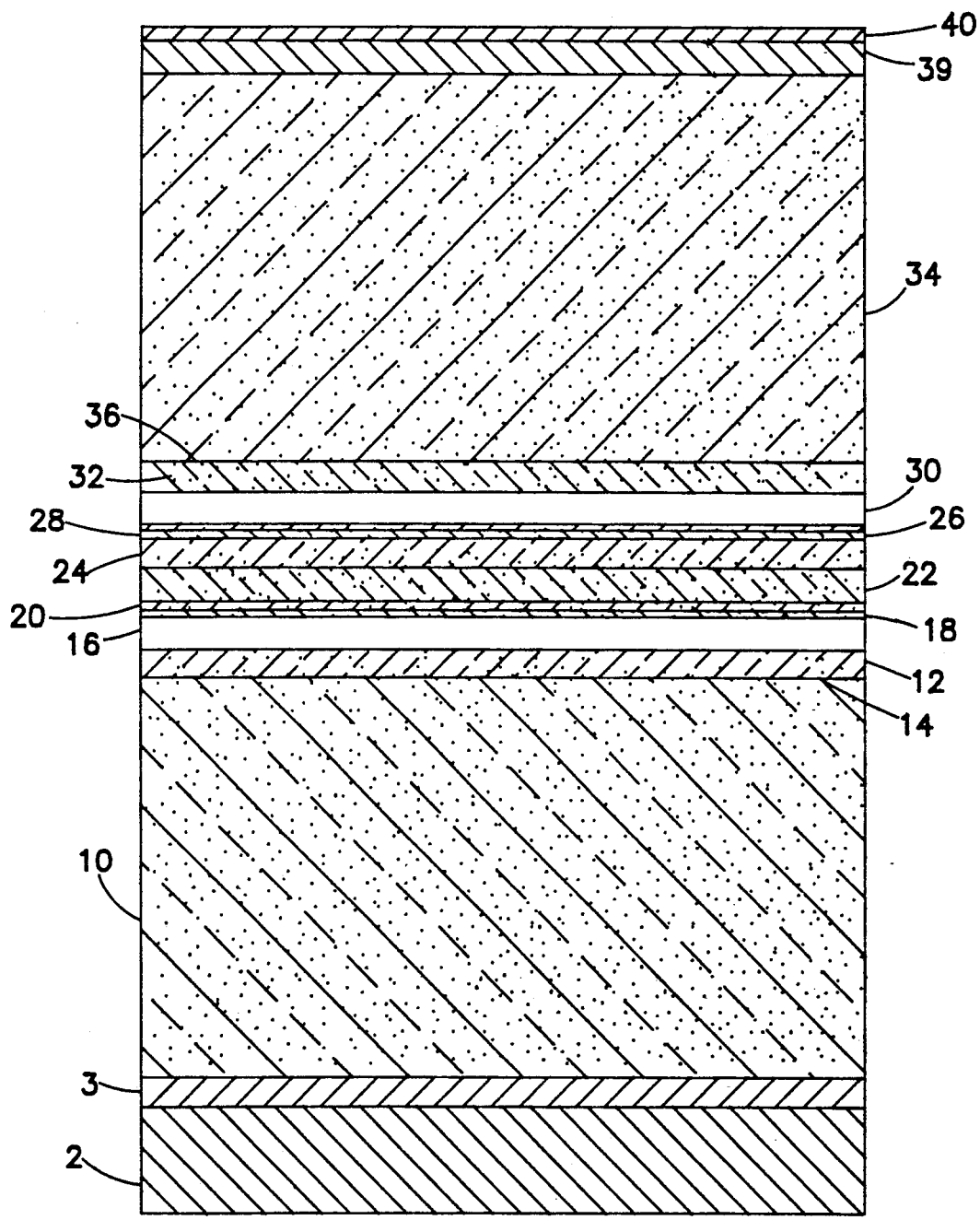
FIG. 1a is a cross-sectional diagram showing the layer structure of a specific preferred embodiment of the light-emitting heterojunction pnpn diode.
Figure 1B:
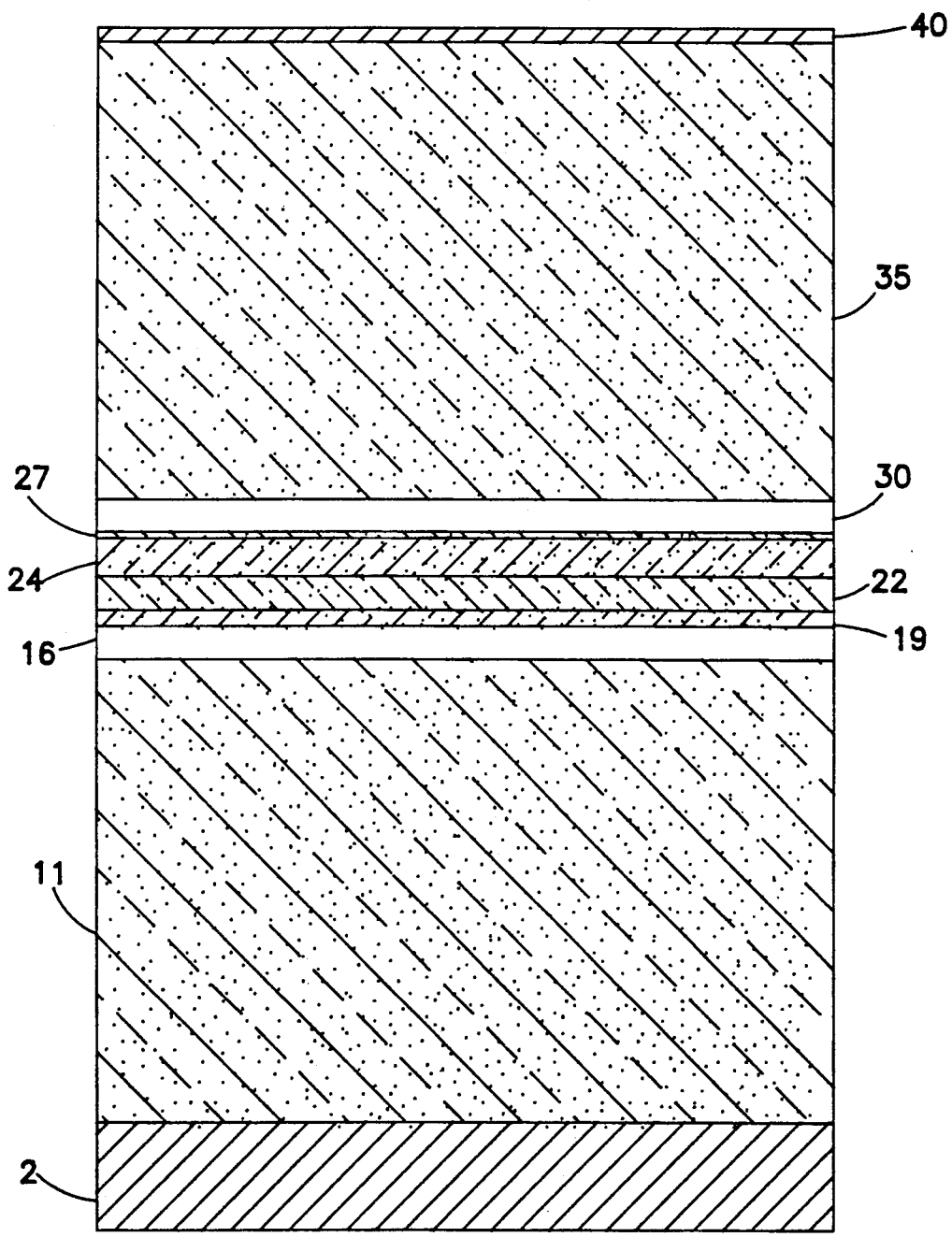
FIG. 1b is another cross-sectional diagram depicting the layer structure, in a more general form, of the preferred embodiment of the light-emitting heterojunction pnpn diode.

FIGS. 1a and 1b show cross-sectional views of the structure and placement of the semiconductor layers in the basic pnpn light emitting diode configuration considered in this application. All of the layers are epitaxially grown by the MBE (Molecular Beam Epitaxy), the CBE (Chemical Beam Epitaxy), the MOMBE Metal Organic MBE), GSMBE (Gas Source MBE), MOCVD (Metal Organic Chemical Vapor Deposition), ALE (Atomic Layer Epitaxy) or VLE (Vapor Levitation Epitaxy) methods and constitute the whole or part of the electron active region of the device.

In a preferred embodiment shown in FIG. 1a, the semiconductor layers 10, 12, 16, 18, 20, 22, 24, 26, 28, 30, 32 and 34 are epitaxially formed in succession on a series of buffer layers 3 which are formed on an n+ (100) GaAs substrate 2 doped to $\geq 5 \times 10^{17}$ cm$^{-3}$ with an n-type dopant such as Te, Se or Si. The layers are formed with the MBE method by heating the substrate to 540°-850° C., preferably 750° C., and switchably supplying arsenic (As$_4$, As$_2$, or AsH$_3$), gallium, aluminum, an n-type dopant (such as silicon) and a p-type dopant (such as beryllium or carbon). Growth rates between 0.8 μm/hr and 1.5 μm/hr and As$_4$/(Ga+Al) beam equivalent pressure ratios of 15-25 can be used for the growth of GaAs and Al$_x$Ga$_{1-x}$As (0 $\leq x \leq$ 1). A series of buffer layers 3 consisting of an 0.25 μm n+ ($2 \times 10^{18}$ cm$^{-3}$) layer of GaAs, an 0.1 μm compositionally graded (x increases from 0 to 0.35), n+ ($2 \times 10^{18}$ cm$^{-3}$) Al$_x$Ga$_{1-x}$As buffer layer and a five period n+ ($2 \times 10^{18}$ cm$^{-3}$) Al$_{0.35}$Ga$_{0.65}$As/GaAs superlattice buffer layer (5 nm GaAs/15 nm Al$_{0.35}$Ga$_{0.65}$As) are first formed on the n+ (100) GaAs substrate. These buffer layers reduce the series resistance of the device and increase the radiative recombination efficiency by capturing impurities responsible for deep levels and nonradiative recombination. Layers 10, 12, 16, 18, 20, 22, 24, 26, 28, 30, 32 and 34 are then epitaxially formed on top of these buffer layers. A substrate temperature of 750° is used during growth but this temperature can be decreased to $\leq 600°$ C. during the formation of layers 22 and 24 to prevent dopant diffusion or to introduce deep levels (which reduce the thyristor reverse recovery time) in these layers. The substrate temperature is increased to 750° C. for the formation of the subsequent layers. A compositionally graded layer 39 of p+ ($2 \times 10^{18}$ cm$^{-3}$) Al$_x$Ga$_{1-x}$As (x decreases from 0.35 to 0) can be formed on top of layer 34, followed by a p+ ($2 \times 10^{18}$ cm$^{-3}$) GaAs cap layer 40. The graded Al$_x$Ga$_{1-x}$As layer 39 reduces the series resistance of the device. The GaAs cap layer 40 reduces the ohmic contact resistance of the device and protects the Al$_x$Ga$_{1-x}$As layers from oxidation after the MBE growth.

The thicknesses of layers 3, 10, 12, 16, 18, 20, 22, 24, 26, 28, 30, 32, 34, 39 and 40 are 50-300 nm, $\geq 250$ nm, 0-150 nm, 1-200 nm, 0-100 nm, 0-100 nm, 30-300 nm, 30-300 nm, 0-100 nm, 0-100 nm, 1-200 nm, 0-150 nm, $\geq 250$ nm, 50-300 nm, and $>4$ nm respectively. The net n-doping densities ($N_D - N_A$) of layers 3, 10, 12, 24, 26 and 28 are $5 \times 10^{17} - 6 \times 10^{18}$ cm$^{-3}$, $5 \times 10^{17} - 6 \times 10^{18}$ cm$^{-3}$, $5 \times 10^{17} - 6 \times 10^{18}$ cm$^{-3}$, $\leq 6 \times 10^{18}$ cm$^{-3}$, $5 \times 10^{17} - 6 \times 10^{18}$ cm$^{-3}$ and $5 \times 10^{17} - 6 \times 10^{18}$ cm$^{-3}$, respectively. The net p-doping densities ($N_A - N_D$) of layers 18, 20, 22, 32, 34, 39 and 40 are $5 \times 10^{17} - 2 \times 10^{20}$ cm$^{-3}$, $5 \times 10^{17} - 2 \times 10^{20}$ cm$^{-3}$, $\leq 2 \times 10^{20}$ cm$^{-3}$, $5 \times 10^{17} - 2 \times 10^{20}$ cm$^{-3}$, $5 \times 10^{17} - 2 \times 10^{20}$ cm$^{-3}$, $5 \times 10^{17} - 2 \times 10^{20}$ cm$^{-3}$, and $5 \times 10^{17} - 2 \times 10^{20}$ cm$^{-3}$, respectively. The aluminum-mole fractions, x, of layers 10, 12, 16, 18, 22, 24, 28, 30, 32 and 34 are 0.25-1.0, 0.1-0.8, 0-0.2, 0.20-1.0, 0-1.0, 0-1.0, 0.2-1.0, 0-0.2, 0.1-0.8 and 0.25-1.0, respectively.

Layers 20, 26 and 39 are bandgap grading layers. In this document, a "bandgap grading layer" can be a layer in which the composition of this compound semiconductor is gradually changed through the layer. A "bandgap grading layer" can also be one or more compound semiconductor layers whose composition is intermediate between the two adjacent layers. A "bandgap grading layer" can also consist of an abrupt heterojunction or a superlatice whose effective bandgap changes through the layer. Any or all of the Al$_x$Ga$_{1-x}$As layers in this device can be formed as superlattices of GaAs and AlAs or AlGaAs.

In a preferred embodiment, the thicknesses of layers 3, 10, 12, 16, 18, 20, 22, 24, 26, 28, 30, 32, 34, 39 and 40 are 0.15 μm, 1.5 μm, 0.0872 μm, 0.0750 μm, 0.0100 μm, 0.0105 μm, 0.0578 μm, 0.0468 μm, 0.0068 μm, 0.0147 μm, 0.0750 μm, 0.0872 μm, 1.51 μm, 0.1 μm and 0.02 μm, respectively.

In this particular preferred embodiment, the net n-doping densities of layers 3, 10, 12, 24, 26, and 28 are $1 \times 10^{18}$ cm$^{-3}$, $1 \times 10^{18}$ cm$^{-3}$, $8 \times 10^{17}$ cm$^{-3}$, $3 \times 10^{18}$ cm$^{-3}$ (decreased to $1 \times 10^{18}$ cm$^{-3}$ at 0.0195 μm through layer 24), $1 \times 10^{18}$ cm$^{-3}$ and $1 \times 10^{18}$ cm$^{-3}$, respectively.

The net p-doping densities of layers 18, 20, 22, 32, 34, 39 and 40 are $8 \times 10^{17}$ cm$^{-3}$, $1 \times 10^{18}$ cm$^{-3}$, $1 \times 10^{18}$ cm$^{-3}$ (increased to $2 \times 10^{18}$ cm$^{-3}$ at 0.0137 μm through layer 22), $8 \times 10^{17}$ cm$^{-3}$, $8 \times 10^{17}$ cm$^{-3}$, $8 \times 10^{17}$ cm$^{-3}$ and $2\times10^{18}$ cm$^{-3}$, respectively. Layers 16 and 30 are not intentionally doped. In this particular embodiment, the aluminum mole-fractions, x, of layers 3, 10, 12, 16, 18, 20, 22, 24, 26, 28, 30, 32, 34, 39 and 40 are 0 graded to 0.35, 0.35, 0.20, 0.00, 0.35, 0.35 graded to 0.10, 0.10, 0.10, 0.10 graded to 0.35, 0.35, 0.00, 0.20, 0.35, 0.35 graded to 0, and 0, respectively.

For this preferred embodiment, certain allowances are made for temperature dependent growth rates caused by the desorption of gallium from the growth surface at high temperatures, as described by J Ralston, et al., J. Vac. Sci, Technol. B4 (1986), 594.

In addition, the last 1 nm of layers 12 and 28 are not intentionally doped, to account for surface segregation and diffusion of the silicon dopants in layers 12 and 28. Similarly, the first 50Å of layers 18 and 32 are not intentionally doped to account for diffusion of the beryllium dopants in layers 18 and 32.

In addition, the growth temperature is lowered to 600° C. for layer 24 to reduce the beryllium diffusion and surface segregation.

The growth temperature is determined by optical pyrometry. In this MBE system, the substrate heater can increase the substrate temperature at a rate of 100° C. per 20 seconds. The substrate can cool at a rate of 50° C. per 30 seconds. The measured time constants for changes in the gallium, aluminum, beryllium and silicon fluxes are all 20 seconds. The time constant for changes in the arsenic flux is 10 minutes.

In this preferred embodiment, layer 34 is a relatively thick, $\geq 0.25$ μm, p-type layer with a relatively low index of refraction as compared with the indices of refraction of layers 16 and 30. (All values of index of refraction refer to the values at the energy of the peak optical emission from the thyristor structure.) The bandgap energy of layer 34 must be larger than that of layers 16 and 30, so that the light generated by the radiative recombination of electrons and holes in layers 16 and 30 is not absorbed in layer 34. The thickness of layer 34 depends on the relative difference in refractive index between layer 34 and layers 16 and 30. The thickness of layer 34 is chosen so that the magnitude of the optical electric field (generated by the radiative recombination of electron and holes in layers 16 and 30) at the edge of layer 34 farthest from layer 32 is much smaller than the magnitude of the optical electric field in layers 16 and 30.

In this preferred embodiment, layer 10 is a relatively thick n-type layer with a relatively low index of refraction as compared with the indices of refraction of layers 16 and 30. The bandgap energy of layer 10 must be larger than that of layers 16 and 30, so that the light generated by the radiative recombination of electrons and holes in layers 16 and 30 is not absorbed in layer 10. The thickness of layer 10 depends on the relative difference in refractive index between layer 10 and layers 16 and 30. The thickness of layer 10 is chosen so that the magnitude of the optical electric field (generated by the radiative recombination of electrons and holes in layers 16 and 30) at the edge of layer 10 farthest from layer 12 is much smaller than the magnitude of the optical electric field in layers 16 and 30. Together, layers 34 and 10 form the outer cladding of the planar dielectric waveguide cavity of the pnpn light emitting structure.

Layers 10 and 34 can also contain dielectric mirrors formed of alternating layers with different refractive indices. If dielectric mirrors are incorporated into layer 10 and/or layer 34, light can be propagated along the epitaxial growth direction and a vertical thyristor laser is formed. In this case, the dielectric mirrors and the semiconductor material between them form a vertical optical resonant cavity or Fabry-Perot cavity.

In this preferred embodiment, layer 32 is a p-type optical confinement tailoring layer with an index of refraction which is larger than that of layer 34 and an effective bandgap energy which is larger than that of layers 16 and 30 Layer 32 can have a uniform composition, a non-uniform composition or can even contain a superlattice. Layer 32 tailors the optical electric field in the planar waveguide cavity to maximize the optical electric field in layer 30 and simplifies the impedance matching between the optical cavity of the diode and the input and output optical waveguides. The larger bandgap energy of layer 32 also serves to confine in layer 30, the electrons and holes which are injected into layer 30 from layers 28 and 32. The injection efficiency of holes from layer 32 into layer 30 and the confinement efficiency of electrons and holes in layer 30 can be enhanced by grading the effective band gap of layer 32, with the narrower band gap portion of lay 32 abutting layer 30.

In this preferred embodiment, layer 12 is an n-type optical confinement tailoring layer with an index of refraction which is larger than that of layer 10 and an effective bandgap energy which is larger than that of layers 16 and 30. Layer 12 can have a uniform composition, a non-uniform composition or can even contain a superlattice. Layer 12 tailors the optical electric field in the planar waveguide cavity to maximize the optical electric field in layer 16 and simplifies the impedance matching between the optical cavity of the diode and the input and output optical waveguides. The larger bandgap energy of layer 12 also serves to confine in layer 16, the electrons and holes which are injected into layer 16 from layers 12 and 18. The injection efficiency of electrons from layer 12 into layer 16 and the confinement efficiency of electrons and holes in layer 16 can be enhanced by grading the effective bandgap of layer 12, with the narrower bandgap portion of layer 12 abutting layer 16.

In this preferred embodiment, layers 16 and 30 are the carrier confinement regions responsible for the optical power gain of the stimulated optical emission when this device is operated as a laser and for the majority of the spontaneous optical emission when this device is operated as a light emitting diode. In order to form a dielectric waveguide which confines light in the plane perpendicular to the growth direction, the refractive indices of layers 16 and 30 must be larger than that of layers 10 and 34, and it is desirable that the refractive indices of layers 16 and 30 be the largest in the planar dielectric waveguide cavity. The bandgap energies of layers 16 and 30 can be different from each other. However, the bandgap energy of layer 30 must be smaller than that of layers 28 and 32, while the bandgap energy of layer 16 must be smaller than that of layers 12 and 18. Layers 16 and 30 are usually undoped, but they can be doped with n-type dopants, p-type dopants or both, as long as electrons and holes are injected easily into layers 16 and 30. The thickness of layers 16 and 30 are each between 1 nm and 250 nm. The thickness of layers 16 and 30 can differ from each other and are chosen from considerations such as threshold current for lasing and relative threshold current densities. The carrier confinement layers, 16 and 30, can also be single or multiple quantum wells.

In this preferred embodiment, layer 28 is a relatively thin (0-100 nm), n-type layer with a bandgap energy larger than that of layer 30. Layer 28 serves to confine the injected electrons and holes in layer 30. The thickness of layer 28 is determined partially by the tailoring of the optical electric field between layers 10 and 34, and partially by the desire to minimize the number of nonequilibrium carriers in the base and reduce the reverse recovery time. The difference in bandgap energies between layer 28 and layer 30 is determined by the tailoring of the current versus voltage characteristics, the displacement current switching current threshold and the switching current.

In this preferred embodiment, layer 18 is a relatively thin (0-100 nm), p-type layer with a bandgap energy larger than that of layer 16. Layer 18 serves to confine the injected electrons and holes in layer 16. The thickness of layer 18 is determined partially by the tailoring of the optical electric field between layers 10 and 34, and partially by the desire to minimize the number of nonequilibrium carriers in the base and reduce the reverse recovery time. The difference in bandgap energies between layer 18 and layer 12 is determined by the tailoring of the current versus voltage characteristics, the displacement current switching threshold and the switching current.

In this preferred embodiment, layer 26 is an n-type layer which is a bandgap grading layer to tailor the bandgap from that of layer 28 to that of layer 24. Layer 26 can consist of a compositionally graded layer or of a chirped superlattice structure. Layer 26 can also consist of one or more layers which have bandgaps between that of layers 28 and 24, or it can be omitted altogether to form an abrupt heterojunction.

In this preferred embodiment, layer 20 is an p-type layer which is a bandgap grading layer to tailor the bandgap from that of layer 18 to that of layer 22. Layer 20 can consist of a compositionally graded layer or of a chirped superlattice structure. Layer 20 can also consist of one or more layers which have bandgaps between that of layers 18 and 22, or it can be omitted altogether to form an abrupt heterojunction.

In this preferred embodiment, layer 24 is a n-type layer, whose bandgap is determined by the desired spectral range for optical input switching. The refractive index of layer 24 can be chosen as a secondary parameter in the tailoring of the optical electric field distribution in the planar dielectric waveguide cavity for the purpose of maximizing the optical efficiency of the device and to simplify the optical impedance matching between the device cavity and the input and output optical waveguides. The thickness of layer 24 depends on the doping density of the layer, the desired current versus voltage characteristics, the optical input sensitivity and minimization of nonequilibrium charge in the base region to minimize the reverse recovery time.

In this preferred embodiment, layer 22 is a p-type layer, whose bandgap is determined by the desired spectral range for optical input switching. The refractive index of layer 22 can may be chosen as a secondary parameter in the tailoring of the optical electric field distribution in the planar dielectric waveguide cavity for the purpose of maximizing the optical efficiency of the device and to simplify the optical impedance matching between the device cavity and the input and output optical waveguides. The thickness of layer 22 depends on the doping density of the layer, the desired current versus voltage characteristics, the optical input sensitivity and minimization of nonequilibrium charge in the base region to minimize the reverse recovery time.

A generalized form of the preferred embodiment is shown in FIG. 1b, using the same reference numerals as are used in FIG. 1a. The semiconductor regions 11, 16, 19, 22, 24, 27, 30 and 35 are epitaxially formed in succession on a (100) GaAs substrate 2. Layer 11 is the first emitter region, layer 16 is the first carrier confinement region, layer 19 is the first internal heterojunction barrier, layer 22 is the first base region, layer 24 is the second base region, layer 27 is the second internal heterojunction barrier, layer 30 is the second carrier confinement region, layer 35 is the second emitter region. The first emitter 11 and the second base 24 have the same conductivity type. Similarly, the first base layer 22 and the second emitter layer 35 have the same conductivity type. However, the conductivity type of layers 22 and 35 is different from that of layers 11 and 24. For example, if layers 11 and 24 are p-type, then layers 22 and 35 are n-type.

The semiconductor layer structure described by FIG. 1b represents the basic structure of the invention, along with the constraint that the entire structure forms a single optical cavity in the directions transverse to the intended direction of light propagation. The structure described in FIG. 1a is one specific embodiment of the layer structure illustrated in FIG. 1b. For example, in FIG. 1a, the GaAs/AlGaAs buffer 3, the main emitter layer 10, and the optical confinement tailoring layer 12 all comprise the first emitter region. The carrier confinement region 16 in FIG. 1b is the same as the carrier confinement region 16 in FIG. 1a. In FIG. 1a, the internal heterojunction barrier layer 18 and the bandgap grading layer 20 form the internal heterojunction barrier 19 in FIG. 1b. Layer 22 is the first base region in both FIGS. 1a and 1b. Similarly, layer 24 is the second base region in both FIGS. 1a and 1b. The bandgap grading layer 26 and the internal heterojunction barrier layer 28 in FIG. 1a comprise the second internal heterojunction barrier 27. The carrier confinement region 30 in FIG. 1b is the same as the carrier confinement region 30 in FIG. 1a. The optical confinement tailoring layer 32, the main emitter layer 34, the bandgap tailoring layer 39 and the cap layer 40 all comprise the second emitter region 35. A primary purpose of FIG. 1b is to clarify which portions of the layer structure described in FIG. 1a are necessary for the intended practice of the invention.

Figure 2:
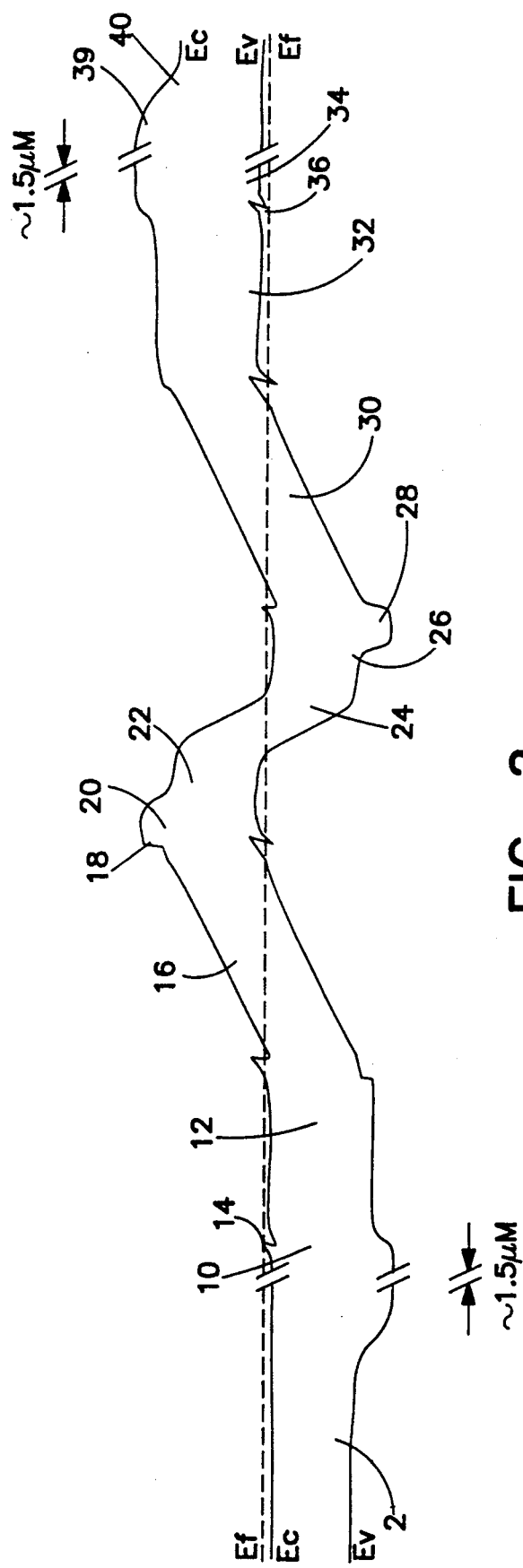
FIG. 2 shows the conduction band minimum, valence band maximum and Fermi level as a function of position through this device, under equilibrium conditions of no applied bias.

FIG. 2 shows the energy of the valence band maximum, the conduction band minimum and the Fermi level energy as a function of position of the preferred embodiment of the PNPN heterojunction laser, described in FIG. 1a. The energies in FIG. 2 are depicted under conditions of no applied voltage and zero current flow.

Figure 3:
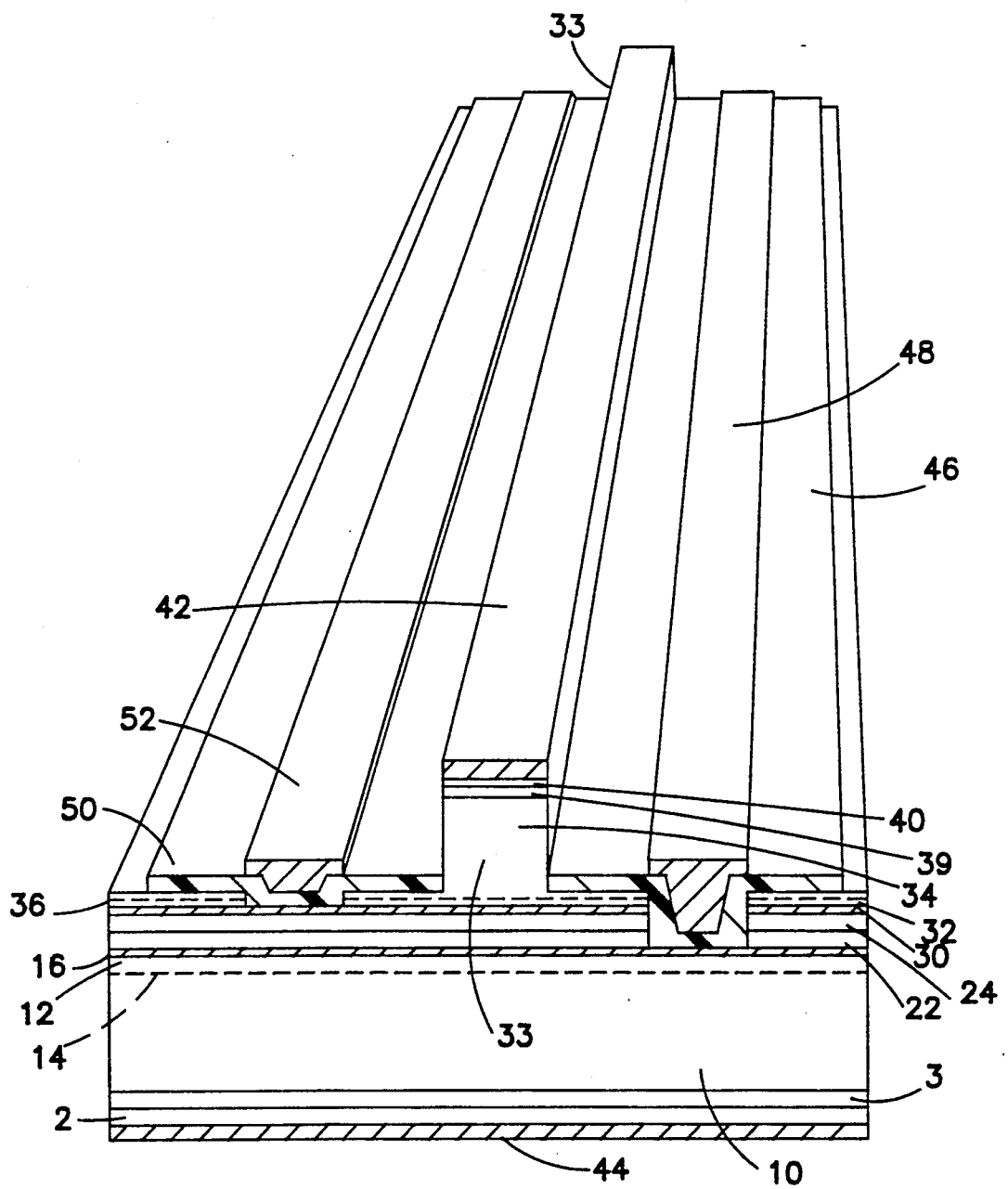
FIG. 3 is a perspective view of the light emitting pnpn diode structure embodied as an oxide-stripe laser with metal-insulator-semiconductor (MIS) capacitors for coupling out the displacement current.

FIG. 3 is a perspective drawing of a preferred embodiment of the heterojunction thyristor laser, viewed from one of the light emitting ends. Other standard laser fabrication processes can also be used to make pnpn heterojunction lasers from the epitaxial layer structure described in FIG. 1a and 1b. This light emitting end is a semi-transparent mirror facet 35, formed by cleaving the semiconductor device along a crystal plane perpendicular to the ridge which supports the electrode 42. This cleaved light emitting mirror facet 35 is parallel to the epitaxial growth direction and perpendicular to the planes in which the epitaxial layers are formed. This cleaved facet 35 forms a semi-transparent mirror as a result of the difference in refractive indices of the semiconductor and the air. A second mirror facet 33 is formed at the other end of the device, parallel to the first mirror facet 35. These two mirror facets 33 and 35 and the semiconductor materials separating them form an optical resonant cavity known as a Fabry-Perot cavity.

Electrical current passes through the structure from one electrode 42 which is deposited in ohmic contact with the conductive GaAs cap layer 40 to electrode 44 which is deposited in ohmic contact with the conductive GaAs substrate 2. Electrons and holes recombine and produce light primarily in the carrier confinement regions, 16 and 30. The dashed lines 14, 36 mark the boundaries between layers 10 and 12, and between layers 32 and 34, respectively. The bounds of the core of the optical waveguide cavity are delimited by 14 and 36, along the epitaxial growth direction. The waveguide cavity, in the directions perpendicular to the epitaxial growth direction, is formed by a chemical etching/anodic oxidation process and by cleaving. In the direction perpendicular to both the epitaxial growth direction and also to the direction of light propagation during lasing, the extent of the cavity is defined lithographically so that the light propagates in a [110] crystal direction.

The semiconductor regions outside the cavity are etched away, stopping in layer 34, leaving about 0.5 $\mu$m of layer 34 intact. The exposed surfaces of layer 34 are then anodically etched in a solution of one part 3% tartaric acid diluted in two parts propylene glycol. During this anodic oxidation the positive potential is applied to the semiconductor and the negative potential is applied to a platinum electrode in the solution. The anodic oxidation is done with a current density of $\sim 1$ mA/cm$^2$ through the semiconductor surface, until an oxide of about 0.3 $\mu$m has been grown. (The potential should be about 150 volts.) The anodic oxidation should stop short of the carrier confinement layer 30.

The GaAs oxide formed on top of the cavity is selectively removed with a 20 second HCl:water (1:10) etch. The horizontal extent of the optical waveguide cavity is controlled by the width of the unetched portion of region 34, situated beneath the electrode 42. The extent of the optical cavity perpendicular to the light propagation during lasing is formed by cleaving the crystal along a (110) crystal plane with a razor to form a planar mirror facet.

The mirror facets 33 and 35 on the ends of the cavity can be formed by other methods, including etching and etching combined with ultrasonic microcleaving. For etched mirrors it is not essential for the light to propagate in the [110] crystal direction. The ends of the mirror facets 33 and 35 can also be coated with dielectric and/or metallic mirrors to change the quality factor or Q of the optical cavity.

In a preferred embodiment, the capacitors, which have electrodes 48 and 52, are formed by chemically etching down to layers 30 and 16, respectively, after a stripe parallel to the waveguide cavity has been lithographically defined. The diode is then coated with a thin insulating film 50 of SiO$_2$ or Si$_3$N$_4$. Next, the electrodes 48 and 52 are lithographically defined and deposited using evaporation and the well-known lift-off process. These capacitors are used to reduce the sensitivity of the device to displacement current switching by capacitively coupling out the displacement currents. The capacitor formed with electrode 52 removes majority carriers from regions 24 and 26, as the forward potential across the thyristor increases. The capacitor formed with electrode 48 removes majority carriers from regions 20 and 22, as the forward potential across the thyristor increases. The removal of these majority carriers reduces the injection of minority carriers which is needed to support the increased potential drop across the pn junction formed by layers 22 and 24.

It is the injection of these minority carriers which causes the thyristor to switch to the forward current conducting state if the forward potential across the thyristor is increased too rapidly. This switching can occur even if the final potential is less than the thyristor's forward breakover voltage. This type of switching is referred to as displacement current or dV/dt switching. The lowest rate of increase in the thyristor forward potential which causes displacement current switching is the displacement current switching threshold. The displacement current switching threshold is clearly one limitation on the maximum operating frequency of a thyristor.

Thus, the normal operation of the device is not impaired by electrical shorting of the base-emitter junctions, since the capacitors only act as shorts for high frequency signals. In another embodiment, capacitors can also be fabricated by placing electrodes in ohmic contact with regions 22 or 24 depositing a thin insulating film on top of these electrodes and depositing separate electrode on top of the insulator to form a conductor-insulator-conductor capacitor structure.

Figure 4:
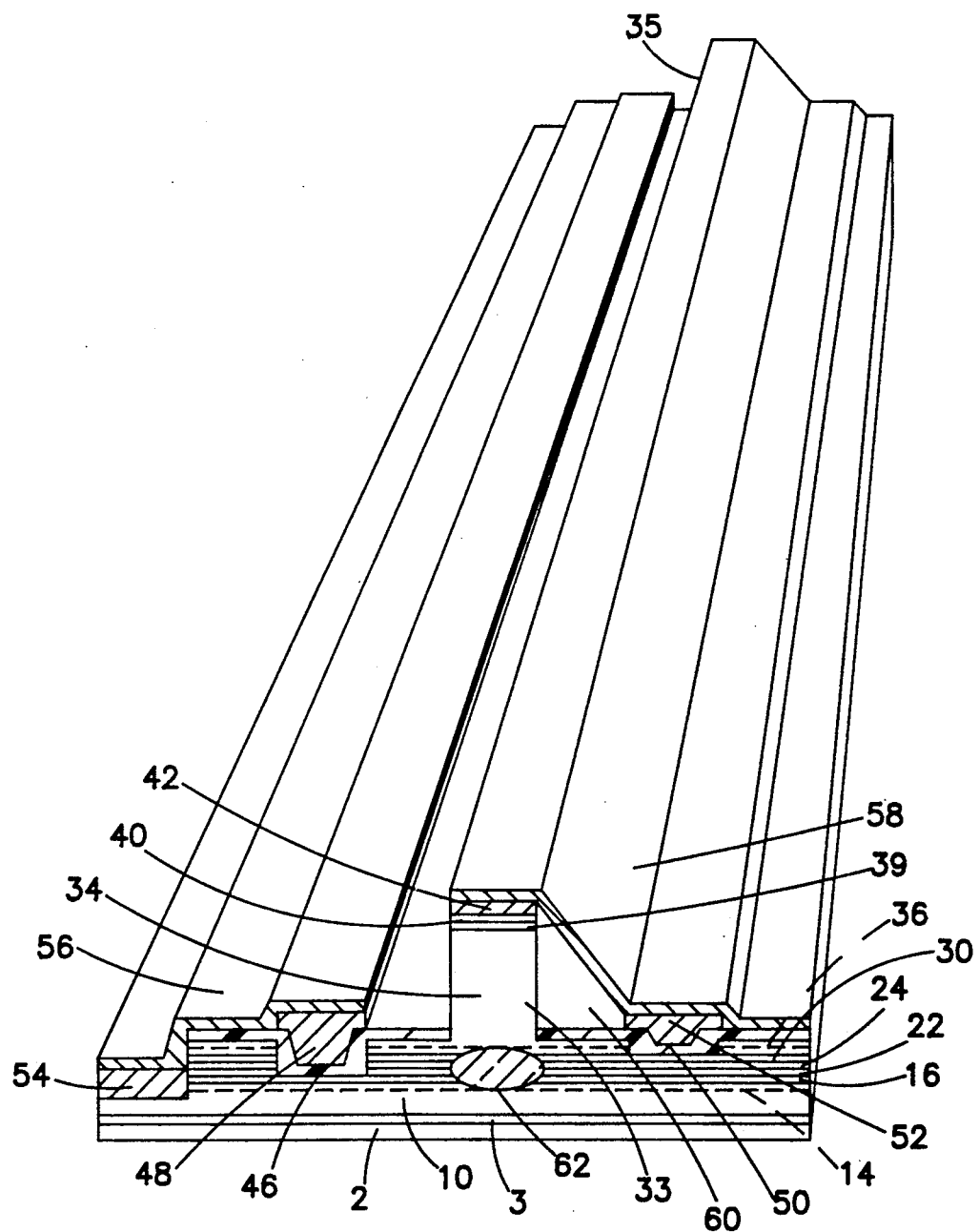
FIG. 4 is a perspective view of the light emitting pnpn diode structure embodied as an oxide-stripe laser with MIS capacitors for coupling out the displacement current, showing the connections between a capacitor and the anode and between the other capacitor and the cathode and also indicating the primary region of optical output.

FIG. 4 shows a perspective drawing of another embodiment of the heterojunction thyristor structure. The operation of this structure is the same as that of the device shown in FIG. 3, except that it is viewed from the opposite mirror facet 33 and a topside electrode 54 is placed in ohmic contact with layer 10. The topside electrode 54 is deposited in ohmic contact with layer 10, after layer 10 is exposed through lithographically defined etching. (In this embodiment, the substrate can be semi-insulating.) Furthermore, an insulator 60 such as polyimide, has been deposited and lithographically defined. Electrodes 48 and 54 are electrically connected to electrode 56. Electrodes 42 and 52 are electrically connected to electrode 58, which is supported by the insulator 60. The insulator 60, can be removed after electrode 58 is deposited, forming an air bridge out of electrode 58.

The electrical current flows through the thyristor, between electrodes 42 and 52. The use of a top side electrode 54 allows the use of a semi-insulating GaAs substrate, which is important for electrically isolating different thyristors from each other, in order to integrate them on the same substrate. The black oval 62 represents the region of peak optical output for stimulated emission from the semi-transparent mirror, clearly indicating that both light producing, carrier confinement layers share the same optical cavity. The shared optical cavity makes it easier to optically couple the optical cavity of the thyristor to the input and output waveguides.

Figure 5:
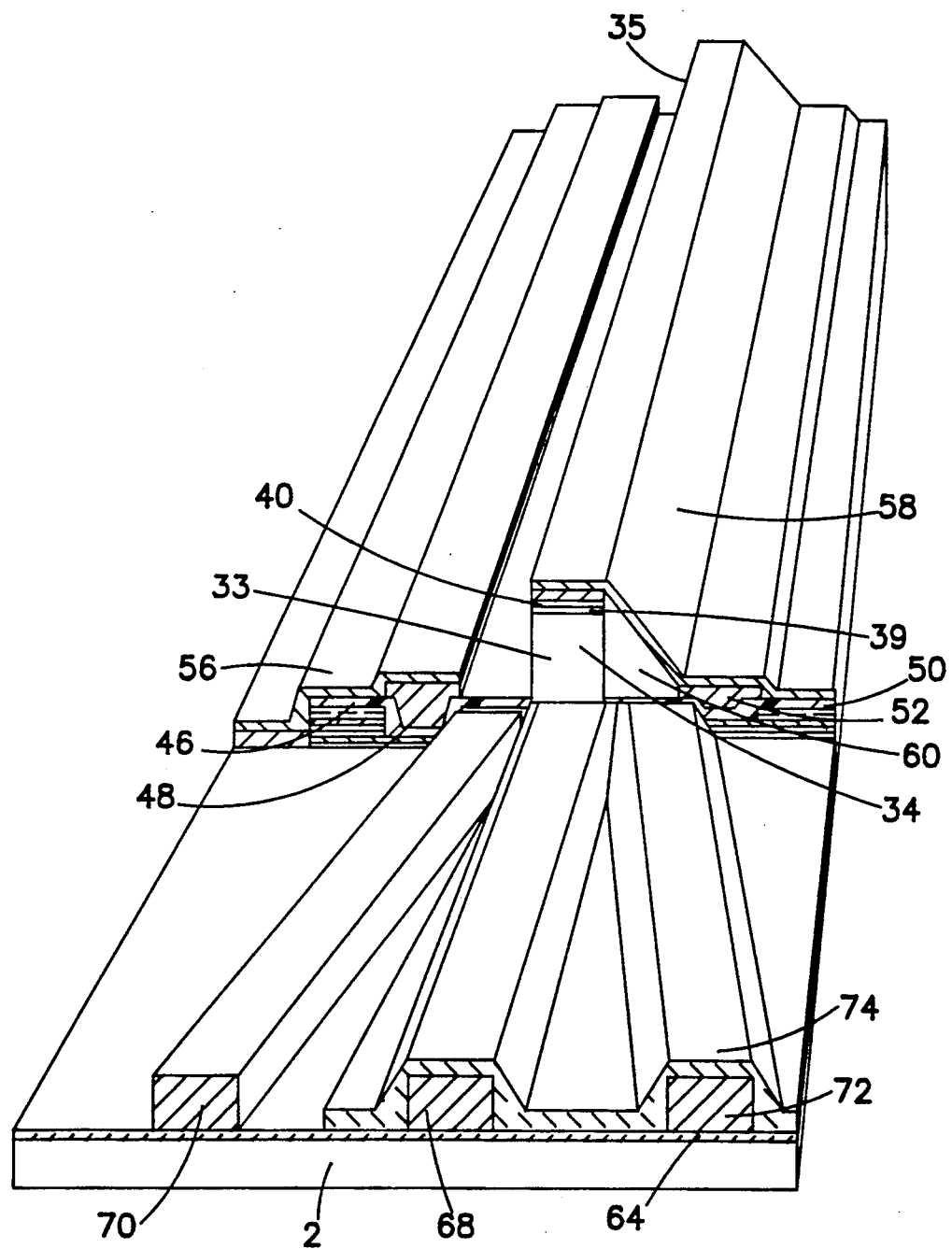
FIG. 5 is a perspective view of the embodiment of this thyristor laser structure, with MIS capacitors, showing the use of integrated waveguides for the input and output signals.

FIG. 5 is a perspective drawing of the thyristor structure, embodied as shown in FIG. 4, showing a preferred embodiment, coupling the input and output waveguides to the optical waveguide cavity of the thyristor. The laser structure is similar to that described in FIG. 4 except that the mirror facets 33 and 35 at the end of the optical waveguide cavity are formed through etching or through etching and ultrasonic cleaving, leaving a portion of the substrate 2 intact. The remaining portion of the substrate 2 supports the input and output optical waveguides.

In the preferred embodiment shown in FIG. 5, the input and output waveguides are dielectric waveguides, with inner cores 68, 70 and 72 deposited on a lower cladding layer 64 with a smaller refractive index. The inner core layers 68, 70 and 72 are then defined by etching and are covered by depositing the upper cladding layer 74 over the top. The refractive index of the upper cladding layer 74 is smaller than that of the waveguide cores 68, 70 and 72. In FIG. 5, the upper cladding layer 74 has been removed from on top of the waveguide core 70 in order to show the core of waveguide 70 more clearly. In a preferred embodiment, the upper 74 and lower 64 waveguide cladding layers are fabricated of $SiO_2$, deposited by plasma enhanced chemical vapor deposition. The inner cores 68, 70 and 72 are fabricated of $Si_3N_4$, also deposited by plasma enhanced chemical vapor deposition.

The cladding layers 64, 74 can be etched away between the waveguides 68, 70 and 72 to enhance the signal isolation between separate waveguides. The isolation between the waveguides can also be enhanced by depositing a thin conductive film between the lower cladding layer 64 and the substrate 2, as well as on top of the upper cladding layer 74. Such conductive layers result in a very large attenuation of the optical electromagnetic fields at the edge of the waveguides. The input waveguide cores 70, 72 are not directly aligned with the end of the thyristor waveguide cavity. Since the input waveguides 70 and 72 are not aligned with the strong light producing region of the end of the optical cavity, 62 in FIG. 4, the input light sources are effectively isolated from the optical output of the thyristor.

The input light will still be guided into the structure, but in a relatively lossy fashion. However, since the light is absorbed in a relatively short distance, it will not matter if the waveguide is lossy. The output waveguide core 68 is aligned with the strong light producing region of the end of the thyristor waveguide cavity, 62 in FIG. 4. Additional input and output waveguides can be fabricated at the other end of the thyristor waveguide cavity. The thyristor can also be fabricated with other geometries, including ring cavity structures, changing the efficiency of the optical emission and also the number of input and output waveguides which can be coupled to the thyristor optical cavity.

Figure 6:
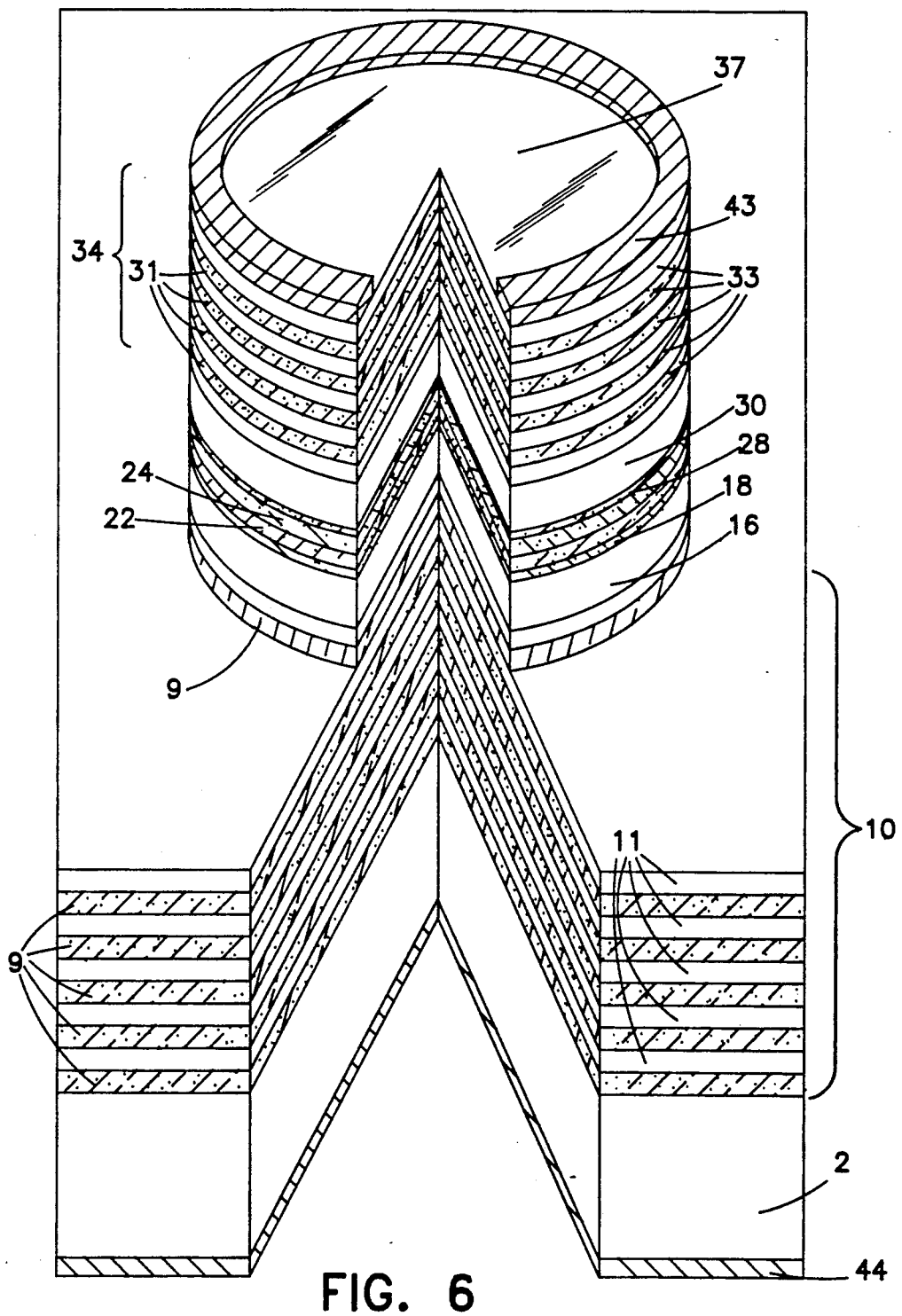
FIG. 6 is a perspective view of the light emitting pnpn diode structure as a vertical laser.

FIG. 6 shows a perspective drawing of another embodiment of the heterojunction thyristor structure with a cross-sectional wedge removed to help clarify the structure. The structure and placement of the semiconductor layers in this embodiment are the same as that of the embodiment depicted in FIG. 3, except that the emitters 10 and 34 contain dielectric mirrors formed by alternating semiconductor layers (9 and 11 in layer 10; 31 and 33 in layer 34), with differing refractive indices. The shape of the top electrode 43 is different than that in the embodiment depicted in FIG. 3. This embodiment also omits the capacitors, which were included in the embodiment depicted in FIG. 3. In addition, the optimal lengths of the carrier confinement layers 16 and 30 are significantly longer than is optimal for the embodiment depicted in FIG. 3.

The alternating layers 9, 11 and 31, 33 form two semi-transparent dielectric mirrors for the optical wavelength desired for stimulated optical emission. The refractive indices of layers 9 and 11 are different. The refractive indices of layers 31 and 33 are also different from each other. It is desirable that the top layer 37 of the top dielectric mirror have a larger refractive index than the layer immediately below it. The thickness of layers 31 and 33 are designed to be odd multiples of one-quarter of the desired operating wavelength in those materials. The bandgap energies of layers 9, 11, 31 and 33 must be larger than the energy of the stimulated optical emission.

These two dielectric mirrors form a vertical Fabry-Perot cavity. In this embodiment, stimulated optical emission travels perpendicular to the plane of the semiconductor layers. Light is emitted through the top surface 37 of the emitter 34, which contains the dielectric mirror formed by layers 31 and 33. Optical input signals can be introduced from either the top surface 37 of the emitter 34, or from the side of the mesa.

The carrier confinement layers 16 and 30 can contain quantum wells, designed to produce light at a desired wavelength. These quantum wells can be placed at or near the positions corresponding to maximum optical electric fields in the Fabry-Perot cavity.

This structure operates in precisely the same manner as the embodiment depicted in FIG. 3, except that the stimulated optical emission propagates perpendicular to the plane of the semiconductor layers. This embodiment does not include capacitors to increase the displacement current switching threshold (50, 52 and 46, 48 in the embodiment depicted in FIG. 3). Such capacitors can be included in order to increase the displacement current switching threshold.

A mesa in the shape of a right circular cylinder is created by lithographically defining a circle on top of the top emitter 34 and etching away the epilayers around the circle with reactive ion etching and/or conventional chemical etching. The etch is stopped just inside the bottom emitter 10. A top electrode 43 is lithographically defined and deposited in ohmic contact with the top emitter 34, using a conventional evaporation or sputtering process. A bottom electrode 44 is then placed in ohmic contact with the conductive substrate 2, using a conventional evaporation or sputtering process.

The mesa provides lateral confinement for electrons and holes in the plane of the semiconductor layers. It is not essential that the shape of the mesa be a right circular cylinder. However, the shape of the right circular cylinder minimizes the ratio of the surface area to volume of the carrier confinement regions 16 and 30, thus minimizing the losses due to surface recombination. The injection of carriers from the top electrode 43 is also more uniform for a mesa in the shape of a right circular cylinder than for other shapes, allowing for more uniform, efficient and reliable device operation. The top electrode 43 is an annular ring, allowing light to pass through the center of the electrode through the surface of the top mirror 37.

It is to be understood that the electrodes 43 and 44 can be placed in many different manners than the one depicted in FIG. 6. Specifically, these electrodes 43 and 44 can be used to form part of the top and/or bottom mirrors. In addition, it is not necessary for the current to flow through any or all of the dielectric mirror layers 9, 11 and 31, 33. In fact, propagation of current through the mirrors can cause undesirable power losses and heating, which is reduced if the electrodes 43 and 44 are placed in ohmic contact with the portions of the emitters 10 and 34 inside the Fabry-Perot cavity. (This placement of electrodes can also benefit conventional vertical semiconductor lasers.) Finally, the top and bottom mirrors can be fabricated or enhanced by depositing dielectric layers on top of the top emitter 34 and below the bottom emitter 10.

Figure 7:
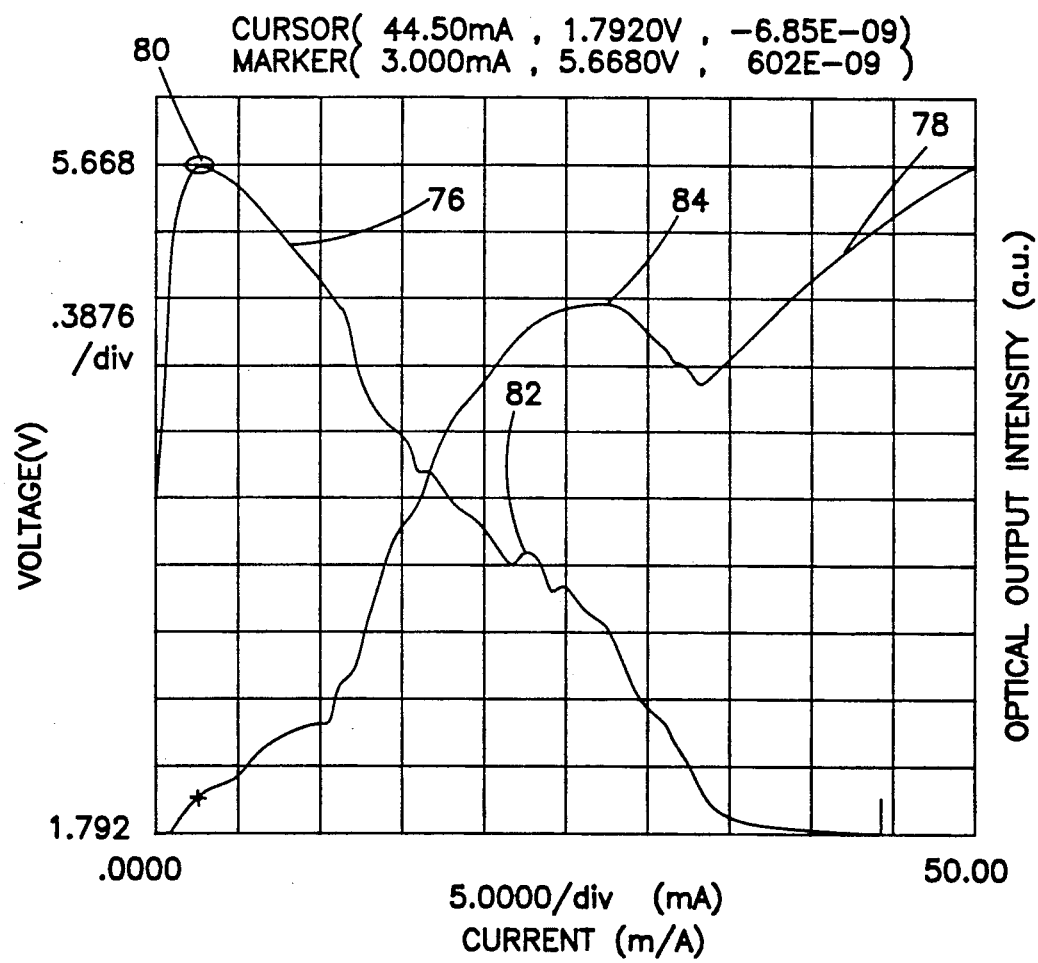
FIG. 7 shows the experimental voltage and optical output -vs- anode current characteristics for a pnpn heterojunction light-emitting diode under bias conditions where the p-type emitter has a more positive potential than the n-type emitter.

FIG. 7 shows experimental results for the voltage and light output as a function of current for a heterostructure light-emitting pnpn diode with a structure similar to that shown in FIG. 3. In FIG. 7, positive current flow indicates current travelling from the p-type emitter through the thyristor to the n-type emitter layer. In this device, however, the capacitor electrodes 48, 52 and the insulators 46, 50 were omitted. The voltage across the device is shown as a function of the current through the device by the curve 76. The voltage across the device increases rapidly until the forward breakover voltage, 5.668 V, is reached, at which point the voltage decreases to the minimum "ON" state voltage, 1.792 V for this particular device. This device exhibits structure never before reported for a pnpn diode in the region 82, which I refer to as the "transition region". In this transition region, the voltage across the device decreases gradually to the "ON" state voltage of about 1.79 V, resulting in this new hump or shoulder 82 in the voltage characteristic. For diode currents lower than that of the forward breakover voltage, the device is in the forward current blocking or "OFF" state. For diode currents larger than the hump or shoulder of the voltage characteristic, 34 mA, the device is in the forward current conducting or "ON" state. For diode currents between the forward current blocking and forward current conducting states, the device is in the "transition region". The optical output intensity of the device is shown as a function of the current through the device by the curve 78. There is also a new bump 84 in the optical output intensity characteristic, as the device passes through the "transition region."

Figure 8:
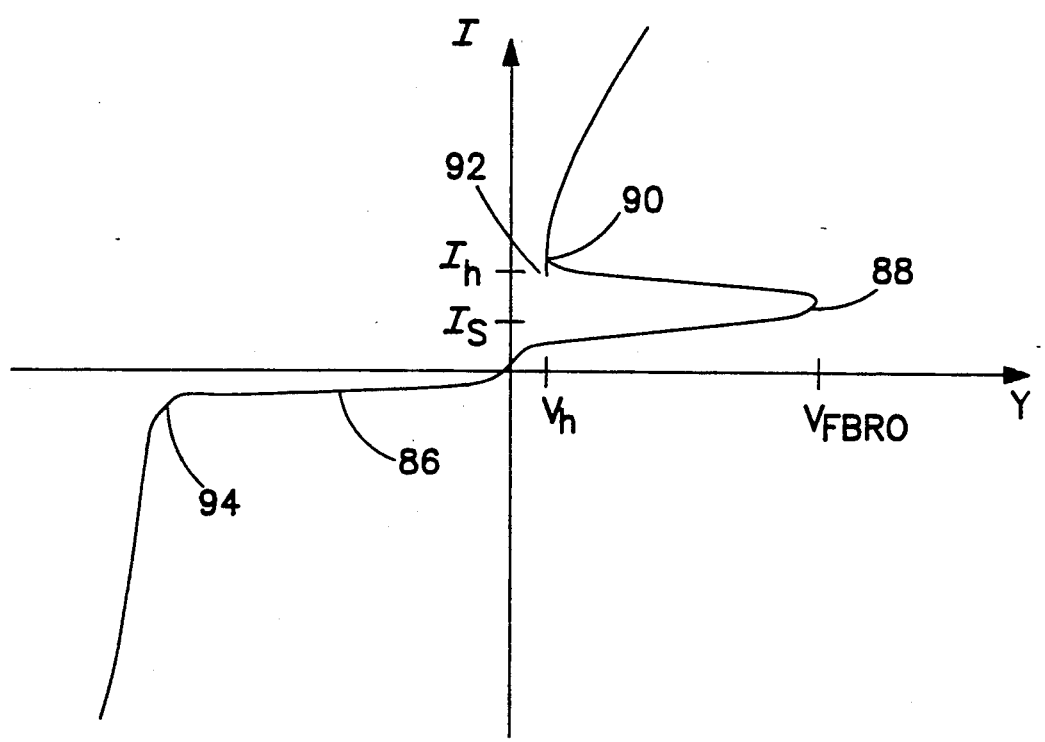
FIG. 8 shows the current -vs- voltage characteristics of a conventional pnpn diode.

FIG. 8 shows the current as a function of voltage for a conventional homojunction pnpn diode, without externally applied incident light. The point 88 where the pnpn diode spontaneously switches from the forward blocking or "off" state to the forward conducting or "on" state is known as the forward breakover point. The voltage at this forward breakover point 88, under conditions of no externally applied light, is known as the forward breakover voltage, $V_{FBRO}$. The current level at the forward breakover point 88 is known as the switching current, $I_s$ and is the minimum current required to switch the thyristor to the "on" state. After the thyristor is turned "on", the holding current, $I_h$, is the minimum current required to maintain the thyristor in the "on" state. When the pnpn diode is biased in the forward conducting region to conduct the minimum holding current 92, the voltage across the pnpn diode is referred to as the holding voltage, $V_h$. The voltage across the pnpn diode in the forward conducting state at under arbitrary biasing conditions is referred to as the "on" voltage, $V_{on}$. Under reverse biased conditions, the point at which strong conduction occurs 94 is known as the reverse breakdown point and the voltage of this point is the reverse breakdown voltage, $V_{RBR}$.

Figure 9:
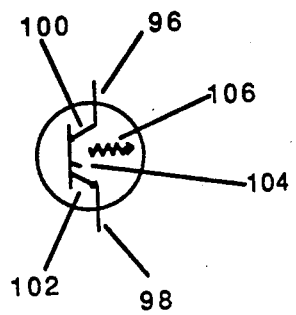
FIG. 9 shows the circuit symbol used for a light-emitting pnpn diode.

FIG. 9 shows the symbol used in this document for bistable, light-emitting heterostructure pnpn thyristors. The electrical connections to the p- and n-type emitter layers are represented as 96 and 98, respectively. The intersection of the line and arrow indicated by 100 represents the pn junction closest to the p-type emitter layer. The intersection of the line and arrow indicated by 102 represents the pn junction closest to the n-type emitter layer. The intersection of the two lines indicated by 104 represents the center np junction. The zig-zag arrow indicated by 106 represents the fact that these devices are light producing structures.

In the circuit diagrams presented in this document, it should be understood that the symbol presented in FIG. 9 is intended to represent not only the light-emitting heterostructure pnpn diodes described in FIGS. 1–6, but also other light-emitting pnpn diode structures, other single and multiple junction bistable light-emitting diodes and other bistable light-emitting structures.

It should be understood that the bistable diodes used in the circuits described in this document are each fundamentally capable of generating multiple energies of light, while being sensitive to optical input energies which are independent of the output energies. The use of multiple energies of light allows the use of multiple logic levels and the implementation of master-slave circuits.

It should be further understood that non-light emitting PNPN diodes can may be used in place of the light-emitting PNPN diodes in portions of the circuits where the optical output of the PNPN diode is not required for the proper operation of the circuit. These non-light emitting PNPN diodes can be replaced with photo-sensitive devices, where a photo-sensitive device is a device whose conductivity increases when exposed to light. Photoconductors and phototransistors are examples of photo-sensitive devices.

It should also be understood that the resistors shown in these circuit diagrams can be replaced with photoconductors or various types of transistors, including field effect transistors (FETs). The use of transistors, photo-transistors and photo conductors in place of resistors allows the circuitry to be switched and/or tuned with electrical and/or optical signals. It should also be understood that diodes can be placed in series with the bistable diodes, in order to increase the apparent forward breakover voltages of the diodes.

Figure 10:
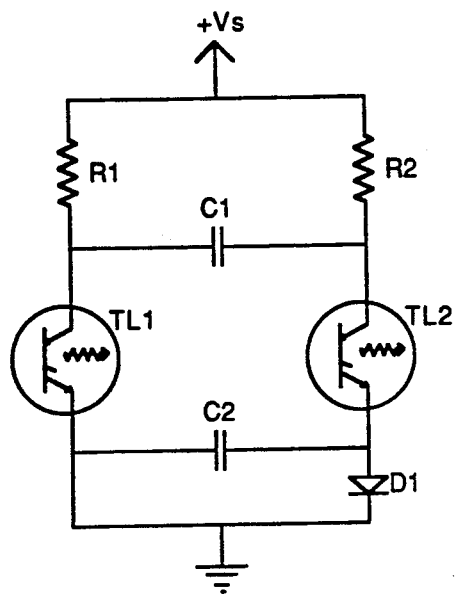
FIG. 10 shows the circuit diagram of an optical one-shot with inverted output, with an optional electrical input trigger.

FIG. 10 shows the circuit diagram of an embodiment of an optical one-shot which produces an inverted optical output signal. For this circuit, $V_{FBRO1} < V_s < V_{FBRO2}$, $(V_s - V_{on1})/R1 > I_{h1}$ and $(V_s - V_{on2})/R2 > I_{h2}$. It is also necessary that the R1C1 and R2C1 time constants be long enough to allow thyristors TL1 and TL2 to achieve complete forward blocking recovery. In equilibrium, thyristor TL1 is "on" and thyristor TL2 is "off". The spectral and intensity sensitivity of thyristor TL2 is such that it can be can be switched "on" by the optical input pulses of energy $h\nu_{input1}$.

When thyristor TL2 is triggered with a pulse of light, as described earlier, then the voltage drop across capacitor C1 turns thyristor TL1 "off". Thyristor TL1 switches back "on" after a time $\Delta t_1$, regardless of whether the optical input is on or off. $\Delta t_1$, is determined by C1, R1, $V_{FBRO1}$ and $V_s$. However, if the light input to TL2 remains "on", then the one-shot will oscillate with the lengths of the "off" and "on" portions of the cycle, $\Delta t_1$ and $\Delta t_2$, determined by resistor R1, resistor R2, capacitor C1, $V_{FBRO1}$ and the input light intensity. Capacitor C2 and diode D1 are not necessary to the operation described above, but are included in FIG. 9 to show how electrical inputs, in the form of negative voltage switching pulses, can be used. A negative voltage pulse applied to the node between thyristor TL2 and diode D1 will cause thyristor TL1 to turn off for the time $\Delta t_1$. Diode D1 also increases the apparent forward breakover voltage $V_{FBRO2}$ of thyristor TL2.

FIGS. 11A to 11C show the optical signal timing diagram for the optical one-shot, which produces an inverted optical output pulse [depicted in FIG. 10]. An inverted optical pulse is a signal which is normally "on" (light is present) and is turned "off" (little or no light) during the duration of the pulse. The length of the inverted output pulse of thyristor TL1 is $\Delta t_1$ and is determined primarily by the time constant associated with capacitor C1, resistor R1, $V_s$ and $V_{FBRO1}$. If the length of the optical input signal to thyristor TL2 is shorter than $(\Delta t_1 + \Delta t_2)$, only a single inverted optical output pulse of length $\Delta t_1$ is created by thyristor TL1. If the length of this optical input signal exceeds $(\Delta t_1 + \Delta t_2)$, thyristor TL2 will turn "on" once again and the optical outputs of thyristor TL1 and thyristor TL2 will oscillate as long as this condition persists. $\Delta t_2$ is determined primarily by time constant associated with capacitor C1, resistor R2, $V_s$ and $V_{FBRO2}$.

Figure 11:
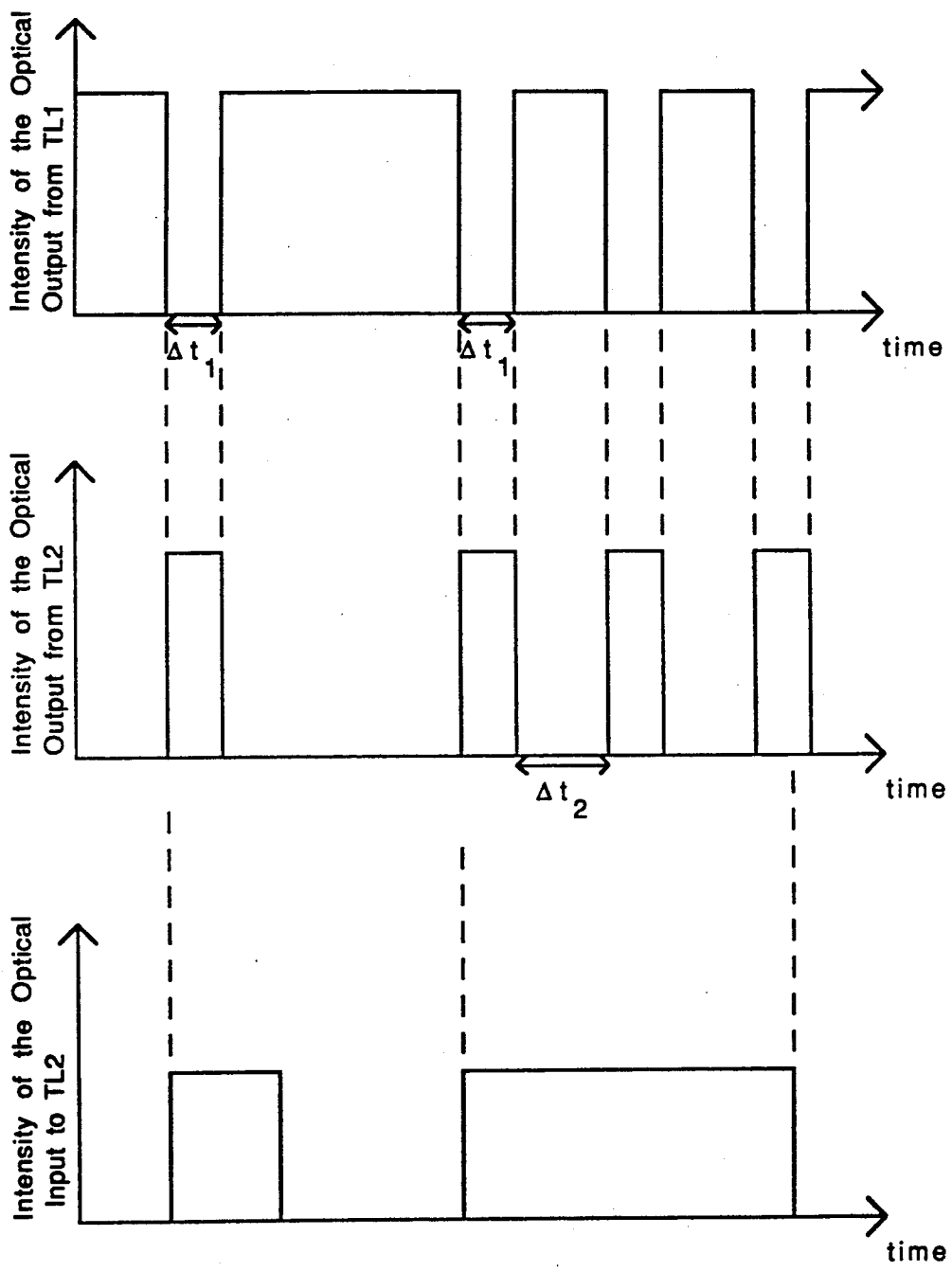
FIGS. 11A to 11C show the output timing diagram of the optical one-shot with inverted output, depicted in FIG. 10.

In the timing diagrams depicted in this document, such as FIG. 11, the dashed lines indicate the relative timing of the input and output pulses. The dashed lines also represent the temporal overlap or delay between the rising and falling edges of the input and output pulses. This temporal overlap or delay depends primarily on the rise and fall times of the optical pulses, as well as the parasitic reactances of the actual circuits.

Figure 12:
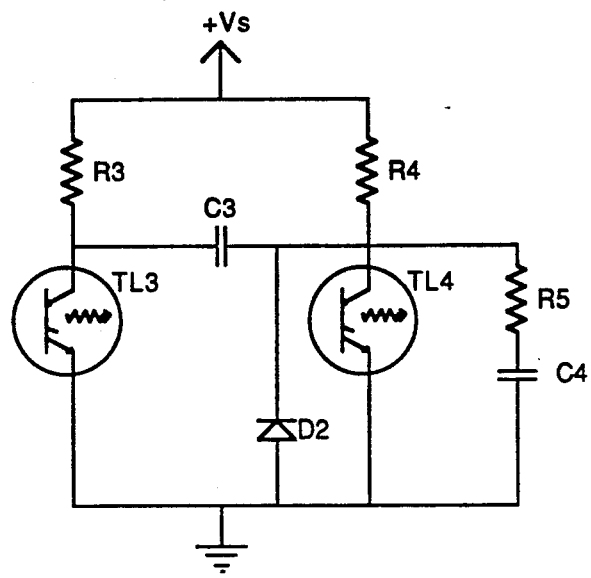
FIG. 12 shows another circuit diagram for an optical one-shot with inverted output.

FIG. 12 shows the circuit diagram of a preferred embodiment of an optical one-shot which produces an inverted optical output signal. In this embodiment $(V_s - V_{on4})/R4 < I_{h4} < (V_s - V_{on4})(1/R4 + 1/R5)$ and $V_{VBRO3} < V_s < V_{FBRO4}$, $(V_s - V_{on3})/R3 > I_{h3}$. The spectral and intensity sensitivity of thyristor TL4 is such that it can be can be switched "on" by the optical input pulses of energy $h\nu_{input2}$. When an input light pulse turns thyristor TL4 "on", capacitor C3 delivers a negative voltage pulse to thyristor TL3, turning thyristor TL3 "off". Thyristor TL3 turns "on" again after a delay $\Delta t_3$, independent of whether the optical input signal to thyristor TL4 is "on" or "off." This delay $\Delta t_3$ is determined primarily by resistor R3, capacitor C3, $V_s$ and $V_{FBRO3}$. Diode D2 acts as an electrical short for the negative voltage pulse delivered across capacitor C3 when thyristor TL3 turns "on" again. Capacitor C4 and resistor R5 keep thyristor TL4 turned "on" for a time $\Delta t_4$ determined primarily by capacitor C4, resistor R5, resistor R4, $V_s$ and $I_{h4}$. $\Delta t_4$ is designed to be longer than $\Delta t_3$, so that thyristor TL4 remains "on" during the output pulse of thyristor TL3, thereby ensuring a constant output pulse length, $\Delta t_3$. A resistor can be added between thyristor TL3 and ground to limit the current through thyristor TL3 when thyristor TL4 turns "off" again, but it is not necessary if the rest of the circuit is properly designed. Such a resistor between thyristor TL3 and ground must be less than $(V_s - V_{on3})/I_{h1} - R3$.

Figure 13:
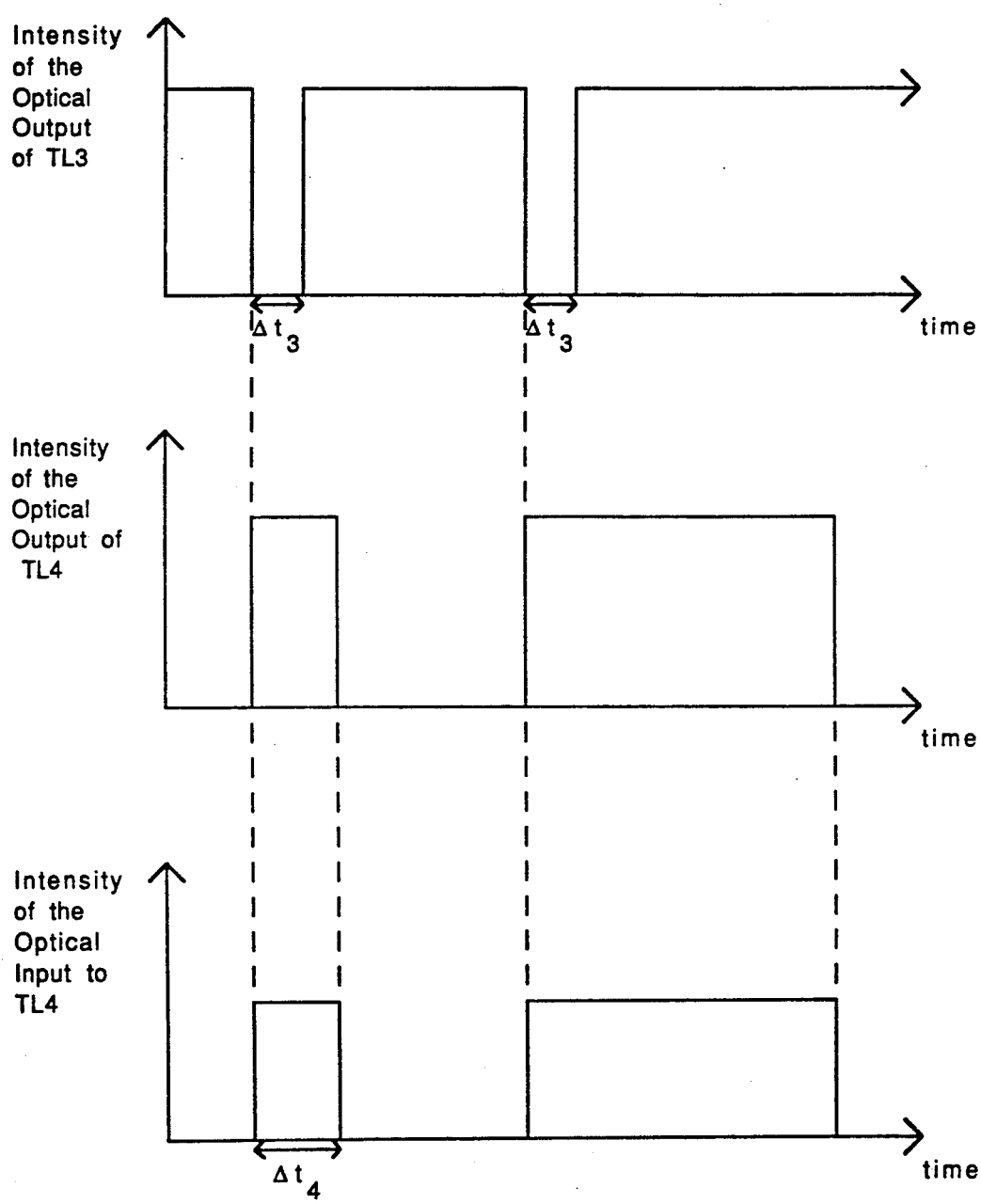
FIGS. 13A to 13C show the output timing diagram of the optical one-shot with inverted output, depicted in FIG. 12.

FIGS. 13A to 13C show the optical signal timing diagram for the optical one-shot depicted in FIG. 11, which produces an inverted optical output pulse. The length of the inverted output pulse of thyristor TL3 is $\Delta t_3$, the time constant associated with capacitor C3, resistor R3, $V_s$ and $V_{FBRO3}$. The length of the output pulse of thyristor TL4 is $\Delta t_4$, if the input light pulse length is shorter than $\Delta t_4$. If the input light pulse exceeds $\Delta t_4$, then the inverted optical output of thyristor TL1 is still $\Delta t_3$, but the optical output pulse length of thyristor TL4 is as long as the input pulse length. $\Delta t_4$ is determined primarily by the time constant associated with capacitor C4, resistor R4, resistor R5, $I_{h4}$ and $V_S$. The circuit depicted in FIG. 11 does not suffer from the same output oscillation property that characterizes the circuit depicted in FIG. 10.

Figure 14:
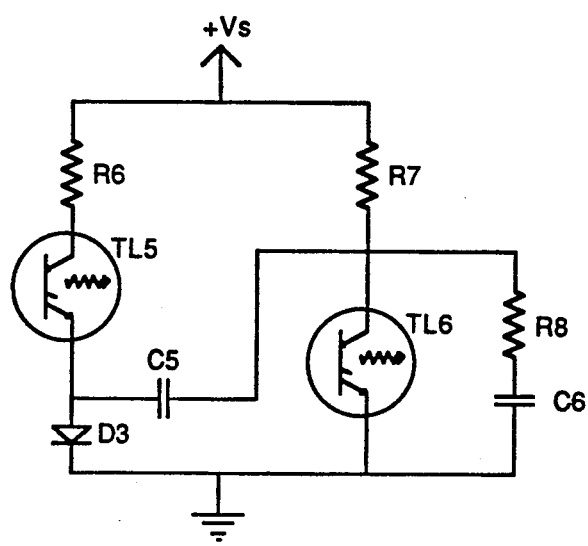
FIG. 14 shows the circuit diagram of an optical one-shot with non-inverted output.

FIG. 14 shows a circuit diagram for a preferred embodiment of an optical one-shot which produces a non-inverted output pulse. For this circuit, $Vs < V_{FBRO5}$ and $Vs < V_{FBRO6}$, but $2Vs - V_{on6} > V_{FBRO5}$. Additional requirements are; $(2Vs - V_{on5} - V_{on6})/R6 > I_{h5}$; $(Vs - V_{h5})/R6 < I_{h5}$; and $(Vs - V_{on6})/R7 + (Vs - V_{on6})/R8 > I_{h6} > (Vs - V_{h6})/R7$. The spectral and intensity sensitivity of thyristor TL6 is such that it can be switched "on" by optical input pulses of energy $h\nu_{input3}$. When thyristor TL6 is turned "on" by an input light pulse, the voltage across thyristor TL5 increases to nearly $2Vs - V_{on6}$, since the voltage across capacitor C5 can not change instantaneously. Diode D3 provides a high impedance to the negative voltage pulses and a low impedance to positive voltages. Diode D3 is required to increase the voltage across thyristor TL5 to $\sim 2Vs - V_{on6}$. Thyristor TL5 switches "off" when the voltage across resistor R6 and thyristor TL5 drops below the value required to supply $I_{h5}$. Hence, resistor R6, capacitor C5, Vs and $I_{h5}$ determine the non-inverted output pulse length, $\Delta t_5$. Once thyristor TL6 is turned "on", it remains "on" for a period of time $\Delta t_6$ determined primarily by resistor R7, resistor R8, capacitor C6, Vs and $I_{h6}$. $\Delta t_6$ is designed to be as long as, or slightly longer than the output pulse length, $\Delta t_5$. If the length of the input pulse exceeds $\Delta t_6$, it will not re-trigger thyristor TL5, because capacitor C5 will not deliver a second negative voltage pulse until thyristor TL6 has turned "off" and capacitor C5 is recharged. Thus, capacitor C6 and resistor R8 make the output pulse length independent of the input pulse length for cases when the input pulse length is shorter than $\Delta t_5$. If resistor R8 and capacitor C6 are omitted from this circuit, then the output pulse length will be the same as the input pulse length, unless the input is longer than $\Delta t_5$ in which case the output pulse is only $\Delta t_5$ long.

This circuit may also be constructed with resistor R7 and thyristor TL6 switching places and capacitor C5 connecting to the opposite side of thyristor TL5. Resistor R8 and capacitor C6 are moved so that they are still connected in parallel with thyristor TL6. In fact, diode D3 is unnecessary in this modified circuit. This modified circuit is essentially the same circuit, since it involves a mirror symmetry operation in which thyristor TL6 is used to produce a positive voltage pulse of $\sim Vs - V_{on6}$ instead of a negative going voltage pulse of $\sim V_{on6} - Vs$ volts. This type of symmetry exists for most of the circuits described in this document.

Figure 15:
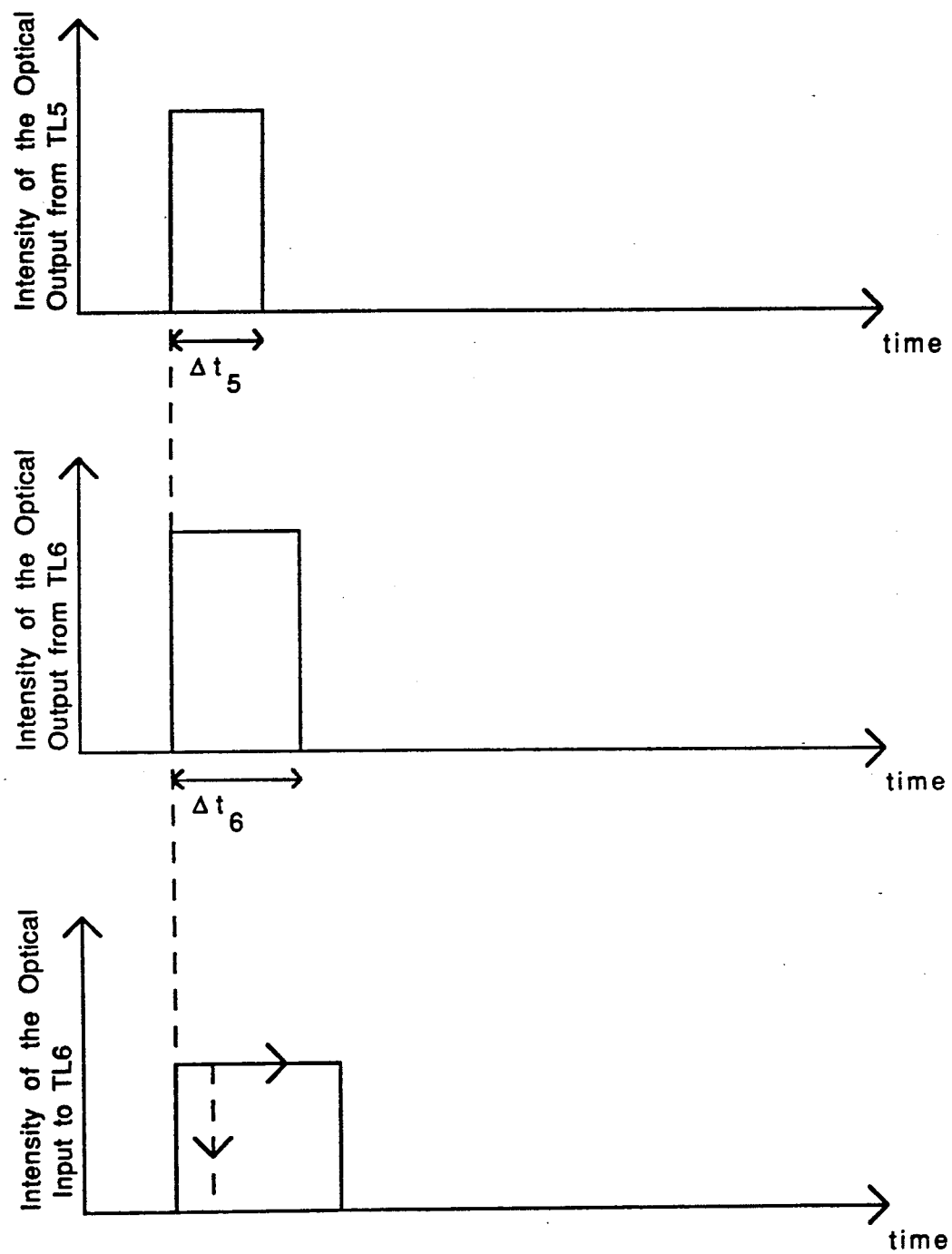
FIGS. 15A to 15C show the output timing diagram of the optical one-shots with non-inverted output, depicted in FIG. 14.

FIGS. 15A to 15C show the optical signal timing diagram of the circuit depicted in FIG. 14. The length of the inverted output pulse of thyristor TL5 is $\Delta t_5$. $\Delta t_5$ is determined primarily by the time constant associated with capacitor C5, resistor R6, $V_s$ and $I_{h5}$. The length of the output pulse of thyristor TL6 is $\Delta t_6$, if the input light pulse length is shorter than $\Delta t_6$. If the input light pulse exceeds $\Delta t_6$, then the optical output pulse length of thyristor TL5 is still $\Delta t_5$, but the optical output pulse length of thyristor TL6 is as long as the input pulse length. $\Delta t_6$ is the time constant determined primarily by capacitor C6, resistor R7, resistor R8, $I_{h6}$ and $V_s$.

Figure 16:
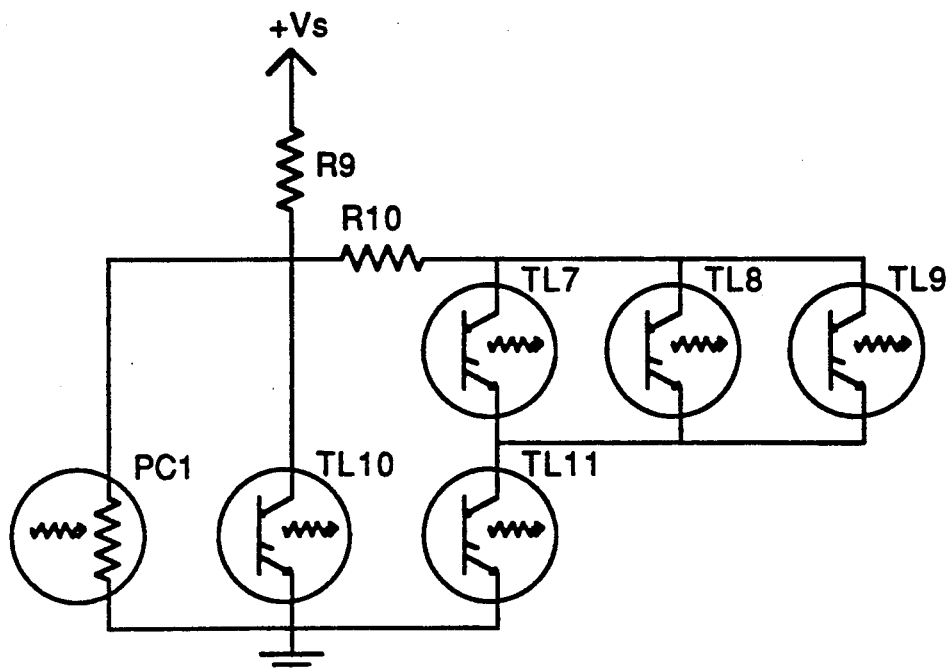
FIG. 16 shows a circuit diagram for an integrating optical latch with three parallel inputs, an optical strobe, an optical reset and an electronic reset.

FIG. 16 shows the circuit diagram of an embodiment of an integrating optical latch with three parallel inputs, an optical strobe and an optical reset. The requirements for this circuit are: $(Vs - V_{on7} - V_{on11})/[3(R9 + R10) -$ $] > I_{h7}$, $(V_s - V_{on8} - V_{on11})/[3(R9+R10)] > I_{h8}$, $(V_s - V_{on9} - V_{on11})/[3(R9+R10)] > I_{h9}$; $V_s < V_{FBRO7}$, $V_s < V_{FBRO8}$, $V_s < V_{FBRO9}$. In addition; $(V_s - V_{h10})/R9 < I_{h10}$; $(V_s - V_{on7} - V_{on11})/[3(R9+R10)] > I_{h11}$, $(V_s - V_{on8} - V_{on11})/[3(R9+R10)] > I_{h11}$, $(V_s - V_{on9} - V_{on11})/[3(R9+R10)] > I_{h11}$; $V_s < V_{FBRO10}$; and $V_s < V_{FBRO11}$. When an optical input signal turns thyristor TL10 "on", then the voltage across thyristors TL7, TL8 and TL9 drops to $V_{on10}$ and thyristors TL7, TR8, TL9 are turned "off", since not enough current will be supplied through resistor R10 to supply the necessary holding currents to thyristors TL11, TL7, TL8 and TL9. The optical reset input signal must last long enough for complete reverse blocking recovery of thyristors TL11 and TL7, TL8 and TL9. When the optical reset input to thyristor TL10 turns off, thyristor TL10 also turns "off", since the holding current $I_{h10}$ is not exceeded. If the optical reset signal is "off", thyristor TL11 is "off" and there is no optical strobe input signal to thyristor TL11, then thyristors TL7, TL8 and TL9 will remain "off", regardless of the state of the optical inputs to them. If there is an optical input to thyristor TL11, then thyristors TL7, TL8, and TL9 will each turn "on" if their respective optical input signal is "on". Thyristor TL11 will remain "on", if any of the inputs to thyristors TL7, TL8, TL9 are "on" during the strobe pulse. Thus, thyristor TL11 provides a an additional function as an optical OR logic gate. However, if any of the optical inputs to thyristors TL7, TL8 or TL9 are "on" when the strobe pulse is "on", then subsequent changes in the optical inputs of thyristors TL7, TL8 and TL9 can turn "on" other devices (thyristors TL7, TL8 or TL9), which were not turned "on" during the strobe pulse. Additional optical signals can be latched by connecting additional thyristors in parallel with thyristor TL9.

The spectral and intensity sensitivities of thyristors TL7, TL8 and TL9 are such that they are switched "on" by the optical input pulses with energies of $hv_{input4}$, $hv_{input5}$ and $hv_{input6}$. The spectral and intensity sensitivity of thyristor TL11 is such that it is switched "on" by the optical input pulses of energy $hv_{input7}$. The spectral and intensity sensitivity of thyristor TL10 is such that thyristor TL10 is made to conduct by optical input pulses of energy $hv_{input8}$.

The inputs can be strobed electrically by pulsing the anode of the strobe thyristor TL11 with a voltage greater than its forward breakover voltage $V_{FBRO11}$. Thyristor TL10 may be replaced with a photoconductor or a phototransistor. Another way to reset this latch electrically is by pulsing the voltage across the thyristor TL11, with a zero or negative voltage pulse.

FIGS. 17A to 17H show the optical signal timing diagram for the three input integrating optical latch circuit described in FIG. 16. In this circuit, thyristors TL7, TL8 and TL9 do not turn "on" unless thyristor TL11 has an optical input, or unless thyristor TL11 is already in the "on" state. In addition, thyristors TL7, TL8 and TL9 will not turn "on" if there is an optical input to thyristor TL10. This timing diagram shows the use of an independent optical strobe input to thyristor TL11 and the data inputs only go to thyristors TL7, TL8 and TL9. This circuit can also be connected so that one or more of the data inputs, which go to thyristors TL7, TL8 and TL9, is also used as the strobe input to thyristor TL11.

Figure 18:
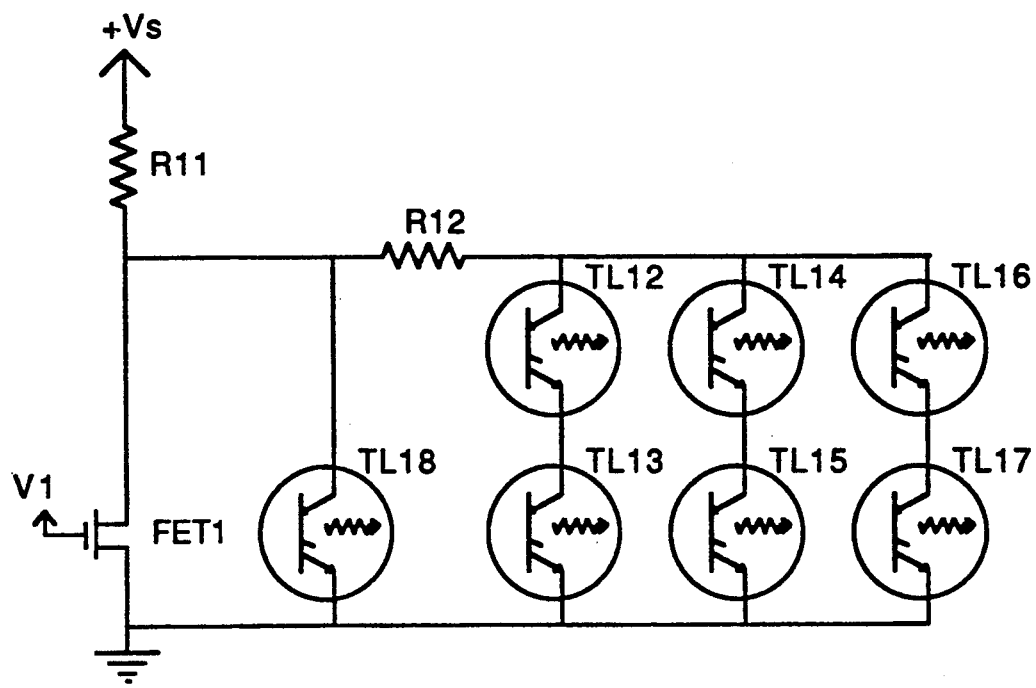
FIG. 18 shows a circuit diagram for an optical latch with three parallel inputs, an optical strobe, an optical reset and an electronic reset.
Figure 17:
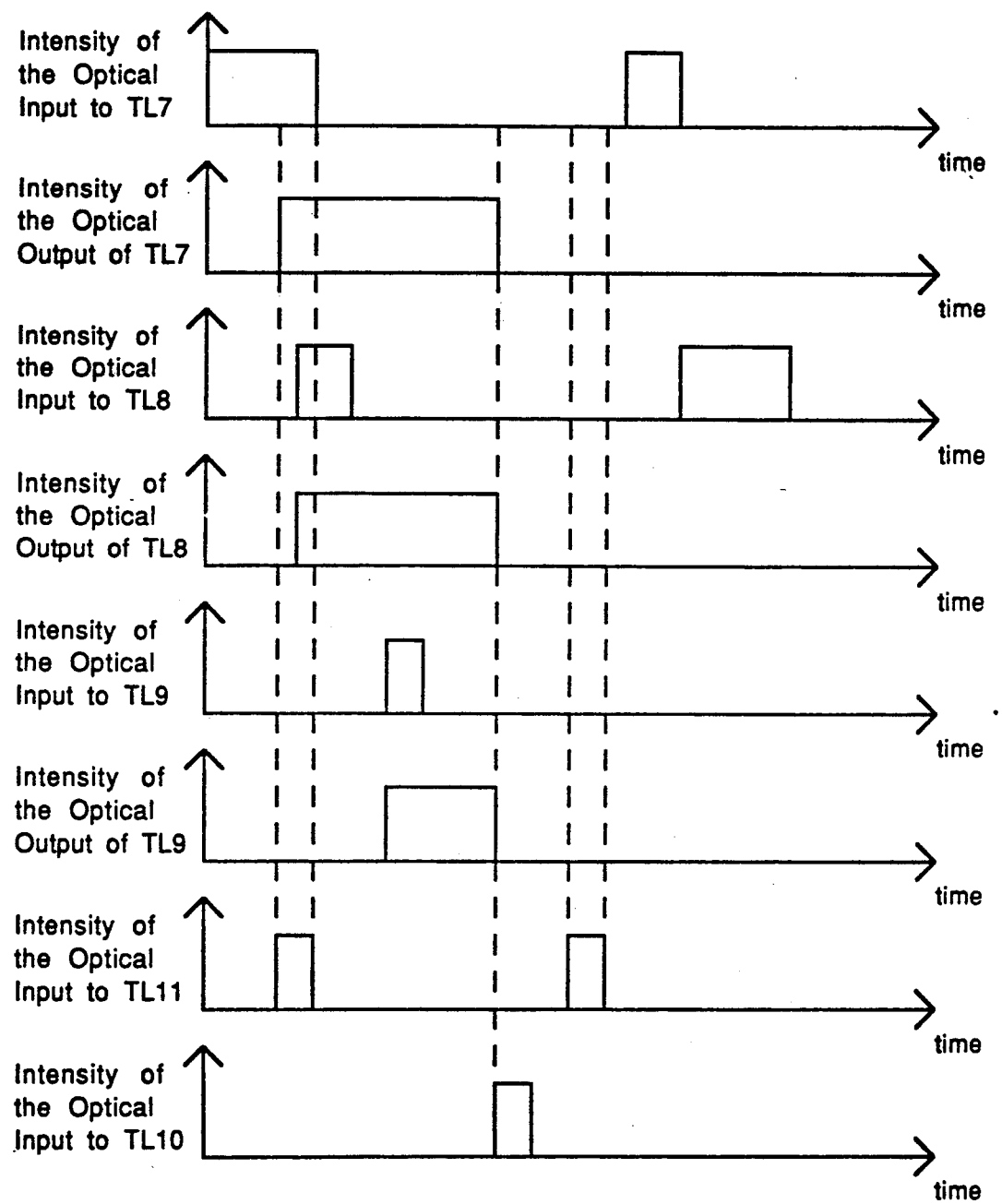
FIGS. 17A to 17H show the output timing diagram for the integrating optical latch depicted in FIG. 16.
Figure 19:
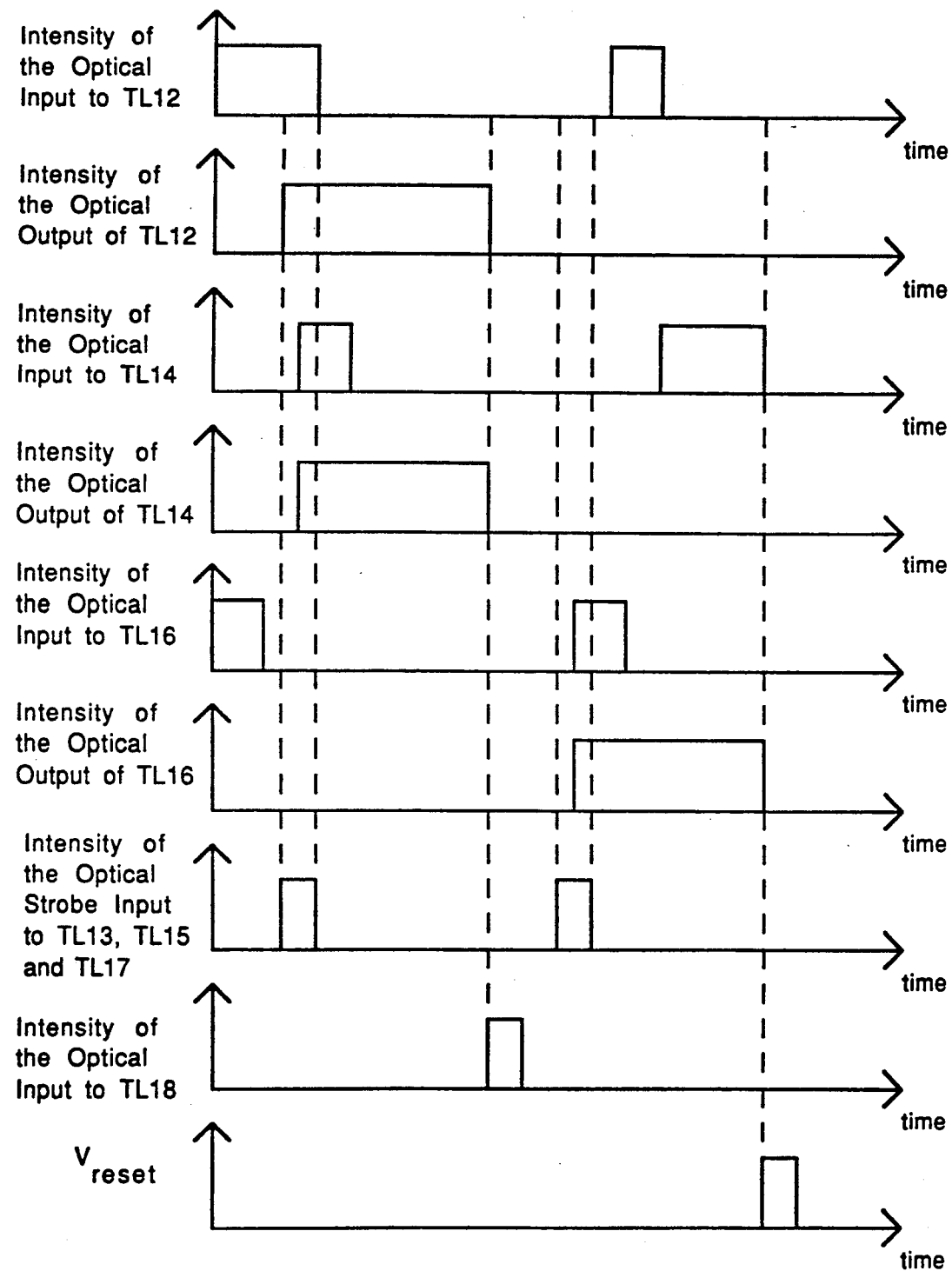
FIGS. 19A to 19I show the output timing diagram for the optical latch depicted in FIG. 18.

FIG. 18 shows a circuit for a preferred embodiment of an optical latch with three parallel optical inputs, an optical strobe input and an optical reset input. The requirements for this circuit are: $(V_s - V_{on12} - V_{on13})/[3(R11+R12)] > I_{h12}$, $(V_s - V_{on14} - V_{on15})/[3(R11+R12)] > I_{h14}$, $(V_s - V_{on16} - V_{on17})/[3(R11+R12)] > I_{h16}$; $V_s < V_{FBRO12}$, $V_s < V_{FBRO14}$, $V_s < V_{FBRO16}$. In addition; $(V_s - V_{h18})/R11 < I_{h18}$; $(V_s - V_{on12} - V_{on13})/[[3(R11+R12)] > I_{h13}$; $(V_s - V_{on15})/[3(R11+R12)] > I_{h15}$. $(V_s - V_{on16} - V_{on17})/[3(R11+R12)] > I_{h17}$; $V_s < V_{FBRO18}$; and $V_s < V_{FBRO13}$, $V_s < V_{FBRO15}$, $V_s < V_{FBRO17}$. This circuit is similar to that depicted in FIG. 15, except that this circuit uses separate strobe thyristors, TL13, TL15, and TL17 in series with each of the signal-latch thyristors, TL12, TL14 and TL16. These separate strobes may be strobed individually or simultaneously. The strobe thyristors can be much smaller in size than the signal-latch thyristors, since they do not need to produce light. Alternatively, the signal-latch input thyristors can be made small and the strobe input thyristors can be used to put out the optical signal and hence can also be used for optical frequency conversion. It is possible to strobe the inputs electrically by pulsing the anode of the strobe thyristors, TL13, TL14 and TL15, with a voltage greater than their forward breakover voltages. Additional optical signals can be latched by connecting pairs of thyristors in parallel with thyristors TL16 and TL17.

The circuit in FIG. 18 is optically reset when an optical input turns thyristor TL18 "on", diverting current away from thyristors TL12, TL14, TL16 and TL13, TL15, TL17. Thyristor TL18 can be replaced with a photoconductor or phototransistor. This circuit can be reset electrically with the field effect transistor FET1. When transistor FET1 is in the nonconducting state, sufficient current is supplied to thyristors TL12, TL13, TL14, TL15, TL16 and TL17 to maintain them in the "on" state. However, when transistor FET1 is in the conducting state, the current is diverted from thyristors TL12, TL13, TL14, TL15, TL16 and TL17, causing thyristors TL12, TL13, TL14, TL15, TL16 and TL17 to switch to the "off" state. Other types of transistor can be used in place of the transistor FET1. Transistor FET1 is not essential to this circuit and is included in FIG. 18 to show one method of employing electrical reset pulses. This circuit can also be reset electrically by pulsing the voltage across the thyristor pairs, TL12-TL13, TL14-TL15, and TL16-TL17, with a zero or negative voltage pulse.

The spectral and intensity sensitivities of thyristors TL12, TL14, and TL16 are such that they are switched "on" by the optical input pulses with energies of $hv_{input9}$, $hv_{input10}$ and $hv_{input11}$. The spectral and intensity sensitivities of thyristors TL13, TL15 and TL17 are such that they are switched "on" by optical input pulses of energy $hv_{input12}$, $hv_{input13}$ and $hv_{input14}$. The fact that different input and output energies make this latch capable of acting simultaneously as an optical frequency converter. (Most of the circuits described in this document have the option of including the optical frequency conversion function.) The spectral and intensity sensitivity of thyristor TL18 is such that thyristor TL18 is made to conduct with optical input pulses of energy $hv_{input15}$.

The optical latches depicted in FIGS. 16 and 18 can be used to form three bit optical shift registers if the outputs from the first latch act as inputs for the second latch and the outputs of the second latch act as inputs for the first latch. The optical strobe of the first latch uses the same input signal as the optical reset of the second latch. The optical reset of the first latch uses the same optical input signal as the optical strobe of the second latch. A third optical latch may be used as the optical input buffer.

FIGS. 19A to 19I show the optical signal timing diagram for the three parallel input optical latch circuit described in FIG. 18 using the same optical strobe input signal for all three bits. In this circuit, the thyristor pairs TL12-TL13, TL14-TL15 and TL16-TL17 do not turn "on" unless both thyristors in the pair have an optical input signal and there is no optical input to thyristor TL18. An optical input signal to thyristor TL18 causes the thyristors TL12, TL13, TL14, TL15, TL16 and TL17 to switch "off".

FIG. 20 shows the circuit diagram for a preferred embodiment of an optical delay. The requirements for this circuit are: $V_{FBRO19} < V_s - V1$; $V_{FBRO20} > V_s$; $(V1 - V_{h20})/R14 = I_{h20}$; $(V_s - V_{on19} - V_{on20})/(R13 + R14) < I_{h20}$; and $(V_s - V2 - V_{h19})/R13 = I_{h19}$. When thyristor TL20 is turned "on" with an input light pulse, capacitor C7 discharges through resistor R14 and thyristor TL20 until the voltage across capacitor C7 is V1 or until the input light pulse ends, whichever is longer. When the voltage across the output device thyristor TL19 exceeds $V_{FBRO19}$, then thyristor TL19 turns "on" and remains "on" until the voltage across capacitor C7 is V2, where V2>V1. If the input light pulse remains "on" after the voltage across capacitor C7 is V1, then the length of the output pulses from thyristors TL19 and TL20 will be longer.

Figure 21:
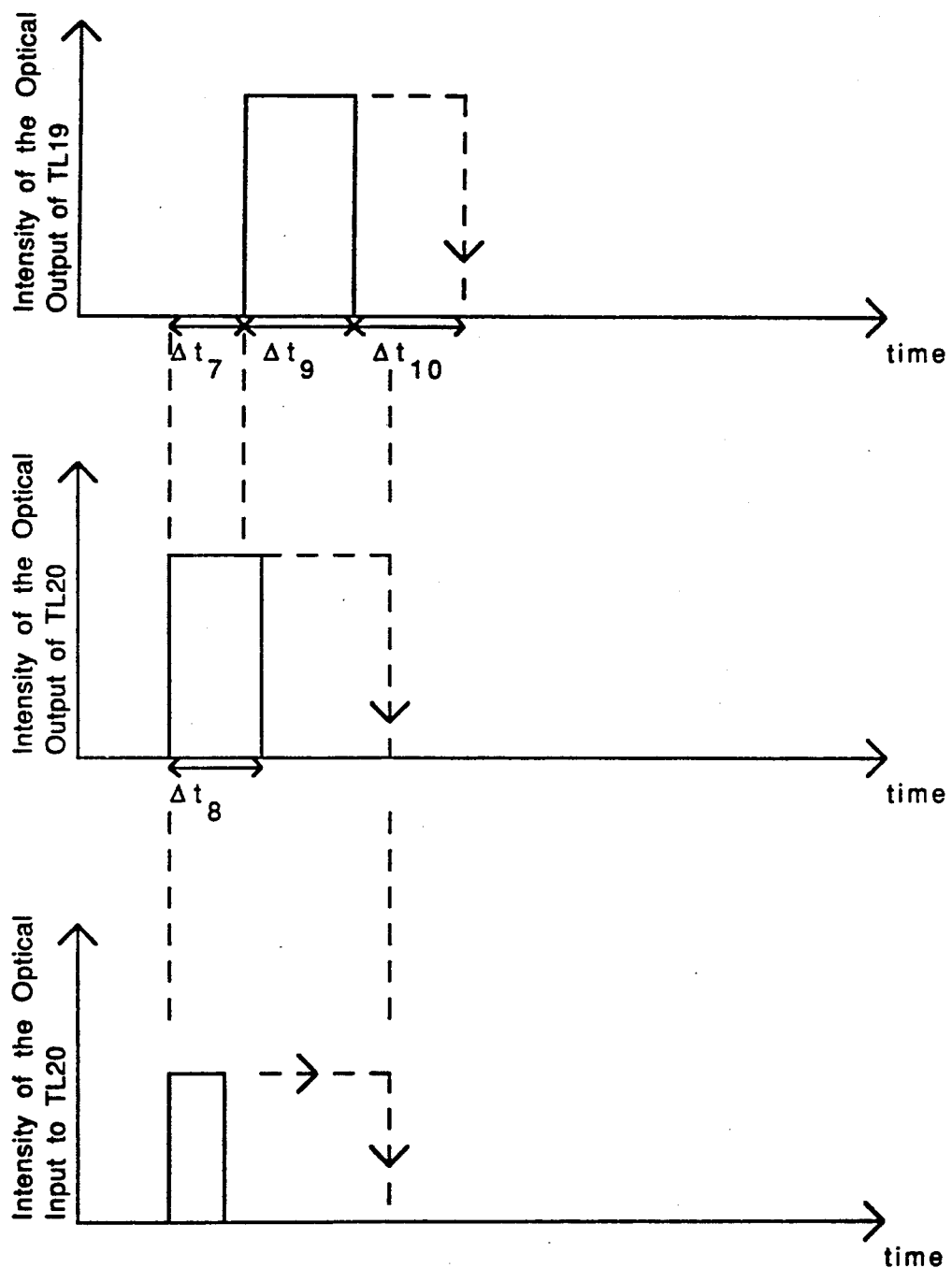
FIGS. 21A to 21C show an optical signal timing diagram for the optical delay depicted in FIG. 20.

FIGS. 21A to 21C show the optical signal timing diagram for the optical delay circuit depicted in FIG. 20. The length of the optical delay is $\Delta t_7$, the length of the output pulse of thyristor TL20 is $\Delta t_8$ and the length of the output pulse of thyristor TL19 is $\Delta t_9$. If the input light pulse length exceeds $\Delta t_8$, thyristor TL20 continues to generate light as long as the input light pulse remains "on". Similarly, if the input light pulse length exceeds $\Delta t_7$, then thyristor TL20 continues to generate light for an additional period of time $\Delta t_{10}$, and the output pulse length will be given by $(\Delta t_9 + \Delta t_{10})$. The characteristic times $\Delta t_7$, $\Delta t_8$ and $\Delta t_9$ are determined primarily by Vs, resistor R13, resistor R14, $V_{FBRO19}$ and the "off" currents of thyristors TL19 and TL20. If the length of the input pulse exceeds $\Delta t_8$, the characteristic time $\Delta t_{10}$ will be nonzero and will depend on the input pulse length.

FIG. 22 shows the circuit diagram of a preferred embodiment of a simple optical set-reset (SR) flip flop. The electrical requirements of this circuit are: $V_s < V_{FBRO21}$; $(V_s - V_{on21})/R15 > I_{21}$; $V_s < V_{FBRO22}$; and $(V_s - V_{on22})/R16 > I_{h22}$. The R15C8 and R16C8 time constants must be long enough to allow thyristors TL21 and TL22 to achieve complete forward blocking recovery. The optical input to thyristor TL21 is the "S" or set input and the optical output from thyristor TL21 is the "Q" output. Similarly, the optical input to thyristor TL22 is the "R" or reset input and the optical output from thyristor TL22 is the "$\bar{Q}$" output. The optical S and R inputs must have the proper spectral range and intensity to switch "on" thyristors TL21 and TL22, respectively. If the flip flop latches, then it will have to be initialized electronically with appropriate electronic pulses or by reducing Vs briefly to turn TL21 and TL22 "off".

FIG. 23 shows another circuit for another embodiment of an optical SR flip flop. The requirements of this circuit are: $V_s < V_{FBRO23}$; $(V_s - V_{on23} - V_{d4})/R17 > I_{h23}$; $V_s < V_{FBRO24}$; $(V_s - V_{on24} - V_{d4})/R18 > I_{h24}$; $V_s < V_{FBRO25}$; $(V_s - V_{h25})/R19 < I_{h25}$; $V_s < V_{FBRO26}$; and $(V_s - V_{h26})/R20 < I_{h26}$. The time required for charging capacitors C10 and C11 should be significantly shorter than the time required for charging capacitor C9, but longer than the turn-on times of thyristors TL23 and TL24. The optical set and reset inputs are delivered to thyristors TL25 and TL26, respectively. The optical set and reset inputs must have the proper spectral range and intensity to cause thyristors TL25 and TL26 to conduct and deliver negative voltage pulses across capacitors C10 and C11. Thyristor TL23 produces the Q optical output signal and thyristor TL24 produces the $\bar{Q}$ optical output signal.

When thyristor TL25 or thyristor TL26 is turned "on", then a negative voltage pulse is delivered to diode D4 or diode D5, turning "on" thyristor TL23 or thyristor TL24, respectively. When both the set and reset inputs are "1", the output does not latch with both Q=1 and $\bar{Q}$=1. In the event that S=R=1 occurs, there will be no change in the output state, since the voltage across capacitor C9 has not changed too much by the time the electrical input pulses delivered by capacitors C10 and C11 end. The state table of this optical flip flop is the same as that for the conventional electronic set reset flip flop.

Figure 24:
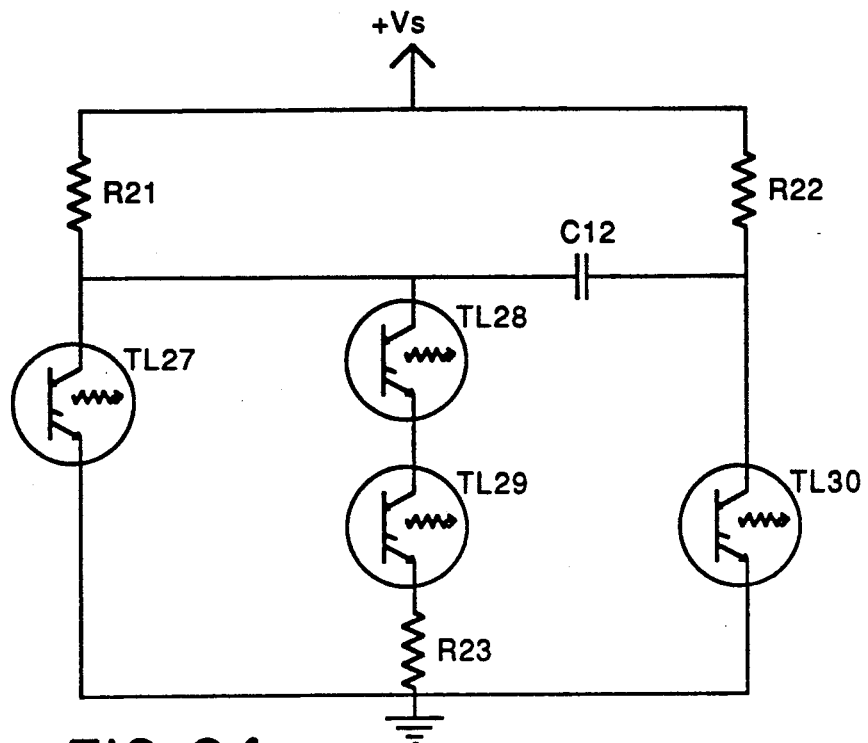
FIG. 24 shows a circuit diagram for an optical D (delay) flip flop.

FIG. 24 shows the circuit diagram of a preferred embodiment of an optical D (delay) flip flop. The circuit requirements are: $V_{FBRO27} < V_{FBRO28} < V_{FBRO28} + V_{FBRO29} < V_s$; $V_s < V_{FBRO30}$; $(V_s - V_{on28} - V_{on29})/(R21 + R23) > I_{h28}$, $(V_s - V_{on28} - V_{on29})/(R21 + R23) > I_{h29}$; $(V_s - V_{h30})/R22 < I_{h30}$; and $(V_{on27} - V_{h28} - V_{h29})/R23 < I_{h28}$ or $(V_{on27} - V_{h28} - V_{h29})/R23 < I_{h29}$. A resistor can be placed in parallel with thyristor TL30 to keep the voltage across thyristor TL30 from exceeding $V_{FBRO30}$, or the apparent forward breakover voltage of thyristor TL30 can be increased by placing diodes in series with thyristor TL30. Thyristors TL29 and TL30 share the same optical input signal, which has the proper spectral range and intensity to switch them both "on". This optical input signal is the "clock" signal, which clocks the new data into thyristor TL28 and the inverse of the new input data into thyristor TL27. Thyristor TL27 produces the inverted, $\bar{Q}$, output and thyristor TL28 produces the non-inverted, Q, output. Thyristors TL29 and TL30 do not need to be large, because they only need to conduct currents less than Vs/(R21+R23) and Vs/R22, respectively, and do not need to produce light.

When the clock signal enters, capacitor C12 delivers a negative voltage pulse which turns thyristors TL27, TL28 and TL29 "off". Then, before the clock signal ends, the R21C12 time constant is satisfied and either thyristor TL27 or the combination of thyristors TL28 and TL29 turn "on". If there is no optical input to thyristor TL28, then the voltage builds up across both thyristors TL27 and TL28. Since thyristor TL27 has a smaller forward breakover voltage than thyristor TL28, it will switch "on". Once thyristor TL27 is "on", thyristor TL28 remains "off". If there is an optical input to thyristor TL28, thyristor TL28 turns "on" as soon as the voltage across it increases and thyristor TL27 remains "off" because $V_{FBRO27}$ is not exceeded. After the clock input to thyristor TL29 returns to zero, inputs to thyristor TL28 do not affect the output state. Resistor R23 insures that if an optical input pulse enters thyristor TL28 during the optical clock pulse, thyristor TL28 remains "off". It does this by insuring that the amount of current flowing through thyristors TL28 and TL29 is less than $I_{h28}$ (or $I_{h29}$) if thyristors TL27, TL28 and TL29 are all "on" simultaneously. The state table of this optical D flip flop is the same as that of the conventional electronic D flip flop.

Figure 25:
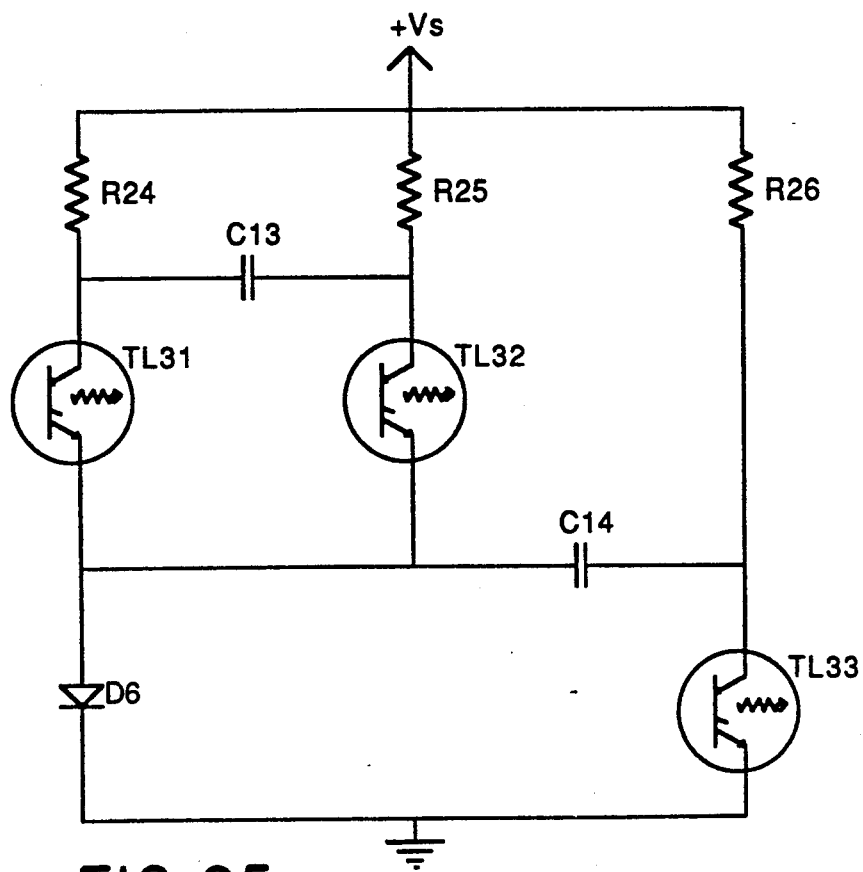
FIG. 25 shows a circuit diagram for an optical T (trigger) flip flop.

FIG. 25 shows the circuit diagram for a preferred embodiment of an optical T or trigger flip flop. The requirements for this circuit are: $Vs < V_{FBRO31}$; $Vs < V_{FBRO32}$; $Vs < V_{FBRO33}$; $(Vs - V_{on31} - V_{d6})/R24 > I_{h31}$; $(Vs - V_{on31} - V_{d6})/R25 > I_{h32}$; and $(Vs - V_{h33})/R26 < I_{h33}$. The operation of this flip flop is similar to that of the optical SR flip flop described above, except that diode D6, capacitor C14, resistor R26 and thyristor TL33 have been added to allow the introduction of negative trigger pulses across the diode D6. Diode D6 provides a low impedance for normal positive voltage and current flow and a high impedance to the negative voltage trigger pulses. When a pulse of light turns thyristor TL33 "on", then a negative voltage pulse across diode D6 is caused by capacitor C14. Capacitor C14 is chosen so that its charging time constant through resistors R26, R24 and R25 is longer than the turn-on times of thyristors TL31 and TL32. The time constants across capacitor C13 are larger than that across capacitor C14, so that thyristors TL31 and TL32 both change state in the same way that the optical SR flip flop does. The symmetry of this circuit allows the use of the optical output of thyristor TL24 as either the Q or $\overline{Q}$ output. The output of thyristor TL25 is the Boolian inverse of the optical output of thyristor TL24. The state table for the optical trigger flip flop is the same as that of electronic trigger flip flops.

Figure 26:
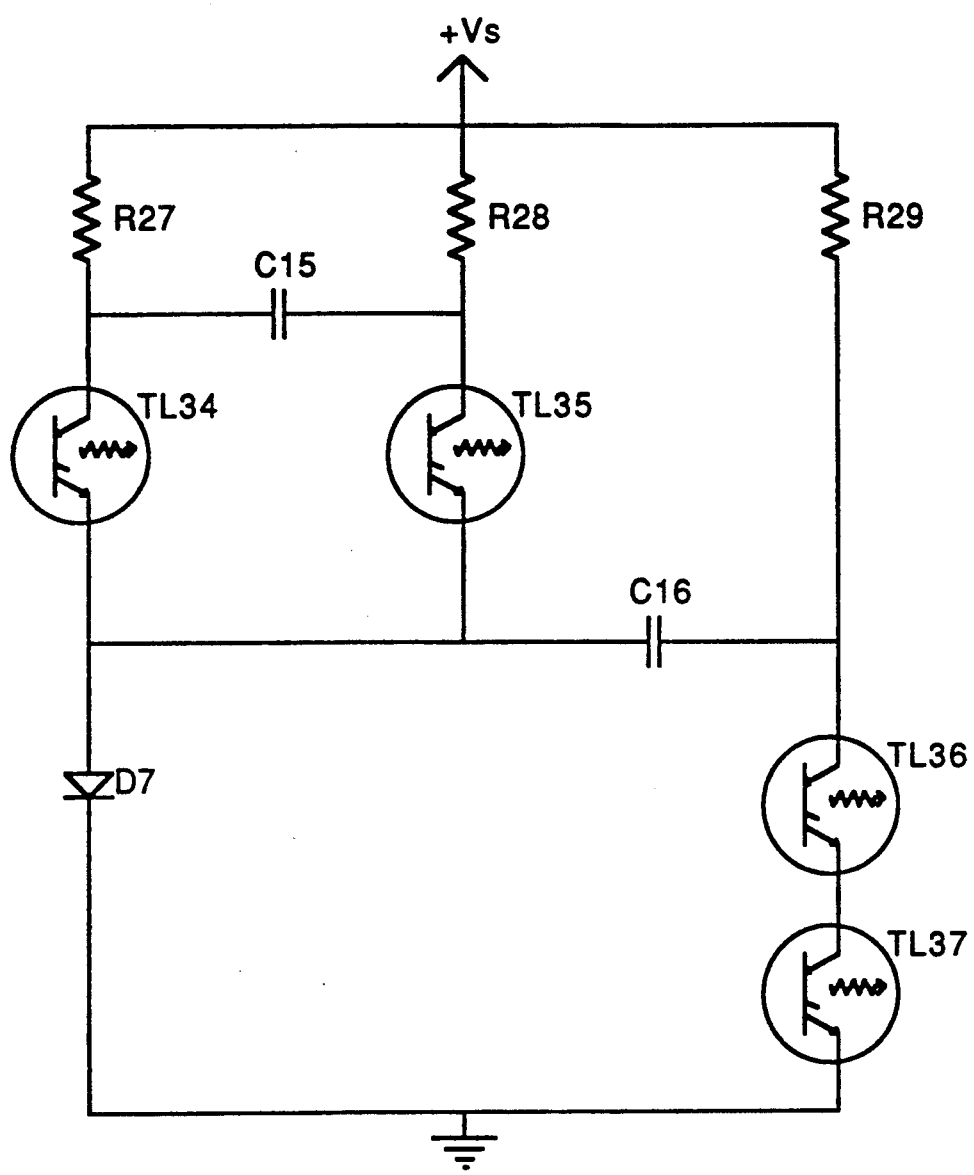
FIG. 26 shows a circuit diagram for an optical clocked trigger flip flop.

FIG. 26 shows the circuit diagram for a preferred embodiment of a clocked optical trigger flip flop. This circuit is the same as that of the optical trigger flip flop depicted in FIG. 25, except that another thyristor is placed in series with thyristor TL33. This circuit has the same electrical requirements as the circuit in FIG. 29, except that $Vs < V_{FBRO37}$; $(Vs - V_{h36} - V_{h37})/R29 < I_{h36}$ and/or $(Vs - V_{h36} - V_{h37})/R29 < I_{h37}$. The operation of this clocked optical trigger flip flops is the same as that of the optical trigger flip flops depicted in FIG. 25 with the exception that simultaneous optical inputs to thyristors TL36 and TL37 are required to cause the flip flop to change state or trigger. Thus, the series combination of thyristors TL36 and TL37 serves as an optical AND logic gate for the clock and trigger input signals. The state table of the clocked optical trigger flip flop is the same as that of the electronic clocked trigger flip flop.

Figure 27:
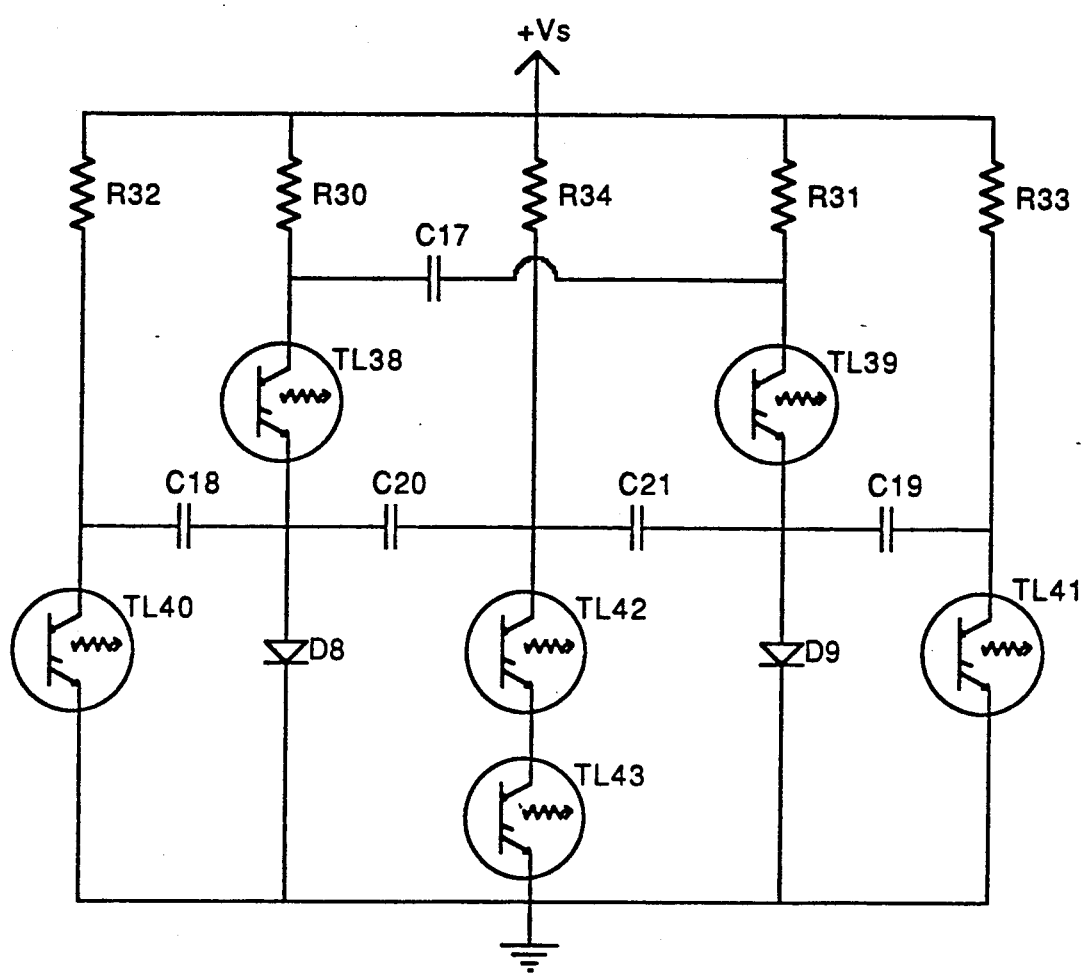
FIG. 27 shows the circuit diagram of an optical J-K flip flop.

FIG. 27 shows the circuit diagram for a preferred embodiment of an optical J-K flip flop. The requirements for this circuit are: $Vs < V_{FBRO38}$; $Vs < V_{FBRO39}$; $Vs < V_{FBRO40}$; $Vs < V_{FBRO41}$; $Vs < V_{FBRO42}$; $Vs < V_{FBRO43}$; $(Vs - V_{d8} - V_{on38})/R30 > I_{h38}$; $(Vs - V_{d9} - V_{on39})/R31 > I_{h39}$; $(Vs - V_{h40})/R32 < I_{h40}$; $(Vs - V_{h41})/R33 < I_{h41}$; $(Vs - V_{h42} - V_{on43})/R34 < I_{h42}$; and $(Vs - V_{h43} - V_{on42})/R34 < I_{h43}$. The J-K flip flop is a combination of the optical SR flip flop and the optical T flip flop. Thyristors TL40 and TL42 share the same optical input, which is the J input. Similarly, thyristors TL41 and TL43 share the same optical input, which is the K input. The Q output is produced by thyristor TL39 and the $\overline{Q}$ output is produced by thyristor TL40.

The symmetry of this circuit is such that the J and K inputs can be switched as long as the Q and $\overline{Q}$ outputs are also switched. The state table of the optical J-K flip flop is the same as that of an electronic J-K flip flop.

Figure 28:
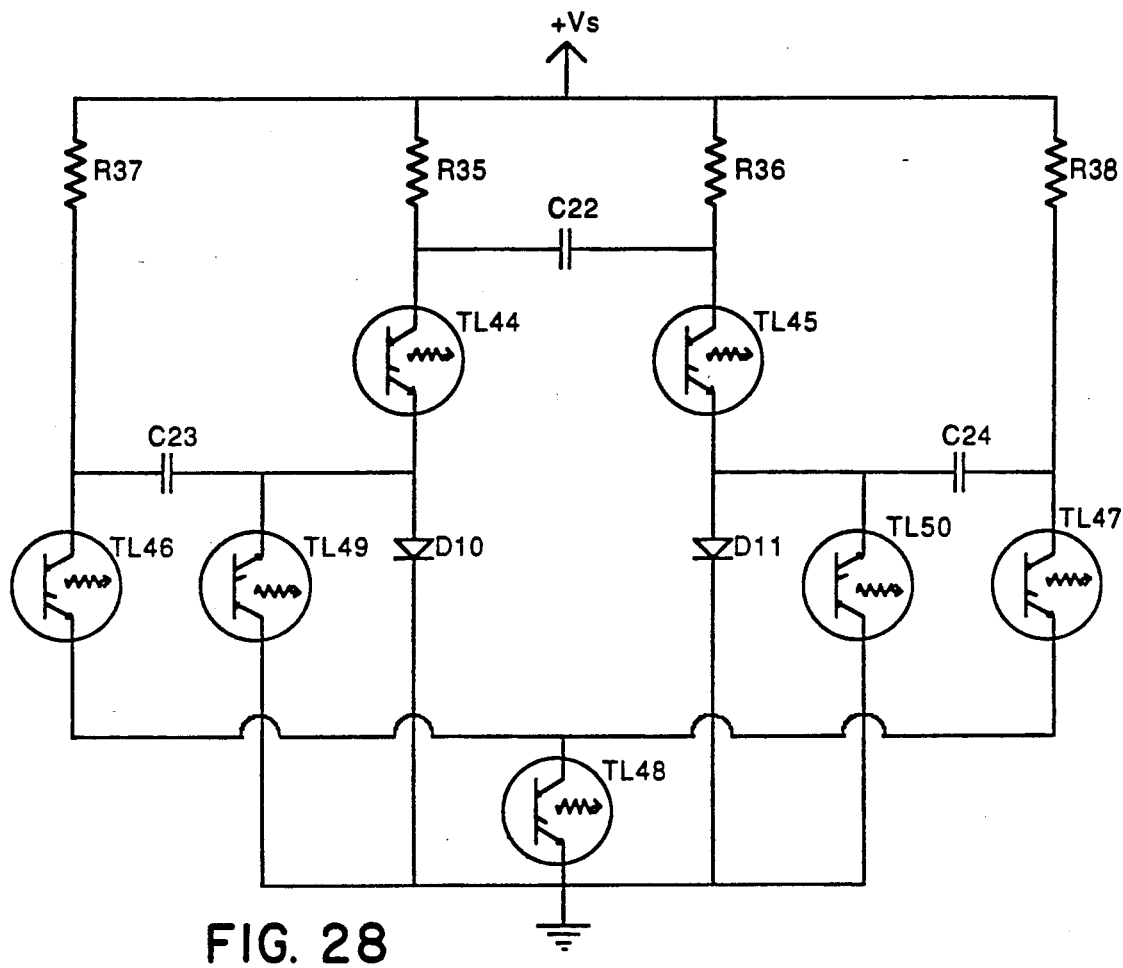
FIG. 28 shows the circuit diagram of a clocked optical J-K flip flop, including optical "set" and "reset" functions with static override.

FIG. 28 shows the circuit diagram of a preferred embodiment of a clocked optical J-K flip flop. The requirements of this circuit are: $Vs < V_{FBRO44}$; $Vs < V_{FBRO45}$; $Vs < V_{FBRO46}$; $Vs < V_{FBRO47}$; $Vs < V_{FBRO48}$; $Vs < V_{FBRO49}$; $Vs < V_{FBRO50}$; $V_{RBR49} > Vs - V_{on46}$; $V_{RBR50} > Vs - V_{on47}$; $(Vs - V_{d10} - V_{on44})/R35 > I_{h44}$; $(Vs - V_{on45})/R36 > I_{h45}$; $(Vs - V_{h46} - V_{on48})/R37 < I_{h46}$; $(Vs - V_{h47} - V_{on48})/R38 < I_{h47}$; $((Vs - V_{on37} - V_{h48})/R35 + (Vs - V_{on47} - V_{h48})/R38) < I_{h48}$. In this circuit, thyristors TL44, TL49 and TL50 all share the optical "S" or set signal input signal. Similarly, thyristors TL45, TL49 and TL50 all share the optical "R" or reset input signal. Thyristors TL49 and TL50 are normally reverse biased and conduct current only when there is an optical input to them and a negative voltage pulse delivered across capacitor C23 by thyristor TL46 or across capacitor C24 by thyristor TL47, respectively. Thus, thyristors TL49 and TL50 form low impedance shunts across diodes D10 and D11 when either the optical set or reset signals are "on", resulting in a static override of the J and K input signals. The optical set input goes to thyristors TL44 and TL50. The optical reset input goes to thyristors T145 and TL49.

A set input turns thyristor TL44 "on" and a negative voltage pulse is delivered across capacitor C22 to switch thyristor TL45 "off". If thyristor TL44 is already "on", when the set input signal arrives, then no change in the output states of thyristors TL44 and TL45 is necessary and no change occurs. A reset input turns thyristor TL45 "on" and a negative voltage pulse is delivered across capacitor C22 to switch thyristor TL44 "off". If thyristor TL45 is already "on", when the reset input signal arrives, then no change in the output states of thyristors TL44 and TL45 is necessary and no change occurs. The optical J and K input signals go to thyristors TL46 and TL47, respectively. The clock input signal goes to thyristor TL48 and acts as a logical AND gate with the optical J and K inputs. If $J=0$ and $K=0$ when the clock input enters thyristor TL48, there is no change in the output state. If $J=1$ and $K=0$ when the clock input enters thyristor TL48, then thyristor TL44 is switched "on" by the negative voltage pulse across diode D10 and thyristor TL45 is turned "off" by capacitor C22, resulting in $Q=1$ and $\overline{Q}=0$. If $J=0$ and $K=1$ when the clock input enters thyristor TL48, then thyristor TL45 is switched "on" by the negative voltage pulse across diode D11 and thyristor TL44 is turned "off" by capacitor C22, resulting in $Q=0$ and $\overline{Q}=1$. If both J and K are "1" when thyristor TL48 is clocked, then the output complements (goes from $Q=0$ to $Q=1$ or from $Q=1$ to $Q=0$). If either the set or reset optical input signals are "1", the J and K inputs will have no effect. The state table of the clocked optical J-K flip flop is the same as that of an electronic clocked J-K flip flop.

Many of the optical logic gates described in this document rely on circuit branches which either supply (or divert) electrical current to (or away from) the device which produces the optical output signal. These circuit branches do not carry enough current to latch themselves in the forward current conducting state. It is to be understood that the thyristors in these branches can be replaced with photoconductors or phototransistors.

It is to be further understood that more than one of these circuit branches can be connected in parallel to increase the current through the output device. It is also to be understood that additional thyristors can be connected in series and parallel combinations with the thyristors in these circuit branches to implement other Boolian logic functions. The optical output device can be either a light-emitting thyristor, a light emitting diode or a laser diode. It is not necessary that the optical output thyristor switch from the "off" state to the "on" state, only that it modulate the output light from a value below that needed to switch the next logic gate to the value above that which is needed to switch the next logic gate.

Figure 29:
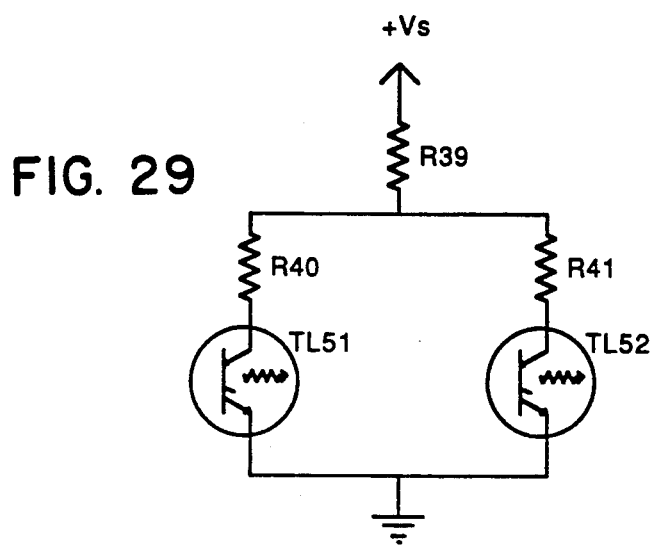
FIG. 29 shows the circuit diagram of an optical logic gate which performs the Boolian inversion function and the Boolian NOR function.
Figure 30:
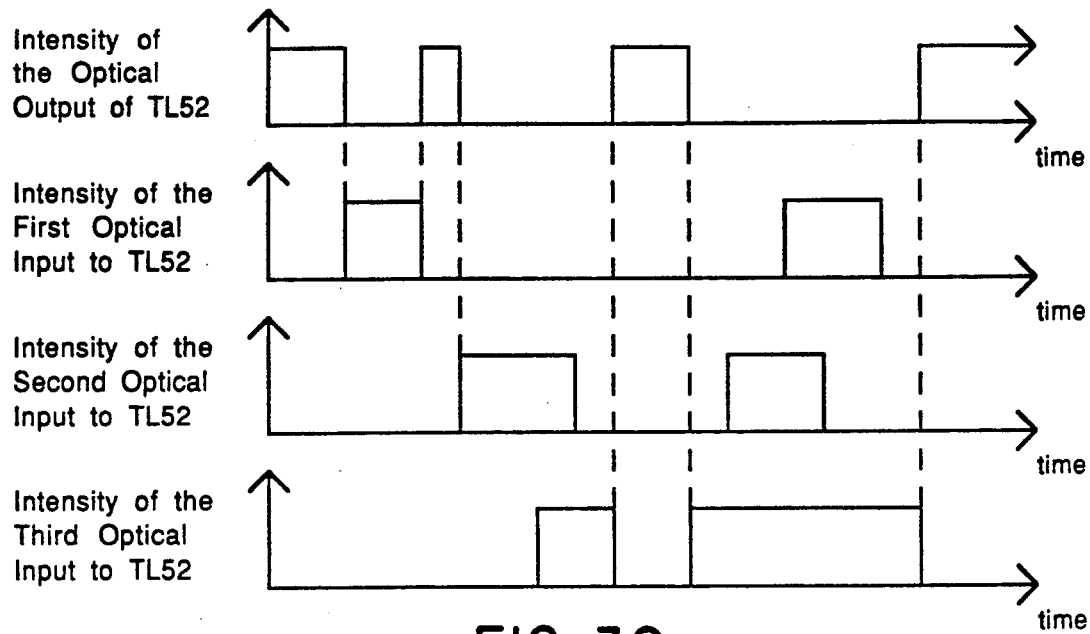
FIGS. 30A to 30D show the optical signal timing diagram of the optical inverter/NOR gate depicted in FIG. 29.

FIG. 29 shows a circuit diagram for a preferred embodiment of an optical logic gate which may be used as an optical inverter or as an optical NOR gate. The electrical requirements of this circuit are: $V_{FBRO51} < V_s$; $V_{FBRO52} > V_s$; $(V_s - V_{on51})/(R39 + R40) > I_{h51}$; $(V_s - V_{h51} + (V_{on52} - V_{h51})R39/R41)/(R39 + R40 + R39R40/R41) < I_{h51}$; $(V_s - V_{h52})/(R39 + R41) < I_{h52}$. The optical input signal or signals go to thyristor TL52 and the optical output signal is produced by thyristor TL51. If there is no optical input to thyristor TL52, then thyristor TL52 remains in the "off" or nonconducting state. When thyristor TL52 is "off", thyristor TL51 will be "on" since Vs is larger than the forward breakover voltage of thyristor TL51 and since no current is diverted away from thyristor TL51 by thyristor TL52. The current through thyristor TL51 is sufficient to keep it in the "on" state. However, when an optical input switches thyristor TL52 to the forward conducting state, current will be diverted away from thyristor TL51, causing thyristor TL51 to switch to the "off" state due to insufficient current flow. When the optical input to thyristor TL52 ends, thyristor TL52 will switch "off" due to insufficient current and thyristor TL51 will switch "on" when the voltage across it exceeds its forward breakover voltage, $V_{FBRO51}$. Thus, this circuit acts as a digital, optical signal inverter if one optical input to thyristor TL52 is used. However, this circuit also acts as a digital, optical NOR gate if multiple optical inputs to thyristor TL52 are used.

FIGS. 30A to 30D show an optical signal timing diagram for the optical inverter/NOR gate depicted in FIG. 29. In this timing diagram, three optical input signals to thyristor TL52 are used. If any of the optical inputs are "on", then the optical output signal is "off". If all of the optical inputs are "off", then the optical output signal is "on".

Figure 31:
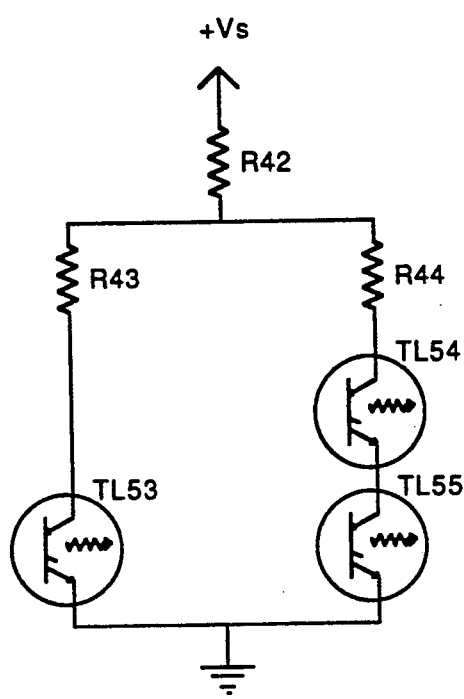
FIG. 31 shows the circuit diagram of an optical logic gate which performs the Boolian NAND function.

FIG. 31 shows the circuit diagram for a preferred embodiment of an optical NAND gate with two optical inputs. The electrical requirements of this circuit are: $V_{FBRO53} < V_s$; $V_{FBRO54} > V_s$; $V_{FBRO55} > V_s$; $(V_s - V_{on53})/(R42 + R43) > I_{h53}$; $(V_s - V_{h53} + (V_{on54} + V_{on55} - V_{h53})R42/R43)/(R42 + R43 + R42R43/R44) < I_{h53}$; $(V_s - V_{h54} - V_{on55})/(R42 + R44) < I_{h54}$; $(V_s - V_{h55} - V_{on54})/(R42 + R44) < I_{h55}$. The optical input signals go to thyristors TL54 and TL55. The optical output signal is produced by thyristor TL53. When there is no optical input to both thyristors TL54 and TL55, thyristors TL54 and TL55 remain "off". When the series combination of thyristors TL54 and TL55 is "off", thyristor TL53 will be "on" since Vs is larger than the forward breakover voltage of thyristor TL53. However, when optical input signals switch both thyristors TL54 and TL55 "on", current is diverted away from thyristor TL53, causing thyristor TL53 to switch "off" because of insufficient current flow. When the optical input to either thyristor TL54 or thyristor TL55 ends, then thyristors TL54 and TL55 switch "off" due to insufficient current and thyristor TL53 switches "on" when the voltage across it exceeds its forward breakover voltage, $V_{FBRO53}$. Thus, this circuit acts as an optical NAND gate. This circuit can be used for implementing a Boolian NAND operation on two sets of inputs, upon which a Boolian OR has been previously performed. This implementation occurs when multiple optical inputs to thyristors TL54 and TL55 are used.

Figure 32:
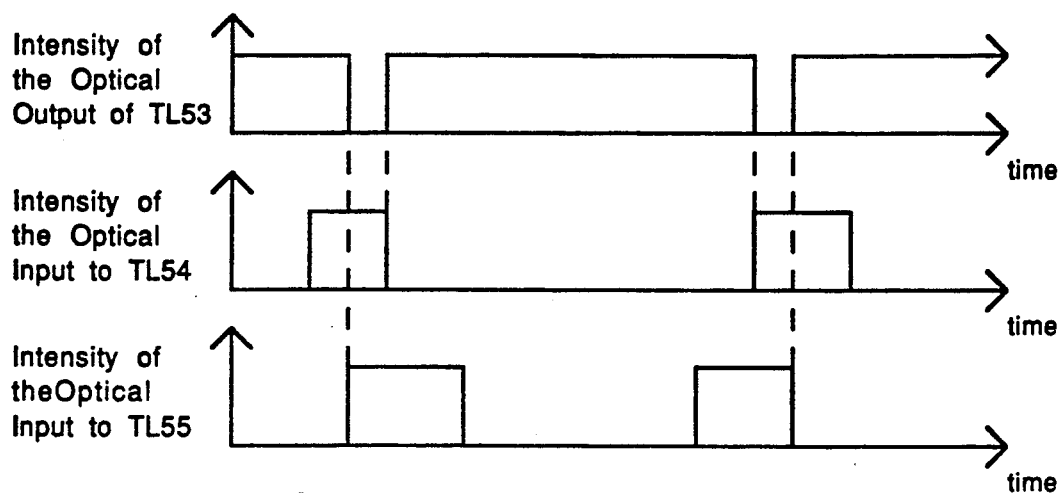
FIGS. 32A to 32C show the optical signal timing diagram of the optical NAND gate depicted in FIG. 31.

FIGS. 32A to 32C show an optical signal timing diagram for the optical NAND gate depicted in FIG. 31. If there are optical inputs to both thyristors TL54 and TL55, the optical output signal from thyristor TL53 is "off". If only one of the optical inputs is "on", then the optical output signal is "on". If both of the optical inputs are "off", then the optical output signal is "on".

Figure 33:
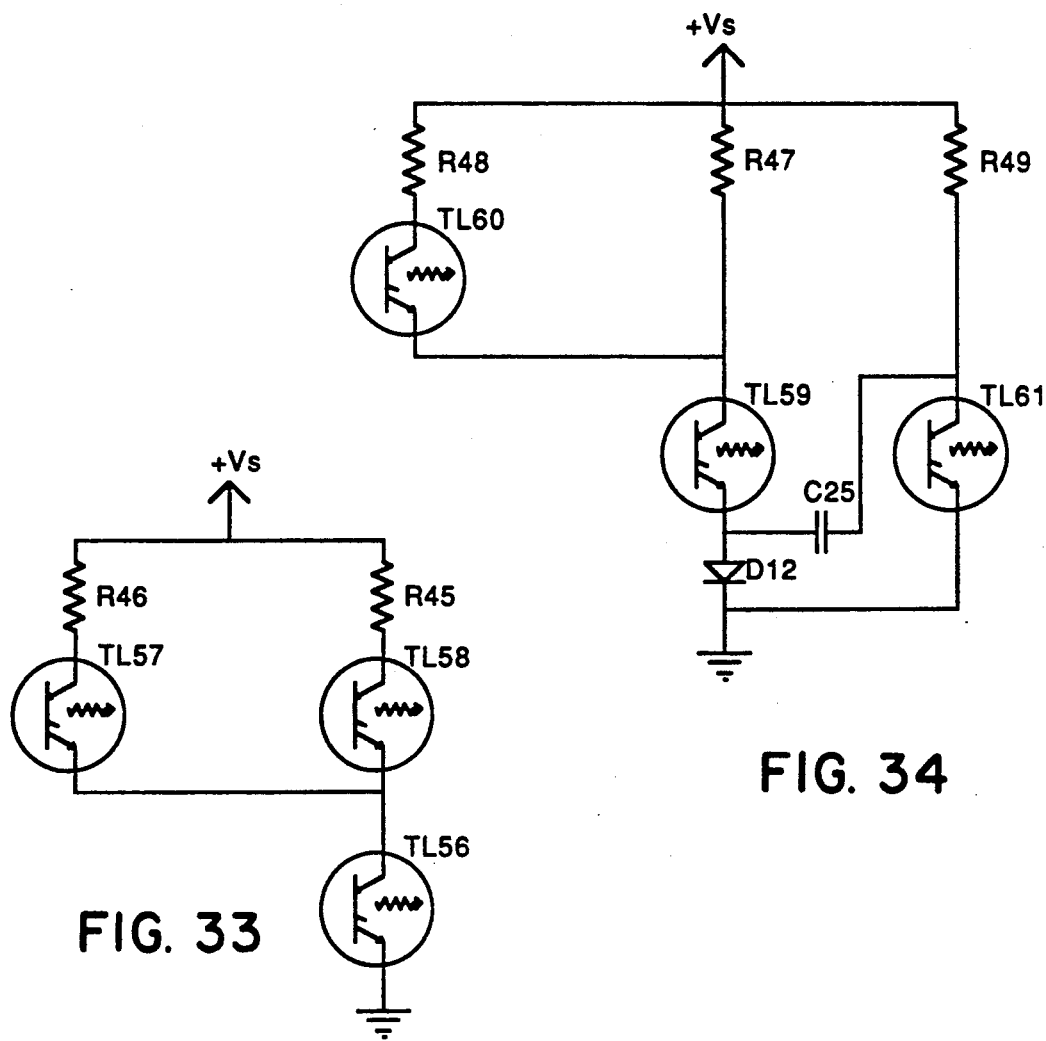
FIG. 33 shows the circuit diagram of an optical logic gate which performs the Boolian OR function.
Figure 35:
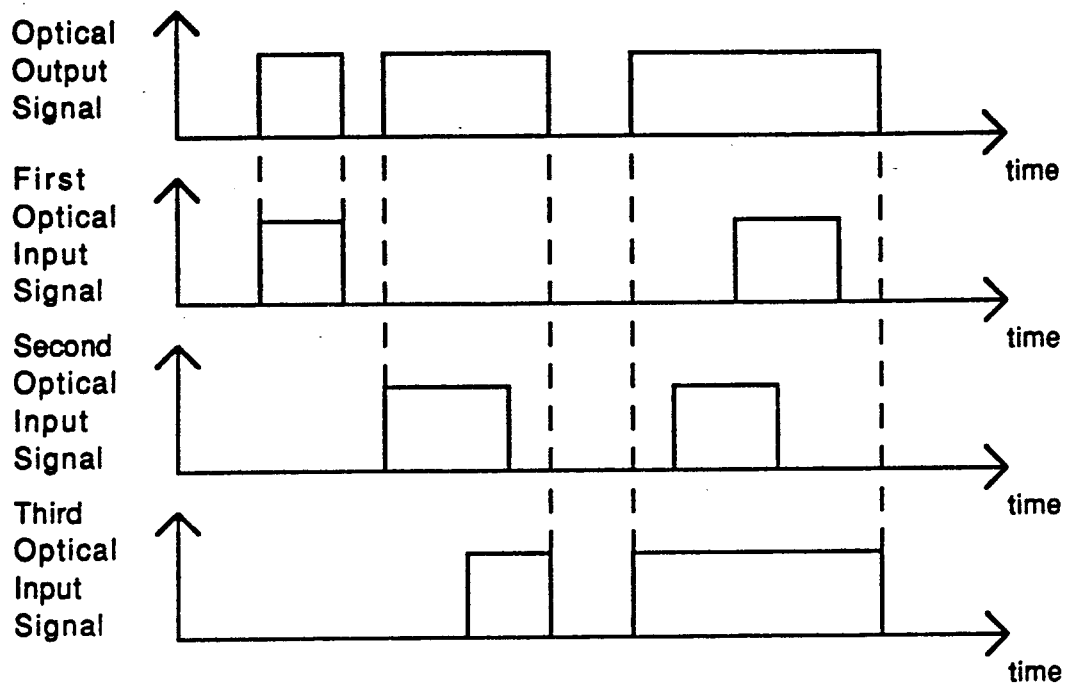
FIGS. 35A to 35D show the optical signal timing diagram of the optical OR gates depicted in FIGS. 33 and 34.

FIG. 33 shows a circuit diagram for a preferred embodiment of an optical OR gate. The electrical requirements of this circuit are: $V_{56} < V_s - V_{on57}$ or $V_{FBRO56} < V_s - V_{on57} > V_s$; $V_{FBRO58} > V_s$; $((V_s - V_{on58} - V_{on56})/R45 + (V_s - V_{on57} - V_{on56})/R46) > I_{h56}$; $(V_s - V_{h57} - V_{on56})/R46 < I_{h57}$ and $(V_s - V_{h58} - V_{on56})/R45 < I_{h58}$. Each optical input signal goes to both thyristors TL57 and TL58. In principle, the number of optical input signals is arbitrary. The optical output signal is produced by thyristor TL56. The circuit branch including thyristor TL57 and resistor R46 and the circuit branch including thyristor TL58 and resistor R45 serve to increase the current density through thyristor TL56, without latching the entire circuit in the forward conducting state. This circuit does not latch because there is not enough current going through either thyristor TL57 or thyristor TL58 to keep them turned "on" in the absence of an optical input signal. Thus, when thyristor TL57 turns "off", thyristor TL56 also turns "off" due to insufficient current. The circuit branch containing thyristor TL58 and resistor R45 can be omitted, as long as the holding current is exceeded in thyristor TL56 in the "on" state while the holding current of thyristor TL57 is not exceeded.

Figure 34:
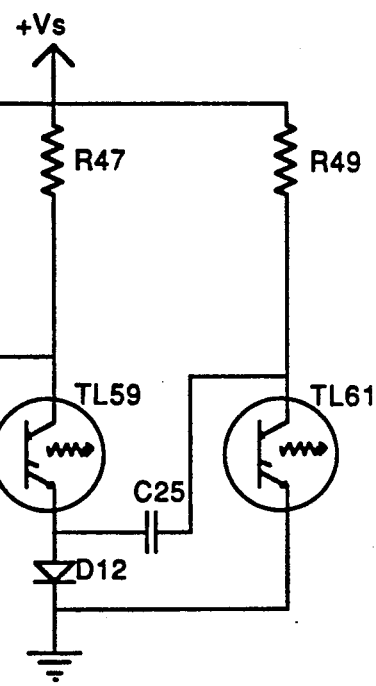
FIG. 34 shows the circuit diagram of another optical logic gate which performs the Boolian OR function.

FIG. 34 shows the circuit diagram for another embodiment of an optical OR gate. The electrical requirements of this circuit are: $2V_s - V_{on61} - V_{d12} > V_{FBRO60} > V_s$; $V_{FBRO61} > V_s$; $(V_s - V_{on59} - V_{d12})/R47 < I_{h59}$; $((V_s - V_{on59} - V_{d12})/R47 + (V_s - V_{on60} - V_{on59} - V_{d12})/R48) > I_{h59}$; $(V_s - V_{h60} - V_{on59} - V_{d12})/R48 < I_{h60}$ and $(V_s - V_{h61})/R49 < I_{h61}$. Each optical input signal goes to both thyristors TL60 and TL61. The number of optical input signals is arbitrary. The optical output signal is produced by thyristor TL59. An optical input signal which turns thyristor TL61 "on", also turns thyristor TL59 "on" since the negative voltage pulse generated across diode D12 through the capacitor C25 causes the forward breakover voltage of thyristor TL59 to be exceeded. The circuit branch including thyristor TL60 and resistor R48 serves to increase the current density through thyristor TL59, without latching the entire circuit in the forward conducting state. This circuit does not latch because there is not enough current passing through thyristor TL60 to keep it turned "on" in the absence of an optical input signal. When thyristor TL60 turns "off", thyristor TL59 also turns "off" due to insufficient current.

FIGS. 35A to 35D show the optical signal timing diagram for the optical OR gates depicted in FIGS. 33 and 34 using three optical input signals. If any or all of the optical inputs which go to both thyristors TL57 and TL58 (thyristors TL60 and TL62 in FIG. 34) are "on", then the optical output signal from thyristor TL56 (thyristor TL59 in FIG. 34) is "on". If none of the optical inputs are "on", then the optical output signal is "off". This device is capable of performing the OR logic function on an arbitrary number of optical input signals.

Figure 36:
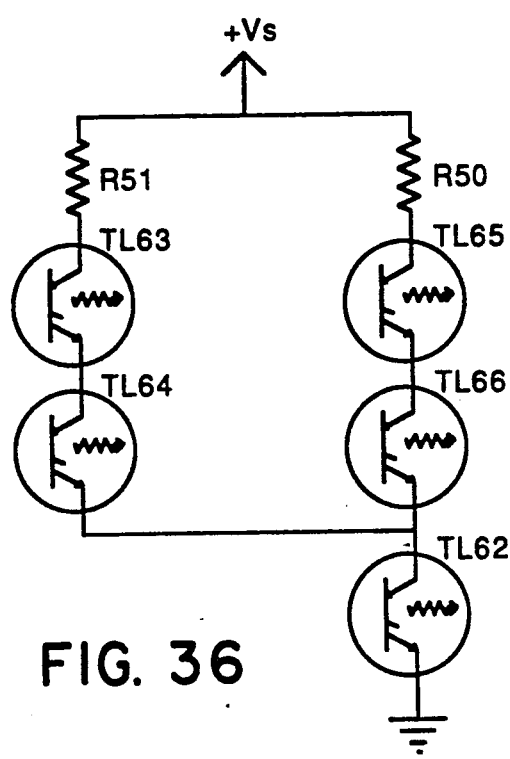
FIG. 36 shows the circuit diagram of an optical logic gate which performs the Boolian AND function.

FIG. 36 shows a circuit diagram for an optical AND gate with two optical inputs. The electrical requirements of this circuit are: $V_{FBRO62} < Vs - V_{on63} - V_{on64}$ or $V_{FBRO62} > Vs - V_{on65} - V_{on66}$; $V_{FBRO63} > Vs$; $V_{FBRO64} > Vs$; $V_{FBRO65} > Vs$; $V_{FBRO66} > Vs$; $((Vs - V_{on63} - V_{on64} - V_{on62})/R51 + (Vs - V_{on65} - V_{on66} - V_{on62})/R50) > I_{h62}$; $(Vs - V_{on62} - V_{h63} - V_{on64})/R51 < I_{h63}$; $(Vs - V_{on62} - V_{on63} - V_{h64})/R51 < I_{h64}$; $(Vs - V_{on62} - V_{h65} - V_{on66})/R50 < I_{h65}$ and $(Vs - V_{on62} - V_{on65} - V_{h66})/R50 < I_{h66}$. One of the optical input signals go to both thyristor TL63 and thyristor TL65 (or thyristor TL66), while the other optical input goes to both thyristor TL64 and thyristor TL66 (or thyristor TL65) In principle, any number of optical input signals can be used. The optical output signal is produced by thyristor TL62. The circuit branch including thyristor TL63, thyristor TL64 and resistor R51 and the circuit branch including thyristor TL65, thyristor TL66 and resistor R50 serve to increase the current density through thyristor TL62, without latching the entire circuit in the forward conducting state. This circuit does not latch because there is not enough current going through thyristor TL63, thyristor TL64, thyristor TL65 or thyristor TL66 to keep them turned "on" in the absence of an optical input signal and when one of these devices turns "off", thyristor TL62 also turns "off" due to insufficient current.

Figure 37:
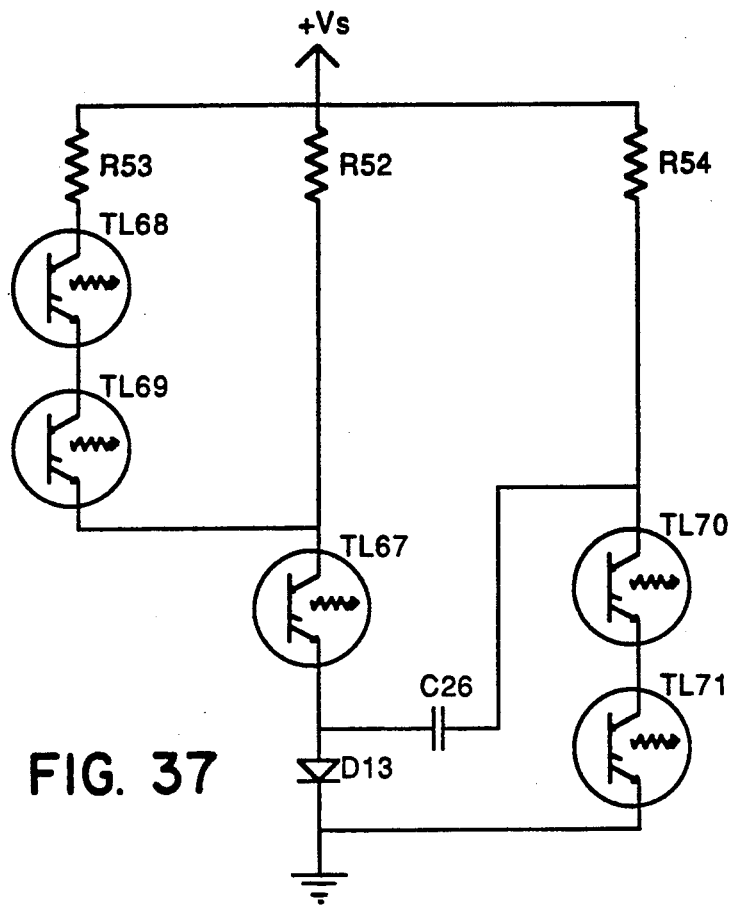
FIG. 37 shows the circuit diagram of another optical logic gate which performs the Boolian AND function.

FIG. 37 shows another circuit diagram for an optical AND gate with two optical inputs. The electrical requirements of this circuit are: $2Vs - V_{on70} - V_{on71} - V_{d13} > Vs$; $V_{FBRO68} > Vs$; $V_{FBRO69} > Vs$; $V_{FBRO70} > Vs$; $V_{FBRO71} > Vs$; $((Vs - V_{on67} - V_{d13})/R52 + (Vs - V_{on67} - V_{on68} - V_{on69} - V_{d13})/R53) > I_{h67}$; $(Vs - V_{h67} - V_{d13})/R52 < I_{h67}$; $(Vs - V_{on67} - V_{h68} - V_{on69} - V_{d13})/R53 < I_{h68}$; $(Vs - V_{on67} - V_{on68} - V_{h69} - V_{d13})/R53 < I_{h69}$; $(Vs - V_{h70} - V_{on71})/R54 < I_{h70}$ and $(Vs - V_{on70} - V_{h71})/R54 < I_{h71}$. One of the optical input signals go to both thyristor TL68 and thyristor TL70 (or thyristor TL71), while the other optical input goes to both thyristor TL69 and thyristor TL71 (or thyristor TL70). In principle, any number of optical input signals can be used. The optical output signal is produced by thyristor TL67. A combination of optical input signals which turn thyristors TL70 and TL71 "on" also turns thyristor TL67 "on", because of the negative voltage pulse generated across diode D13 through the capacitor C26. The circuit branch including thyristor TL68, thyristor TL69 and resistor R53 serves to increase the current density through thyristor TL67, without latching the entire circuit in the forward conducting state. This circuit does not latch since insufficient current passes through thyristors TL68 and TL69 to keep them turned "on" in the absence of optical input signals. Thus, when thyristor TL68 or thyristor TL69 turns "off", thyristor TL67 also turns "off" due to insufficient current.

Figure 38:
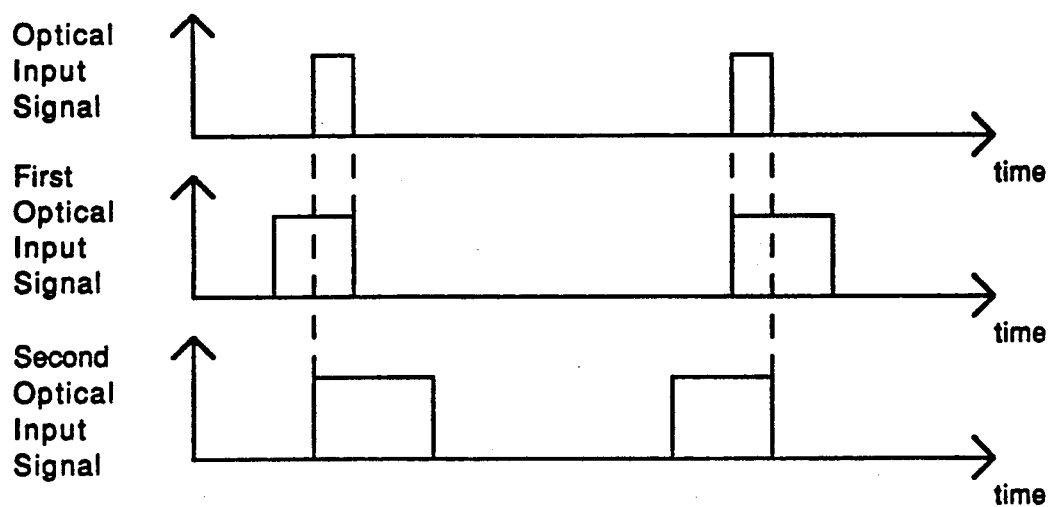
FIGS. 38A to 38C show the optical signal timing diagram of the optical AND gates depicted in FIGS. 36 and 37.

FIGS. 38A to 38C show an optical signal timing diagram for the optical AND gate depicted in FIGS. 36 and 37. If both of the optical inputs signals are present, then the optical output signal is "on". If one or both of the optical inputs is absent, then the optical output signal is "off". This device is capable of performing the OR logic function on an arbitrary number of optical input signals prior to preforming the optical AND logic function between the two sets of inputs, in which case each of the optical input signals depicted in this figure should be regarded as the result of a logical OR operation on the two sets of multiple input signals.

Figure 39:
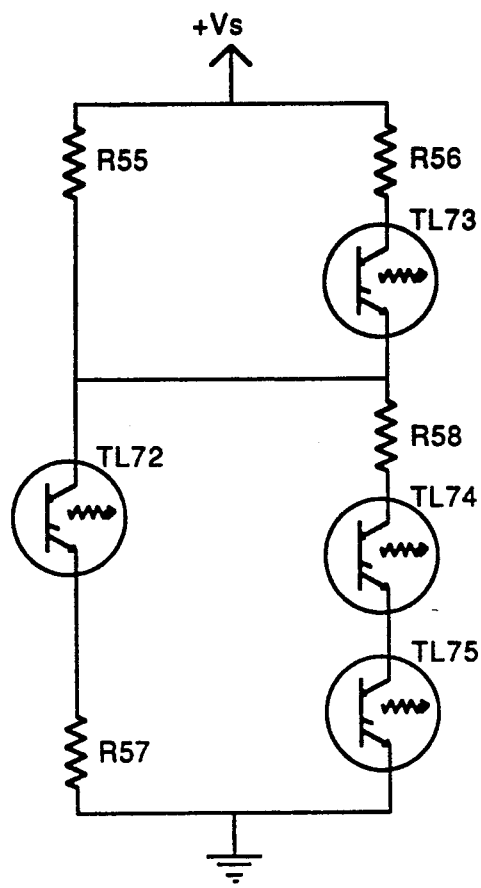
FIG. 39 shows the circuit diagram of an optical logic gate which performs the Boolian Exclusive-OR function.

FIG. 39 shows the circuit diagram for a preferred embodiment of an optical Exclusive-OR logic gate. The electrical requirements of this circuit are: $Vs < V_{FBRO72}$; $Vs < V_{FBRO73} Vs < V_{FBRO74} Vs < V_{FBRO75}$; $(Vs - V_{on72})/(R55 + R57) < I_{h72}$; $(Vs - V_{on72} - V_{on73} - V_{on73} R57/R55)/(R56 + R57 + R56 R57/R55) < I_{h73}$; $(Vs - V_{on73}(1R58/R55) - V_{h74} - V_{on75})(R55 + R56)/(R55 R56 R55 R58 + R56 R58) - + V_{on73}/R55 < I_{h74}$ and $(Vs - V_{on73}(1 + R58/R55) - V_{on74} - V_{h75})(R55 + R56)/(R55 R56 + R55 R58 + R56 R58) + V_{on73}/R55 < I_{h75}$. One optical input signal goes to thyristors TL72, TL73 and TL74. The other optical input signal goes to thyristors TL72, TL73 and TL75. The optical output signal is generated by thyristor TL72. The occurrence of either optical input signal turns thyristor TL72 "on". The series combination of thyristor TL73 and resistor R56 serves to increase the current through thyristor TL72 above the threshold current level of thyristor TL72, increasing the optical output of thyristor TL72 without latching thyristor TL72 in the "on" state. When both thyristors TL74 and TL75 are turned "on", current is diverted away from thyristor TL72, causing thyristor TL72 to turn "off". If one of the two inputs turns "off", thyristor TL72 will turn "on" again. If both inputs turn "off" thyristor TL72 will turn "off" too.

Figure 40:
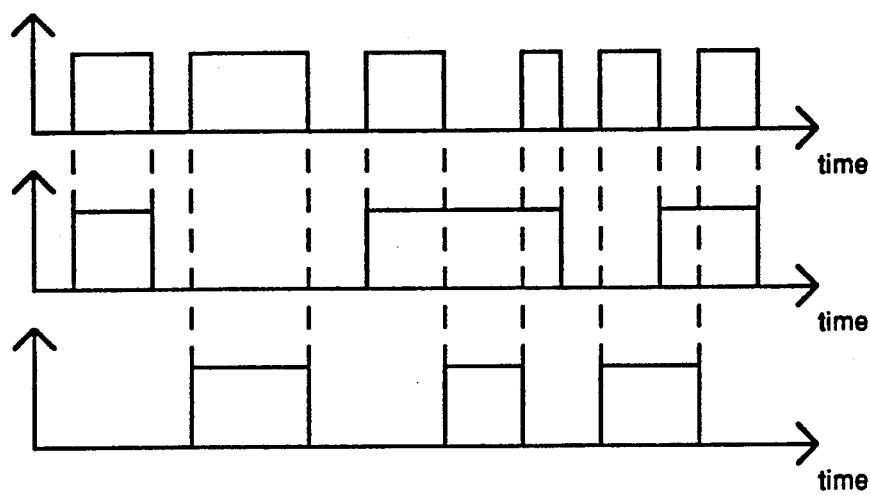
FIGS. 40A to 40C show the optical signal timing diagram of the Exclusive-OR gate depicted in FIG. 39.

FIGS. 40A to 40C show an optical signal timing diagram for the optical Exclusive-OR gate depicted in FIG. 39. If both optical input signals are "on", then the optical output signal is "off". If only one of the optical input signals is "on", then the optical output signal is "on". If both of the optical inputs are "off", then the output is also "off".

Figure 41:
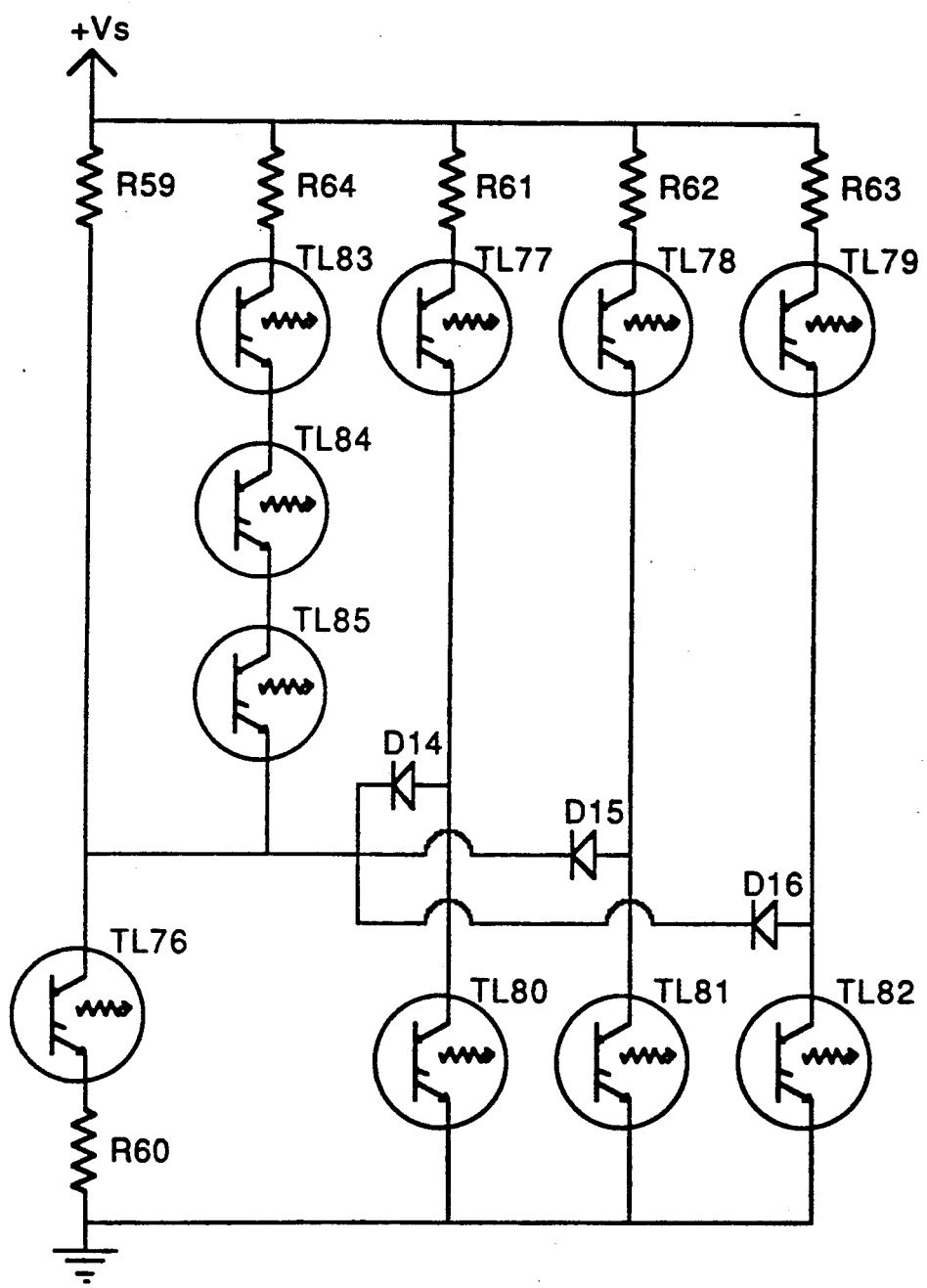
FIG. 41 shows the circuit diagram of an optical logic gate which performs the Boolian Exclusive-OR function twice between three separate inputs.

FIG. 41 shows the circuit diagram of a preferred embodiment of an optical logic gate which performs a Boolian Exclusive-OR function between three optical input signals. The electrical requirements of this circuit are: $Vs < V_{FBRO76}$; $Vs < V_{FBRO77} Vs < V_{FBRO78}$; $Vs < V_{FBRO70}$; $Vs < V_{FBRO80}$; $Vs < V_{FBRO81}$; $Vs < V_{FBRO82}$; $Vs < V_{FBRO83}$; $Vs < V_{FBRO84}$; $Vs < V_{FBRO85}$; $(Vs - V_{on76})/(R59 + R60) < I_{h76}$; $(Vs - (V_{h77} + V_{d14})(1 + R60/R59))(R59R60)/(R59R60 + R60R61 + R59R61) < I_{h77}$; $(Vs - V_{h77} - V_{on80})/R61 < I_{h77}$; $(Vs - (V_{h78} + V_{d15})(1 + R60/R59))(R59R60)/(R59R60 + R60R62 + R59R62) < I_{h78}$; $(Vs - V_{h78} - V_{on81})/R62 < I_{h78}$; $(Vs - (V_{h79} + V_{d16})(1 + R60/R59))(R59R60)/(R59R60 + R60R63 + R59R63) < I_{h79}$ $(Vs - V_{h79} - V_{on82})/R63 < I_{h79}$; $(Vs - V_{on77} - V_{h80})/R61 < I_{h80}$; $(Vs - V_{on78} - V_{h81})/R62 < I_{h81}$; $(Vs - V_{on79} - V_{h82})/R80 < I_{h82}$; $(Vs - (V_{h83} + V_{on84} + V_{on85})(1 + R60/R59))(R59R60)/(R59R60 + R60R64 + R59R64) < I_{h83}$; $(Vs - V_{on83} + V_{h84}$ $+V_{on85})(1+R60/R59))(R59R60)/(R59R60+R60R64+R59R64)<I_{h84}$ and $(Vs-(V_{on83}+V_{on84}+V_{h85})(1+R60/R59))(R59R60)/(R59R60+R60R64+R59R64)<I_{h85}$. The first optical input goes to thyristors TL76, TL77, TL81, TL82 and TL83. The second optical input signal goes to thyristors TL76, TL78, TL80, TL82 and TL84. The third optical input signal goes to thyristors TL76, TL79, TL80, TL81 and TL85. The optical output signal is produced by thyristor TL76. If only one of the three optical inputs is "on", then thyristor TL76 is switched "on" and sufficient current is provided through thyristor TL77, thyristor TL78 or thyristor TL79 to exceed the optical threshold current of thyristor TL76. If a second optical input turns "on", the current provided by thyristor TL76, thyristor TL77 or thyristor TL78 is diverted through thyristor TL80, thyristor TL81 or thyristor TL82 and the current through thyristor TL76 drops below the optical output threshold current. If all three optical inputs are "on", then the current through thyristors TL83, TL84 and TL85 supplies the necessary current to exceed the optical output threshold of thyristor TL76. The diodes D14, D15 and D16, prevent the current supplied by thyristors TL83, TL84 and TL85 from being diverted through thyristors TL80, TL81 and TL82. Thus, the optical threshold current of thyristor TL76 is exceeded only when one or all three of the optical input signals are "on". The resistor R59 can be removed leaving an open circuit if the holding currents of thyristors TL77, TL78 and TL79 are larger than the optical threshold current of thyristors TL76.

Figure 42:
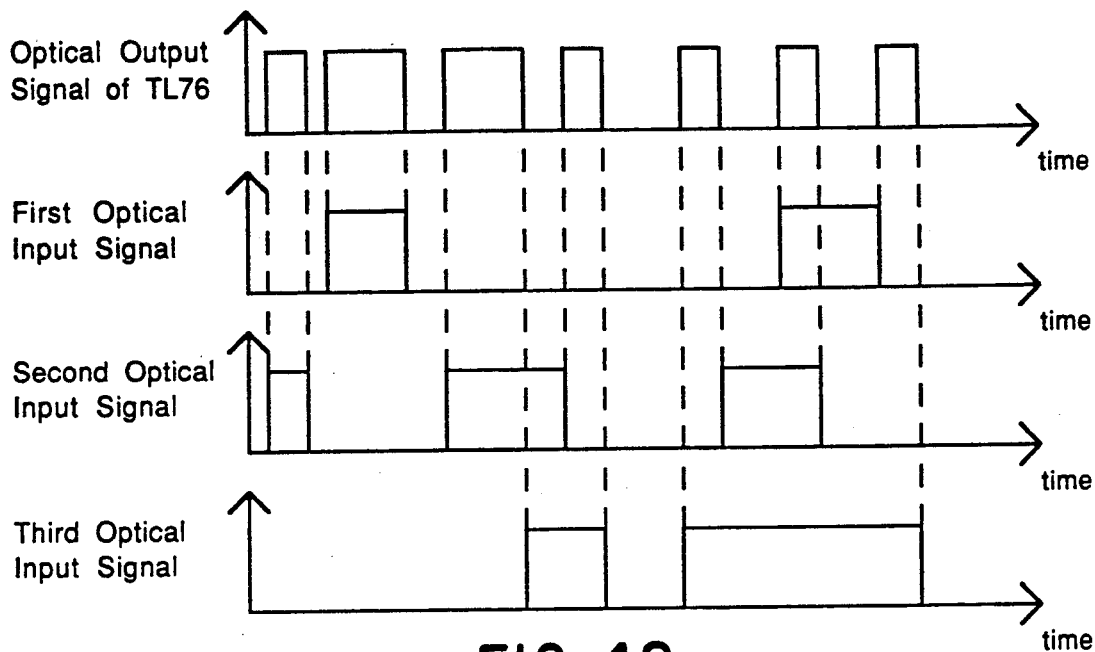
FIG. 42 shows the optical signal timing diagram of the three input Exclusive-OR gate depicted in FIG. 41.

FIG. 42 shows the optical signal timing diagram for the three input exclusive OR logic gate depicted in FIG. 41. If all three optical input signals are present there will be an optical output signal from thyristor TL76. If only two of the optical input signals are present, thyristor TL76 will produce no optical output signal. If only one of the optical input signals is present, thyristor TL76 will produce an optical output signal. If all of the optical inputs are "off", thyristor TL76 will not produce an optical output signal.

Figure 43:
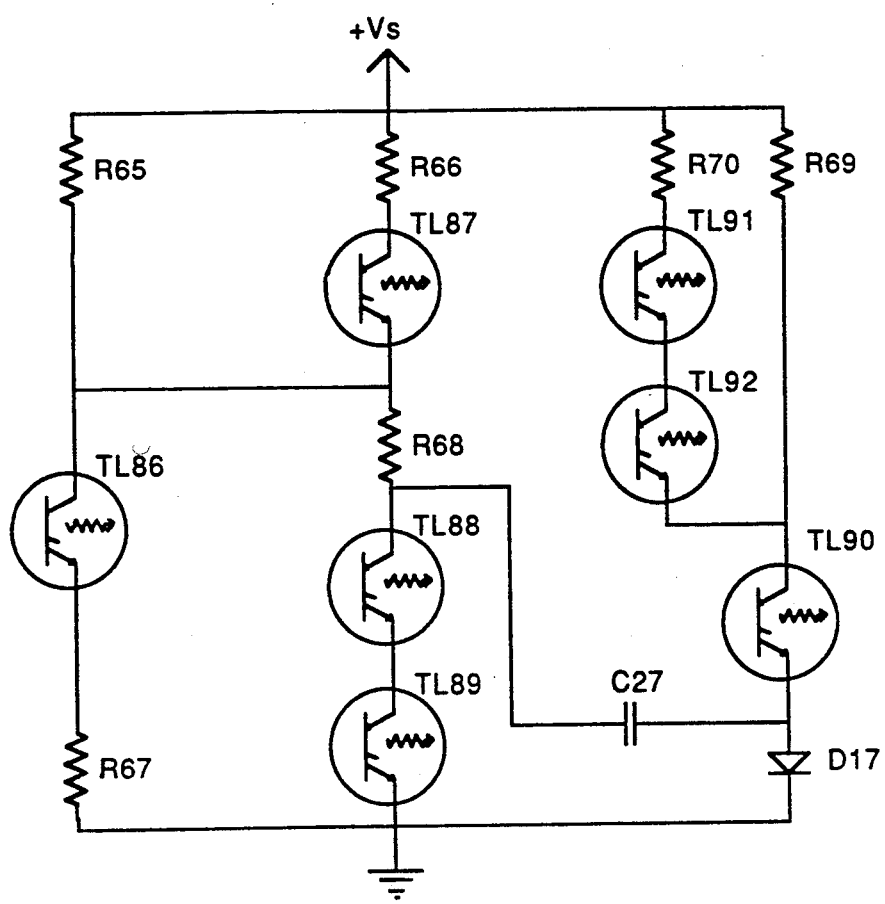
FIG. 43 shows the circuit diagram of an optical half adder.
Figure 44:
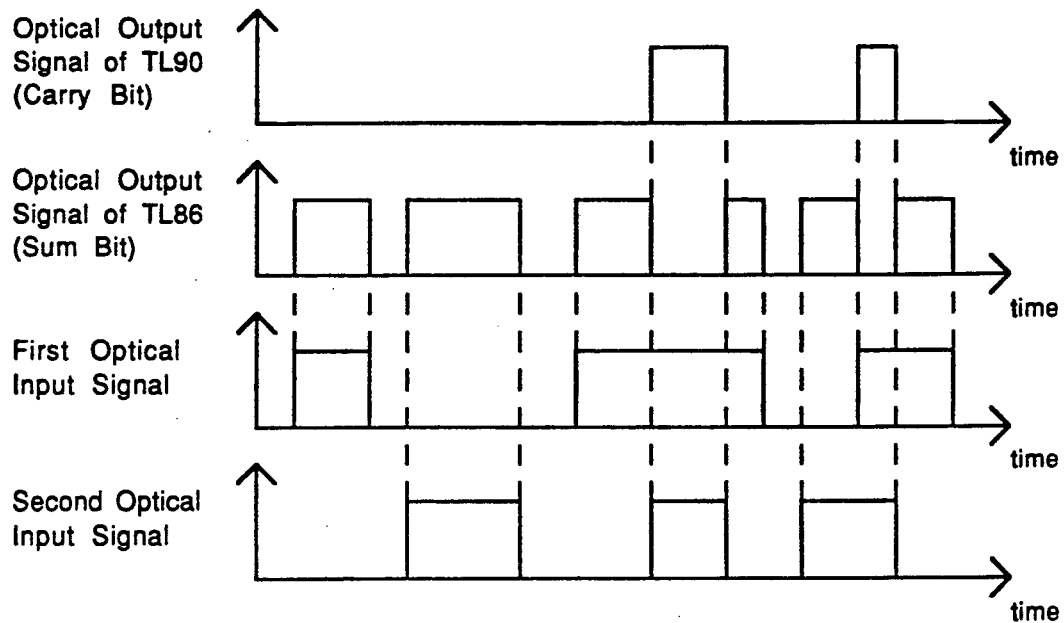
FIGS. 44A to 44D show the optical signal timing diagram of the optical half adder depicted in FIG. 43.
Figure 46:
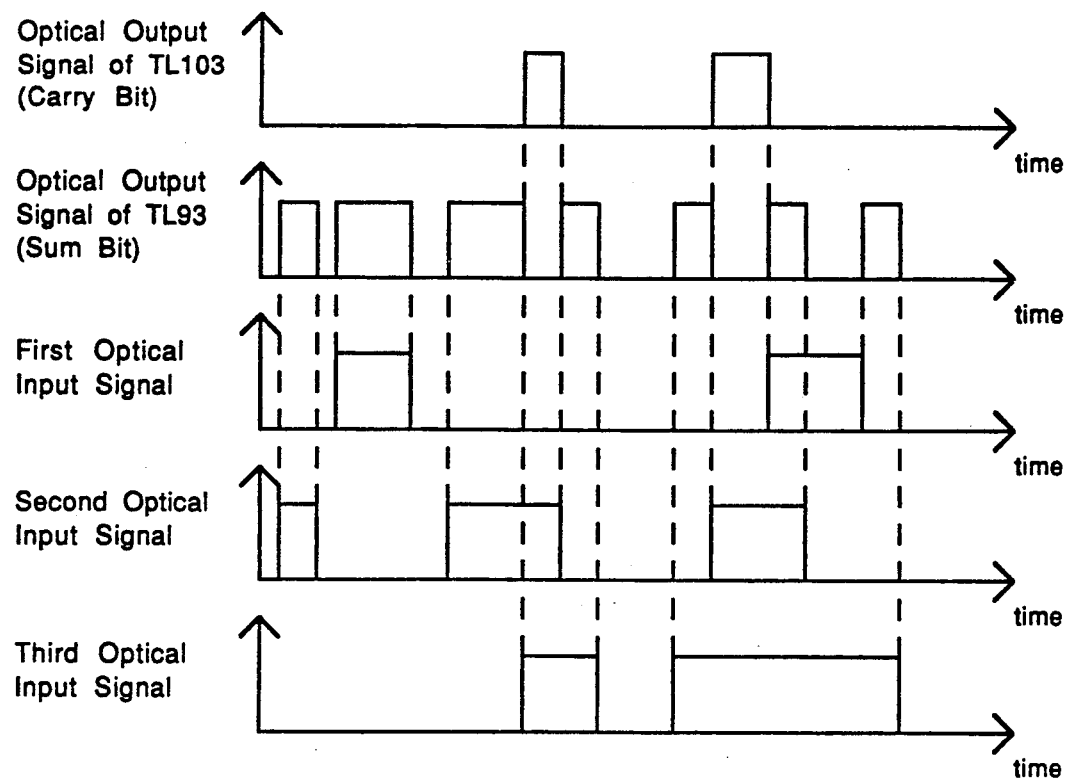
FIGS. 46A to 46E show the optical signal timing diagram of the optical full adder depicted in FIG. 45.

FIG. 43 shows the circuit diagram of a preferred embodiment of an optical half adder circuit. The electrical requirements of this circuit are: $Vs<V_{FBRO86}$; $Vs<V_{FBRO87}$; $Vs<V_{FBRO88}$; $Vs<V_{FBRO89}$; $Vs<V_{FBRO90}$; $Vs<V_{FBRO91}$; $Vs<V_{FBRO92}$; $(Vs-V_{h86})/(R65+R67)<I_{h86}$; $(Vs-V_{h87}(1+R66/R65))(R65R66)/(R65R66+R66R67+R65R67)<I_{h87}$; $V_{on87}/R65+(Vs-V_{on87}(1+R66/R65)-V_{h88}-V_{on89})(R65+R66)/(R65R66+R66R68+R65R68)<I_{h88}$; $V_{on87}/R65+(Vs-V_{on87}(1+R66/R65)-V_{on88}-V_{h89})(R65+R66)/(R65R66+R66R68+R65R68<I_{h89}$; $(Vs-V_{h90}-V_{d17})/R69<I_{h90}$; $(Vs-V_{on90}-V_{d17})/R69+(Vs-V_{on90}-V_{on91}-V_{on92}-V_{d17})/R70>I_{h90}$; $Vs-V_{on91}-V_{on92}-V_{d17}/R70<I_{h91}$ and $(Vs-V_{on90}-V_{on91}-V_{on92}-V_{d17})/R70<I_{h92}$. One optical input signal goes to thyristors TL86, TL87, TL88 and TL91. The other optical input signal goes to thyristors TL86, TL87, TL89 and TL92. The optical output signal for the sum bit is generated by thyristor TL86. The optical output signal for the carry bit is generated by thyristor TL90. The occurrence of either optical input signal turns thyristor TL86 "on". The series combination of thyristor TL87 and resistor R66 serves to increase the current through thyristor TL86 above the threshold current level of thyristor TL86, increasing the optical output of thyristor TL86 without latching thyristor TL86 in the "on" state. When both thyristors TL88 and TL89 are turned "on" current is diverted away from thyristor TL86, causing thyristor TL86 to turn "off". When thyristors TL88 and TL89 are both turned "on", a negative voltage pulse across diode D17 delivered by capacitor C27, turns thyristor TL90 "on". Thyristors TL91 and TL92 serve to provide thyristor TL90 with sufficient current to remain "on". If one of the two inputs turns "off", thyristor TL86 will turn "on" again and thyristor TL90 will turn "off". If both inputs turn "off" then thyristor TL86 will turn "off" too.

FIGS. 44A to 44D show the optical signal timing diagram for the optical half adder circuit depicted in FIG. 43. If both of the optical inputs signals are present, there is no optical output signal for the sum bit, but there is an optical output signal for the carry bit. If only one optical input is present, an optical output signal is produced for the sum bit, but no optical output signal is produced for the carry bit. If no optical inputs are present, no optical output signal is produced for either the sum bit or the carry bit.

Figure 45:
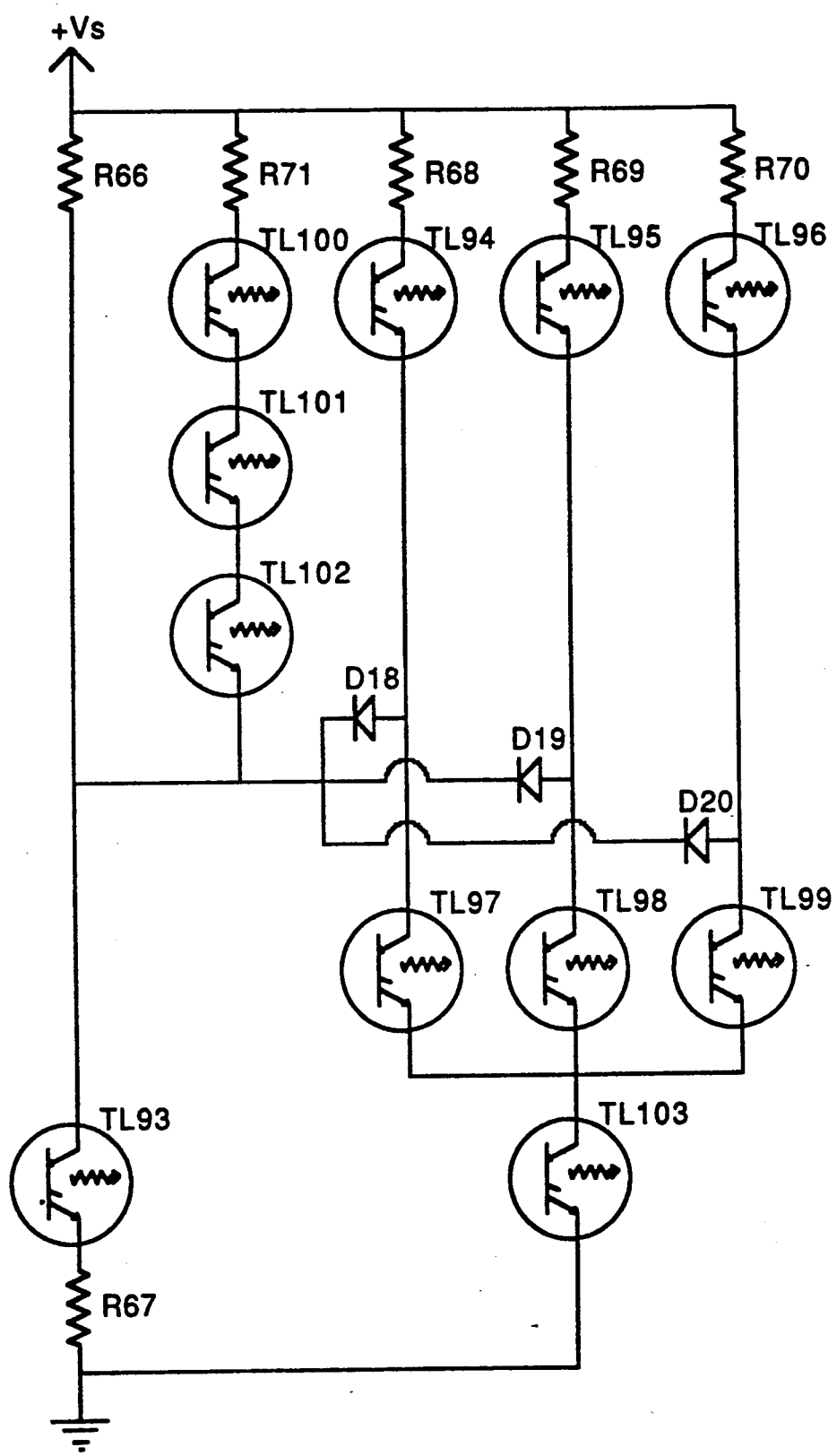
FIG. 45 shows the circuit diagram of a circuit for an optical full adder.

FIG. 45 shows the circuit diagram of an optical full adder circuit. The electrical requirements of this circuit are: $Vs<V_{FBRO93}$; $Vs<V_{FBRO94}$; $Vs<V_{FBRO95}$; $Vs<V_{FBRO96}$; $Vs<V_{FBRO97}$; $Vs<V_{FBRO98}$; $Vs<V_{FBRO99}$; $Vs<V_{FBRO100}$; $Vs<V_{FBRO101}$; $Vs<V_{FBRO102}$; $Vs<V_{FBRO103}$; $(Vs-V_{on93})/(R66+R67)<I_{h93}$; $(Vs-(V_{h94}+V_{d18})(1+R67/R66))(R66R67)/(R66R67+R67R68+R66R68)<I_{h94}$; $(Vs-V_{h94}-V_{on97}-V_{on103})/R68<I_{h94}$; $(Vs-(V_{h95}+V_{d19})(1+R67/R66))(R66R67)/(R66R67+R67R69+R66R69)>I_{h95}$; $(Vs-V_{h95}-V_{on98}-V_{on103})/R69<I_{h95}$; $(Vs-V_{h96}+V_{d20})(1+R67/R66))(R66R67)/R66R67+R67R70+R66R70)<I_{h96}$; $(Vs-V_{h96}-V_{on99}-V_{on103})/R70<I_{h96}$; $(Vs-V_{on94}-V_{h97}-V_{on103})/R68<I_{h97}$; $(Vs-V_{on95}-V_{on98}-V_{on103})/R69<I_{h98}$; $(Vs-V_{on96}-V_{on99}-V_{on103})/R70<I_{h99}$; $(Vs-(V_{h100}+V_{on101}+V_{on102})(1+R67/R66))(R66R67)/(R66R67+R67R71+R6 6R71)<I_{h100}$; $(Vs-(V_{on100}+V_{h101}+V_{on102})(1+R67/R66))(R66R67)/(R66R67+R67R71+R6 6R71)<I_{h101}$ and $(Vs-(V_{on100}+V_{on101}+V_{h102})(1+R67/R66))(R66R67)/(R66R67+R67R71+R6 6R71)>I_{h102}$. The first optical input goes to thyristors TL93, TL94, TL98, TL99, TL100 and TL103. The second optical input signal goes to thyristors TL93, TL95, TL97, TL99, TL101 and TL103. The third optical input signal goes to thyristors TL93, TL96, TL97, TL98, TL102 and TL103. The optical output signal for the sum is produced by thyristor TL93 and the optical output signal for the carry bit is produced by thyristor TL103. If only one of the three optical inputs is "on", thyristor TL93 is switched "on" and sufficient current is provided through thyristor TL94, thyristor TL95 or thyristor TL96 to exceed the optical threshold current of thyristor TL93. If a second input turns "on", then the current provided by thyristor TL94, thyristor TL95 or thyristor TL96 is diverted through thyristor TL97, thyristor TL98 or thyristor TL99, and the current through thyristor TL93 drops below the optical output threshold current. If all three optical inputs are "on", then the current through thyristors TL100, TL101 and TL102 supplies the necessary current to exceed the optical output threshold current of thyristor TL93. Diodes D18, D19 and D20 prevent the current supplied by thyristors TL100, TL101 and TL102 from being diverted through thyristors TL97, TL98 and TL99. Resistor R66 is not necessary if the holding currents of thyristors TL94, TL95 and TL96 are larger than the optical threshold current of thyristor TL93. Thus, the optical threshold current of thyristor TL93 is exceeded either when only one or when all three of the optical input signals are present. Light is produced by thyristor TL103 any time more than one optical input is present.

FIGS. 46A to 46E show an optical signal timing diagram for the optical full adder circuit depicted in FIG. 45. If all three of the optical input signals are present, optical output signals for both the sum and carry bits are produced. If two of the optical input signals are present, no optical output signal is produced for the sum bit, but an optical output signal is produced for the carry bit. If only one of the optical input signals is present, an optical output signal for the sum bit is produced, but no optical output signal is produced for the carry bit. If all of the optical inputs are "off", no optical output signals are produced for either the sum or the carry bit.

The above description shall not be construed as to limiting the ways in which this invention may be practiced, but shall be inclusive of many other variations that do not depart from the broad interest and intent of the invention.

What is claimed is:

1. A semiconductor apparatus which propagates light in a preferred direction, the apparatus comprising, in succession, a substrate, a first emitter region, a first carrier confinement region, a first internal heterojunction barrier, a first base region, a second base region, a second internal heterojunction barrier, a second carrier confinement region, and a second emitter region, wherein portions of the first emitter region and the second base region are of one conductivity type and portions of the second emitter region and the first base region are of the opposite conductivity type, wherein the first and second emitter regions, the first and second carrier confinement regions, the first and second internal heterojunction barriers and the first and second base regions together define a single optical cavity in the directions perpendicular to the preferred direction of light propagation, and means for causing electrical current to flow through the semiconductor apparatus.

2. A semiconductor apparatus as recited in claim 1 wherein one or more of the regions are either evanescent or non-evanescent depending on the value of the component of Ey(x), where Ey(x) is the electric field of the light with the lowest optical energy able to propagate through the optical cavity as a function of x and taken in a y direction (of an x-y-z coordinate system, taking positive z as the preferred direction of light propagation), with the non-evanescent regions, being defined as those regions where $$Ey(x) = F \sin[K_p x] + G \cos[K_p(x) x],$$

where $K_p(x)$ is a positive real constant called the fundamental mode lateral constant and F and G are real constants, and wherein the evanescent regions are defined as those regions where $$Ey(x) = C \exp[K_d x] + D \exp[-K_d(x) x],$$

wherein $K_d(x)$ is a positive real constant called the fundamental mode lateral decay constant and C and D are real constants, and further wherein the single optical cavity is defined by the first and second emitter regions and the regions between the first and second emitter regions so that the absolute value of the integral of the fundamental mode lateral decay constant across any evanescent region, or collection of abutting evanescent regions, separating two non-evanescent regions is less than 2[ln(200)], where the path of the integral is taken perpendicular to the preferred direction of light propagation and is the shortest path joining the two non-evanescent regions.

3. A semiconductor apparatus as recited in claim 1 wherein two mirrors are formed parallel to each other and with the resultant semiconductor apparatus being situated between these two mirrors.

4. A semiconductor apparatus as recited in claim 3, further comprising means for coupling light into and out of the optical cavity.

5. A semiconductor apparatus as recited in claim 1 wherein the preferred direction of light propagation is such that the light propagates along the first and second carrier confinement regions.

6. A semiconductor apparatus as recited in claim 1 wherein the preferred direction of light propagation is such that the light propagates in succession from one of the first and second carrier confinement regions, through the first and second base regions, and into the other of the first and second carrier confinement regions.

7. A semiconductor apparatus as recited in claim 1 wherein the first emitter region of one conductivity type includes a subemitter region of the one conductivity type.

8. A semiconductor apparatus as recited in claim 1 wherein the first emitter region of one conductivity type includes as optical confinement tailoring region of the one conductivity type.

9. A semiconductor apparatus as recited in claim 1 wherein the first emitter region of the one conductivity type includes a bandgap grading region of the one conductivity type.

10. A semiconductor apparatus as recited in claim 9 wherein the bandgap grading region of the one conductivity type is formed by compositional grading.

11. A semiconductor apparatus as recited in claim 9 wherein the bandgap grading region of the one conductivity type is formed by superlattice grading.

12. A semiconductor apparatus as recited in claim 1 wherein the second emitter region of opposite conductivity type includes a cap region of the opposite conductivity type.

13. A semiconductor apparatus as recited in claim 1 wherein the second emitter region of opposite conductivity type includes an optical confinement tailoring region of the opposite conductivity type.

14. A semiconductor apparatus as recited in claim 1 wherein the second emitter region of the opposite conductivity type includes a bandgap grading region of the opposite conductivity type.

15. A semiconductor apparatus as recited in claim 14 wherein the bandgap grading region of the opposite conductivity type is formed by compositional grading.

16. A semiconductor apparatus as recited in claim 14 wherein the bandgap grading region of the opposite conductivity type is formed by superlattice grading.

17. An semiconductor apparatus as recited in claim 1 wherein the first emitter region of the one conductivity type includes a dielectric quarter-wave mirror.

18. An semiconductor apparatus as recited in claim 1 wherein the second emitter region of the opposite conductivity type includes a dielectric quarter-wave mirror.

19. A semiconductor apparatus as recited in claim 1 wherein the first base region of the opposite conductivity type includes a bandgap grading region of the opposite conductivity type.

20. A semiconductor apparatus as recited in claim 19 wherein the bandgap grading region of the opposite conductivity type is formed by compositional grading.

21. A semiconductor apparatus as recited in claim 19 wherein the bandgap grading region of the opposite conductivity type is formed by superlattice grading.

22. A semiconductor apparatus as recited in claim 1 wherein the second base region of the one conductivity type includes a bandgap grading region of the one conductivity type.

23. A semiconductor apparatus as recited in claim 22 wherein the bandgap grading region of the one conductivity type is formed by compositional grading.

24. A semiconductor apparatus as recited in claim 22 wherein the bandgap grading region of the one conductivity type is formed by superlattice grading.

25. A semiconductor apparatus as recited in claim 1 wherein the means for causing electrical current to flow through the semiconductor apparatus includes the substrate.

26. A semiconductor apparatus as recited in claim 1 wherein the first and second carrier confinement regions each have a thickness between 1 nm and 250 nm.

27. A semiconductor apparatus a recited in claim 1 wherein the first and second internal heterojunction barrier regions each have a thickness less than 100 nm.

28. A semiconductor apparatus as recited in claim 1 wherein the first and second base regions each have a thickness between 30 nm and 300 nm.

29. A semiconductor apparatus as recited in claim 1 wherein the means for causing electrical current to flow through the semiconductor substrate comprises an electrode in ohmic contact with the second emitter region and an electrode in ohmic contact with the substrate.

30. A semiconductor apparatus as recited in claim 1 wherein the means for causing electrical current to flow through the semiconductor substrate comprises an electrode in ohmic contact with the second emitter region and an electrode in ohmic contact with the first emitter region.

31. A semiconductor apparatus as recited in claim 7 wherein the means for causing electrical current to flow through the semiconductor substrate comprises an electrode in ohmic contact with the second emitter region and an electrode in ohmic contact with the subemitter region.

32. A semiconductor apparatus as recited in claim 1 wherein the substrate is n-type gallium arsenide.

33. A semiconductor apparatus as recited in claim 1 wherein the substrate is p-type gallium arsenide.

34. A semiconductor apparatus as recited in claim 1 wherein the substrate is semi-insulating gallium arsenide.

35. A semiconductor apparatus as recited in claim 1 wherein the substrate is chromium doped, semi-insulating gallium arsenide.

36. A semiconductor apparatus as recited in claim 1 wherein the substrate is semi-insulating gallium arsenide doped with EL2 defects.

37. A semiconductor apparatus as recited in claim 1 wherein the first and second carrier confinement regions are made of gallium arsenide.

38. A semiconductor apparatus as recited in claim 1 wherein the first and second carrier confinement regions are made of aluminum gallium arsenide.

39. A semiconductor apparatus as recited in claim 1 wherein the first and second carrier confinement regions are made of indium gallium arsenide.

40. A semiconductor apparatus as recited in claim 1 wherein the bandgap of the semiconductor in one of the first and second carrier confinement regions is larger than the bandgap of the semiconductor in the other of the first and second carrier confinement regions.

41. A semiconductor apparatus as recited in claim 1 wherein the substrate is indium phosphide.

42. A semiconductor apparatus as recited in claim 1 wherein a capacitor is electrically connected between the first base region and the first emitter region.

43. A semiconductor apparatus as recited in claim 1 wherein a capacitor is electrically connected between the first base region and the substrate.

44. A semiconductor apparatus as recited in claim 1 wherein a capacitor is electrically connected between the second base region and the second emitter region.

45. A semiconductor apparatus as recited in claim 4 wherein the means for coupling light into and out of the optical cavity comprise waveguides.

46. A semiconductor apparatus as recited in claim 3 wherein the two mirror facets are formed by etching.

47. A semiconductor apparatus as recited in claim 3 wherein the two mirror facets are formed by cleaving.

48. A semiconductor apparatus as recited in claim 3 wherein the two mirror facets are formed by quarter-wave reflectors.

49. A semiconductor apparatus as recited in claim 45 wherein the waveguides comprise optical output waveguides which are deposited in perpendicular alignment with the mirrors.

50. A semiconductor apparatus as recited in claim 45 wherein the waveguides comprise optical input waveguides which are deposited away from the mirrors.

51. A semiconductor apparatus as recited in claim 45 wherein the waveguides comprise optical input waveguides which are not aligned parallel with the optical cavity.

52. A semiconductor apparatus as recited in claim 45 wherein the waveguides comprise optical input waveguides which are coupled to the semiconductor apparatus, such that the optical input waveguides are not formed in perpendicular alignment to the mirrors.

* * * * *